US012807800B2

(12) United States Patent
Itoh et al.

(10) Patent No.: US 12,807,800 B2
(45) Date of Patent: Nov. 24, 2026

(54) RESIN COMPOSITION, CURED PRODUCT, PREPREG, METAL FOIL-CLAD LAMINATE, RESIN COMPOSITE SHEET, PRINTED WIRING BOARD, AND SEMICONDUCTOR DEVICE

(71) Applicant: MITSUBISHI GAS CHEMICAL COMPANY, INC., Tokyo (JP)

(72) Inventors: Syouichi Itoh, Mie (JP); Hiroaki Tadokoro, Tokyo (JP); Susumu Innan, Tokyo (JP); Makoto Miyamoto, Tokyo (JP); Keisuke Futamura, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 168 days.

(21) Appl. No.: 18/846,102

(22) PCT Filed: Mar. 13, 2023

(86) PCT No.: PCT/JP2023/009586

§ 371 (c)(1),
(2) Date: Sep. 11, 2024

(87) PCT Pub. No.: WO2023/176764

PCT Pub. Date: Sep. 21, 2023

(65) Prior Publication Data

US 2025/0188256 A1 Jun. 12, 2025

(30) Foreign Application Priority Data

Mar. 14, 2022 (JP) ................................ 2022-039677

(51) Int. Cl.
*C08L 25/16* (2006.01)
*C08J 5/24* (2006.01)
*C08L 71/12* (2006.01)
*H05K 1/03* (2006.01)

(52) U.S. Cl.
CPC ................ *C08L 25/16* (2013.01); *C08J 5/24* (2013.01); *C08L 71/126* (2013.01); *H05K 1/0373* (2013.01); *C08J 2325/16* (2013.01); *C08J 2371/12* (2013.01); *C08J 2425/16* (2013.01); *C08J 2471/12* (2013.01); *C08L 2205/025* (2013.01); *C08L 2205/03* (2013.01)

(58) Field of Classification Search
CPC .......... C08L 25/16; C08J 5/24; H05K 1/0373
See application file for complete search history.

(56) References Cited

U.S. PATENT DOCUMENTS 4,499,248 A 2/1985 Jalics
5,049,615 A * 9/1991 Chu ....................... C08L 53/02 525/146
7,595,362 B2 9/2009 Kawabe et al.
2004/0146692 A1* 7/2004 Inoue ..................... B32B 15/14 428/141
2006/0177666 A1 8/2006 Kawabe
2006/0270815 A1 11/2006 Ittel et al.
2007/0129502 A1 6/2007 Kawabe et al.
2021/0214547 A1 7/2021 Honda et al.

FOREIGN PATENT DOCUMENTS

CN 1914239 B 5/2010
JP S59-145207 A 8/1984
JP S59-207905 A 11/1984
JP H06-87962 A 3/1994
JP 2006-89683 A 4/2006
JP 2016-190899 A 11/2016
JP 2018-39995 A 3/2018
(Continued)

OTHER PUBLICATIONS

Machine translation of JP 2021-143333 A, published on Sep. 24, 2021.*

(Continued)

*Primary Examiner* — Vickey Nerangis

(74) *Attorney, Agent, or Firm* — GREENBLUM & BERNSTEIN, P.L.C.

(57) ABSTRACT

Provided are a resin composition, a cured product, a prepreg, a metal foil-clad laminate, a resin composite sheet, a printed wiring board, and a semiconductor device. The resin composition contains 10 to 300 parts by mass of a polyphenylene ether compound (B) having an unsaturated carbon-carbon double bond at a terminal, and 10 to 300 parts by mass of a polymer having a structural unit represented by Formula (V), relative to 100 parts by mass of a resin (A) having a terminal group represented by Formula (T1) and having an indane skeleton.

(T1)

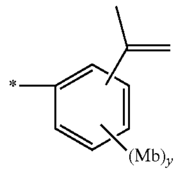

(V)

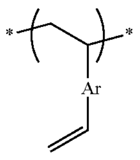

20 Claims, 1 Drawing Sheet

(56) References Cited

FOREIGN PATENT DOCUMENTS

| | | | |
|---|---|---|---|
| JP | 2020-105352 | A | 7/2020 |
| JP | 2021-143333 | A | 9/2021 |

OTHER PUBLICATIONS

International Preliminary Report on Patentability, dated Sep. 10, 2024, International Search Report and Written Opinion, dated May 16, 2023 in international application No. PCT/JP2023/009586 with English language translations thereof.

Extended European Search Report, dated Mar. 2, 2026 issued in European family member Patent Application No. 23770719.5.

Office Action, dated Apr. 10, 2026, issued in Taiwanese family member Patent Application No. 112109104.

* cited by examiner

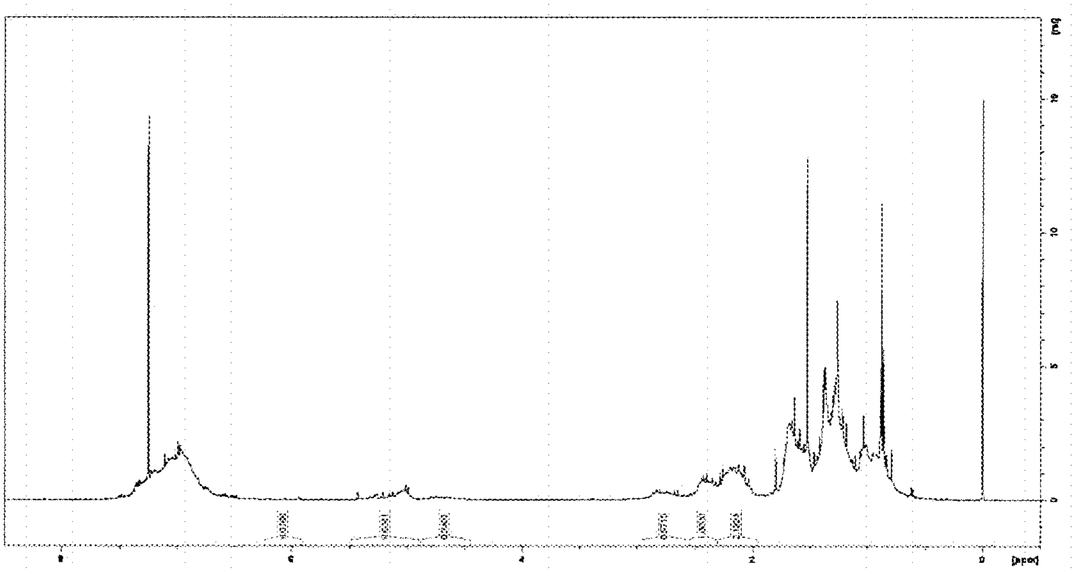

RESIN COMPOSITION, CURED PRODUCT, PREPREG, METAL FOIL-CLAD LAMINATE, RESIN COMPOSITE SHEET, PRINTED WIRING BOARD, AND SEMICONDUCTOR DEVICE

TECHNICAL FIELD

The present invention relates to a resin composition, a cured product, a prepreg, a metal foil-clad laminate, a resin composite sheet, a printed wiring board, and a semiconductor device.

BACKGROUND ART

In recent years, a trend for higher integration and finer configuration have been accelerated for semiconductor devices that are used in electronic devices and communication devices, including mobile terminals. Along with this trend, a technology that enables high-density mounting of semiconductor devices is required, and an improvement is also required for printed wiring boards, which hold an important role in the technology.

Meanwhile, applications of electronic devices are diversified and continuously expanding. Accordingly, properties required for printed wiring boards, and metal foil-clad laminates, prepregs, and the like used in the printed wiring boards have also been diversified, and the requirements have become more demanding. To obtain improved printed wiring boards in consideration of such requirements, various materials and processing methods have been proposed. One of these includes development to improve a resin material constituting a prepreg or a resin composite sheet.

Patent Document 1 discloses a resin having an isopropenylphenyl group at a terminal and an indane skeleton as a material suitable for a semiconductor sealing material and a printed wiring board.

CITATION LIST

Patent Documents

Patent Document 1: JP 2021-143333 A

SUMMARY OF INVENTION

Technical Problem

However, when the resin having an indane skeleton described in Patent Document 1 is used as is, the resin is not sufficiently cured. Thus, a novel resin composition blended with an additional compound, particularly another thermosetting compound, is required. In particular, a resin composition having excellent moldability and a low dielectric loss tangent (Df) is required.

The present invention is intended to solve such a problem, and an object of the present invention is to provide a resin composition having excellent moldability and a low dielectric loss tangent (Df), a cured product, a prepreg, a metal foil-clad laminate, a resin composite sheet, a printed wiring board, and a semiconductor device.

Solution to Problem

In order to solve the above problems, the present inventors have conducted studies. As a result, the above problems have been solved by blending a polyphenylene ether compound having an unsaturated carbon-carbon double bond at a terminal and a specific aromatic vinyl polymer into a resin having an isopropenyl group at a terminal and having an indane skeleton.

Specifically, the problems described above are solved by the following means.

<1> A resin composition containing 10 to 300 parts by mass of a polyphenylene ether compound (B) having an unsaturated carbon-carbon double bond at a terminal, and 10 to 300 parts by mass of a polymer having a structural unit represented by Formula (V), relative to 100 parts by mass of a resin (A) having a terminal group represented by Formula (T1) and having an indane skeleton:

(T1)

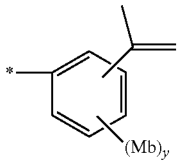

(in Formula (T1), Mb each independently represents a hydrocarbon group having from 1 to 12 carbons which may be substituted with a halogen atom; y represents an integer of 0 to 4; and * represents a bonding position with another moiety)

(V)

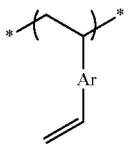

(in Formula (V), Ar represents an aromatic hydrocarbon linking group; and * represents a bonding position).

<2> The resin composition according to <1>, wherein the resin (A) contains a resin represented by Formula (T1-1):

(T1-1)

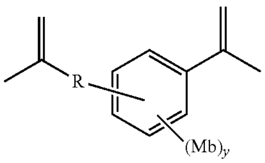

(in Formula (T1-1), R is a group containing structural units represented by Formula (Tx); Mb each independently represents a hydrocarbon group having from 1 to 12 carbons which may be substituted with a halogen atom; and y is an integer of 0 to 4)

(Tx)

(a)

(b)

(c)

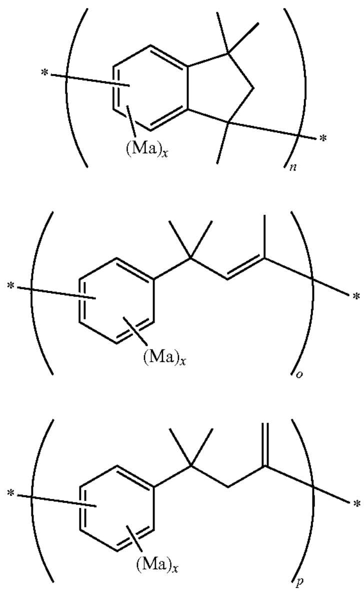

(in Formula (Tx), n, o, and p each represent an average number of repeating units; n represents a number of more than 0 and 20 or less; o and p each independently represent a number of 0 to 20; $1.0 \leq n+o+p \leq 20.0$; Ma each independently represents a hydrocarbon group having from 1 to 12 carbons which may be substituted with a halogen atom; x represents an integer of 0 to 4; structural units (a), (b), and (c) are each bonded to the structural unit (a), (b), or (c), or an additional group by *; and the structural units may be randomly bonded).

<3> The resin composition according to <1> or <2>, wherein the polyphenylene ether compound (B) having an unsaturated carbon-carbon double bond at a terminal contains a polyphenylene ether compound represented by Formula (OP);

(OP)

$$X{-}\left[O{-}(Y{-}O)_{n1}{-}Rx\right]_{n2}$$

(in Formula (OP), X represents an aromatic group; —(Y—O)$_{n1}$— represents a polyphenylene ether structure; n1 represents an integer of 1 to 100; and n2 represents an integer of 1 to 4; and Rx is a group represented by Formula (Rx-1) or Formula (Rx-2))

(Rx-1)

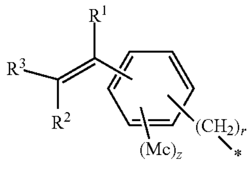

-continued (Rx-2)

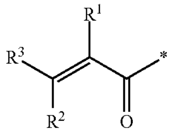

(in Formula (Rx-1) and Formula (Rx-2), $R^1$, $R^2$, and $R^3$ each independently represent a hydrogen atom, an alkyl group, an alkenyl group, or an alkynyl group; * is a bonding site to an oxygen atom; Mc each independently represents a hydrocarbon group having from 1 to 12 carbons; z represents an integer of 0 to 4; and r represents an integer of 1 to 6).

<4> The resin composition according to any one of <1> to <3>, wherein the polyphenylene ether compound (B) having an unsaturated carbon-carbon double bond at a terminal contains a polyphenylene ether compound represented by Formula (OP-1):

(OP-1)

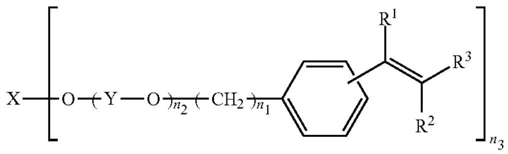

(in Formula (OP-1), X represents an aromatic group; —(Y—O)$n_2$- represents a polyphenylene ether structure; $R^1$, $R^2$, and $R^3$ each independently represent a hydrogen atom, an alkyl group, an alkenyl group, or an alkynyl group; $n_1$ represents an integer of from 1 to 6; $n_2$ represents an integer of from 1 to 100; and $n_3$ represents an integer of from 1 to 4).

<5> The resin composition according to any one of <1> to <4>, wherein the polyphenylene ether compound (B) having an unsaturated carbon-carbon double bond at a terminal has a number average molecular weight (Mn) of 500 to 3000 and a weight average molecular weight (Mw) of 800 to 6000.

<6> The resin composition according to any one of <1> to <5>, wherein the resin (A) has a number average molecular weight (Mn) of 400 to 3000.

<7> The resin composition according to any one of <1> to <6>, wherein a mass proportion of the resin (A) is 10 to 50 parts by mass relative to 100 parts by mass of a total of the resin (A) and the polyphenylene ether compound (B) having an unsaturated carbon-carbon double bond at a terminal.

<8> The resin composition according to any one of <1> to <7>, which contains substantially no polymerization inhibitor.

<9> The resin composition according to any one of <1> to <8>, which further contains an additional compound (C) other than the resin (A), the polyphenylene ether compound (B) having an unsaturated carbon-carbon double bond at a terminal, and the polymer having a structural unit represented by Formula (V).

<10> The resin composition according to <9>, wherein the additional compound (C) contains one or more selected from the group consisting of a maleimide compound, a cyanate ester compound, an epoxy compound, a phenol compound, a compound containing a (meth)allyl group (for example, an alkenyl nadiimide compound), an oxetane resin, a benzoxazine compound, an arylcyclobutene resin, a polyamide resin, a polyimide resin, a perfluorovinyl ether resin, a compound having a styrene group other than the polyphenylene ether compound (B) having an unsaturated carbon-carbon double bond at a terminal, a compound having an isopropenyl group other than the resin (A) having an indane skeleton, a polyfunctional (meth)acrylate compound other than the polyphenylene ether compound (B) having an unsaturated carbon-carbon double bond at a terminal, an elastomer, and a petroleum resin.

<11> The resin composition according to any one of <1> to <10>, wherein a total content of the resin (A) and the polyphenylene ether compound (B) having an unsaturated carbon-carbon double bond at a terminal is 40 parts by mass or more relative to 100 parts by mass of a resin solid content in the resin composition.

<12> The resin composition according to any one of <1> to <11>, which further contains a filler (D).

<13> The resin composition according to <12>, wherein a content of the filler (D) is from 10 to 1000 parts by mass relative to 100 parts by mass of a resin solid content in the resin composition.

<14> The resin composition according to any one of <1> to <13>, wherein the resin (A) contains a resin represented by Formula (T1-1); the polyphenylene ether compound (B) having an unsaturated carbon-carbon double bond at a terminal contains a polyphenylene ether compound represented by Formula (OP-1); the polyphenylene ether compound (B) having an unsaturated carbon-carbon double bond at a terminal has a number average molecular weight (Mn) of 500 to 3000 and a weight average molecular weight (Mw) of 800 to 6000; the resin (A) has a number average molecular weight (Mn) of 400 to 3000; the mass proportion of the resin (A) is 10 to 50 parts by mass relative to 100 parts by mass of the total of the resin (A) and the polyphenylene ether compound (B) having an unsaturated carbon-carbon double bond at a terminal; a polymerization inhibitor is substantially not contained; and the total content of the resin (A) and the polyphenylene ether compound (B) having an unsaturated carbon-carbon double bond at a terminal is 40 parts by mass or more relative to 100 parts by mass of the resin solid content in the resin composition:

(T1-1)

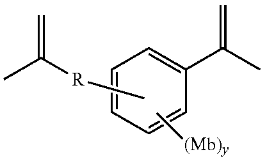

(in Formula (T1-1), R is a group containing structural units represented by Formula (Tx); Mb each independently represents a hydrocarbon group having from 1 to 12 carbons which may be substituted with a halogen atom; and y is an integer of 0 to 4)

(Tx)

(a)

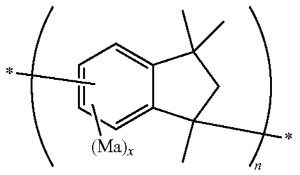

(b)

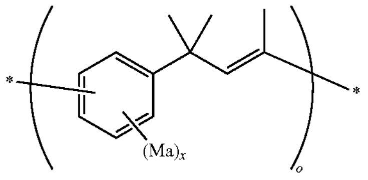

(c)

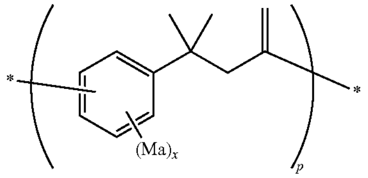

(in Formula (Tx), n, o, and p each represent an average number of repeating units; n represents a number of more than 0 and 20 or less; o and p each independently represent a number of 0 to 20; $1.0 \leq n+o+p \leq 20.0$; Ma each independently represents a hydrocarbon group having from 1 to 12 carbons which may be substituted with a halogen atom; x represents an integer of 0 to 4: structural units (a), (b), and (c) are each bonded to the structural unit (a), (b), or (c), or an additional group by *; and the structural units may be randomly bonded)

(OP-1)

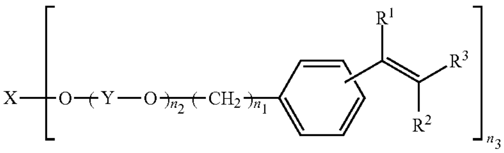

(in Formula (OP-1), X represents an aromatic group; —(Y—O)$n_2$- represents a polyphenylene ether structure; $R^1$, $R^2$, and $R^3$ each independently represent a hydrogen atom, an alkyl group, an alkenyl group, or an alkynyl group; $n_1$ represents an integer of from 1 to 6; $n_2$ represents an integer of from 1 to 100; and $n_3$ represents an integer of from 1 to 4).

<15> A cured product of the resin composition described in any one of <1> to <14>.

<16> A prepreg formed from a substrate and the resin composition described in any one of <1> to <14>.

<17> A metal foil-clad laminate including at least one layer formed from the prepreg described in <16>; and a metal foil disposed on one surface or both surfaces of the layer formed from the prepreg.

<18> A resin composite sheet including a support and a layer disposed on a surface of the support, the layer being formed from the resin composition described in any one of <1> to <14>.

<19> A printed wiring board including an insulating layer and a conductor layer disposed on a surface of the insulating layer, wherein the insulating layer includes a layer formed from the resin composition described in any one of <1> to <14>.

<20> A semiconductor device including the printed wiring board described in <19>.

Advantageous Effects of Invention

According to the present invention, there can be provided a resin composition having excellent moldability and a low dielectric loss tangent (Df), a cured product, a prepreg, a metal foil-clad laminate, a resin composite sheet, a printed wiring board, and a semiconductor device.

BRIEF DESCRIPTION OF DRAWINGS

FIG. 1 illustrates an NMR chart in Synthesis Example 1.

DESCRIPTION OF EMBODIMENTS

Embodiments for carrying out the present invention (hereinafter referred to simply as "the present embodiment") will next be described in detail. The present embodiment described below is an example for describing the present invention, and the present invention is not limited only to the present embodiment.

In the present specification, numerical values described before and after the term "to" are respectively the lower limit and the upper limit of a range including the numerical values.

In the present specification, various physical property values and characteristic values are those at 23 °C unless otherwise noted.

In a description of a group (atomic group) in the present specification, a description not specifying whether the group is a substituted group or an unsubstituted group is meant to include a group (atomic group) having a substituent as well as a group (atomic group) having no substituent. For example, an "alkyl group" includes not only an alkyl group having no substituent (unsubstituted alkyl group) but also an alkyl group having a substituent (substituted alkyl group). In the present specification, a description not specifying whether the group is a substituted group or an unsubstituted group means that the group is preferably an unsubstituted group.

In the present specification, a (meth)allyl group represents both or either of allyl and methallyl, a "(meth)acrylate" represents both or either of acrylate and methacrylate, a "(meth)acryl" represents both or either of acryl and methacryl, and a "(meth)acryloyl" represents both or either of acryloyl and methacryloyl.

The term "step" in the present specification includes not only an independent step, but also a case in which the desired action of a step is achieved, though the step cannot be clearly differentiated from another step.

When a measurement method described in a standard set forth in the present specification differs depending on the year, it is based on the standard as of Jan. 1, 2022 unless otherwise stated.

In the present specification, "resin solid content" refers to components excluding a filler and a solvent and is intended to include a resin (A), a polyphenylene ether compound (B), and a polymer having a structural unit represented by Formula (V) as well as an additional compound (C) and an additional resin additive component (an additive, such as a flame retardant) that are blended as necessary.

In this specification, the relative dielectric constant and the dielectric constant have the same meaning.

The resin composition of the present embodiment contains a resin (A) having a terminal group represented by Formula (T1) and having an indane skeleton (which may be referred to simply as the "resin (A)"), a polyphenylene ether compound (B) having an unsaturated carbon-carbon double bond at a terminal (which may be referred to simply as the "polyphenylene ether compound (B)"), and a polymer having a structural unit represented by Formula (V).

Specifically, the resin composition of the present embodiment is characterized by containing 10 to 300 parts by mass of the polyphenylene ether compound (B) having an unsaturated carbon-carbon double bond at a terminal and 10 to 300 parts by mass of the polymer having a structural unit represented by Formula (V), relative to 100 parts by mass of the resin (A) having a terminal group represented by Formula (T1) and having an indane skeleton.

(T1)

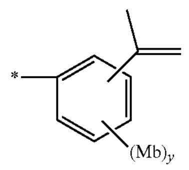

(In Formula (T1), Mb each independently represents a hydrocarbon group having from 1 to 12 carbons which may be substituted with a halogen atom; y represents an integer of 0 to 4; and * represents a bonding position with another moiety.)

(V)

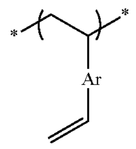

(In Formula (V), Ar represents an aromatic hydrocarbon linking group; and * represents a bonding position.)

(T1)

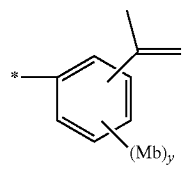

(In Formula (T1), Mb each independently represents a hydrocarbon group having from 1 to 12 carbons which may be substituted with a halogen atom; y represents an integer of 0 to 4; and * represents a bonding position with another moiety.)

With such a configuration, a resin composition having excellent moldability and a low dielectric loss tangent (Df) when formed into a cured product is obtained.

The resin (A) having a terminal group represented by Formula (T1) and having an indane skeleton is difficult to polymerize alone. Phase separation is likely to occur unless a compound having compatibility with the resin (A) is used in combination. In the present embodiment, it is presumed that the compatibility is improved, and a resin composition having excellent moldability is obtained by blending the polyphenylene ether compound (B) having an unsaturated carbon-carbon double bond at a terminal and the polymer having a structural unit represented by Formula (V) with the resin (A) in predetermined proportions. It is presumed that, since the resin (A) has an indane skeleton, a resin composition capable of lowering the dielectric loss tangent (Df) when formed into a cured product can be obtained.

Furthermore, in the present embodiment, a resin composition having a low melt viscosity is obtained. If the melt viscosity is low, for example, when a resin having a high melt viscosity and poor moldability is blended, the minimum melt viscosity can be lowered, and the moldability can be improved. In the present embodiment, a resin composition having high thermal resistance is obtained.

Resin (A) Having Terminal Group Represented by Formula (T1) and Having Indane Skeleton The resin composition of the present embodiment contains the resin (A) having a terminal group represented by Formula (T1) and having an indane skeleton. By using the resin (A), a resin composition having excellent low dielectric properties (Dk and/or Df) can be obtained.

(T1)

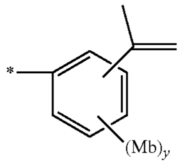

(In Formula (T1), Mb each independently represents a hydrocarbon group having from 1 to 12 carbons which may be substituted with a halogen atom; y represents an integer of 0 to 4; and * represents a bonding position with another moiety.)

In Formula (T1), Mb is each independently preferably a hydrocarbon group having from 1 to 10 carbons which may be substituted with a halogen atom, more preferably a hydrocarbon group having from 1 to 5 carbons which may be substituted with a halogen atom, and still more preferably a hydrocarbon group having from 1 to 3 carbons which may be substituted with a halogen atom. Examples of the halogen atom include a fluorine atom, a chlorine atom, and a bromine atom, and a fluorine atom or a chlorine atom is preferred. Preferably, Mb is each independently a hydrocarbon group having from 1 to 12 carbons which is not substituted with a halogen atom.

The hydrocarbon group is preferably an alkyl group, and more preferably a linear alkyl group. Mb is preferably a methyl group or an ethyl group.

y is preferably an integer from 0 to 3, more preferably an integer from 0 to 2, still more preferably 0 or 1, and even more preferably 0.

The resin (A) may have a terminal group represented by Formula (T1) at all terminals or only at some terminals for each resin molecule.

The number of terminal groups represented by Formula (T1) in the resin molecule of the resin (A) is preferably two.

The resin (A) has an indane skeleton. There is no particular limitation as long as at least one molecule among the resin molecules contained in the resin (A) has at least one indane skeleton, and the number of indane skeletons in the resin molecules of the resin (A) is preferably 1 or more, and more preferably 1 to 20 per molecule. With such a configuration, the effects of the present invention are more effectively exhibited.

The resin (A) preferably contains a structural unit represented by Formula (Txn) below.

(Txn)

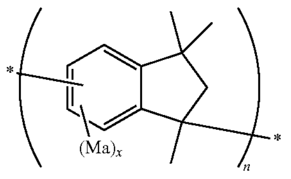

(In Formula (Txn), n represents an average number of repeating units and represents a number of more than 0 and 20 or less; Ma each independently represents a hydrocarbon group having from 1 to 12 carbons which may be substituted with a halogen atom; and x represents an integer from 0 to 4.)

In Formula (Txn), Ma is each independently preferably a hydrocarbon group having from 1 to 10 carbons which may be substituted with a halogen atom, more preferably a hydrocarbon group having from 1 to 5 carbons which may be substituted with a halogen atom, and still more preferably a hydrocarbon group having from 1 to 3 carbons which may be substituted with a halogen atom. Examples of the halogen atom include a fluorine atom, a chlorine atom, and a bromine atom, and a fluorine atom or a chlorine atom is preferred. Preferably, Ma is each independently a hydrocarbon group having from 1 to 12 carbons which is not substituted with a halogen atom. The hydrocarbon group is preferably an alkyl group, and more preferably a linear alkyl group.

Ma is particularly preferably a methyl group or an ethyl group.

x is preferably an integer from 0 to 3, more preferably an integer from 0 to 2, still more preferably 0 or 1, and even more preferably 0.

The resin (A) more preferably contains a resin represented by Formula (T1-1), and more preferably contains a resin represented by Formula (T1-1-2).

(T1-1)

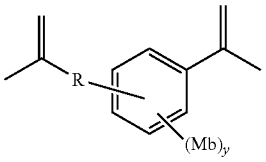

(In Formula (T1-1), R is a group containing structural units represented by Formula (Tx); Mb each independently represents a hydrocarbon group having from 1 to 12 carbons which may be substituted with a halogen atom; and y is an integer of 0 to 4.)

In Formula (T1-1), Mb and y have the same meanings as Mb and y in Formula (T1), and preferred ranges thereof are also the same.

(T1-1-2)

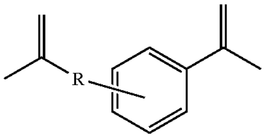

(In Formula (T1-2), R is a group containing structural units represented by Formula (Tx).)

(Tx)

(a)

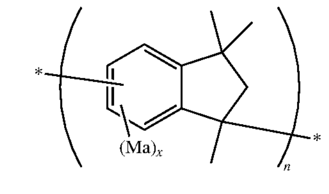

(b)

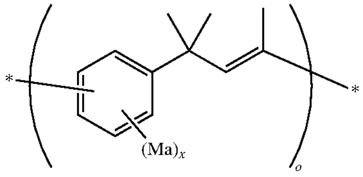

(c)

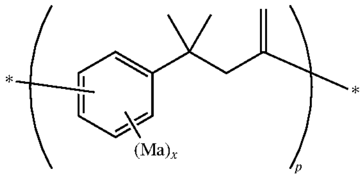

(In Formula (Tx), n, o, and p represent an average number of repeating units; n represents a number of more than 0 and 20 or less; o and p each independently represent a number of 0 to 20; 1.0≤n+o+p≤20.0; Ma each independently represents a hydrocarbon group having from 1 to 12 carbons which may be substituted with a halogen atom; x represents an integer of 0 to 4; structural units (a), (b), and (c) are each bonded to the structural unit (a), (b), or (c), or an additional group by *; and the structural units may be randomly bonded.)

In Formula (Tx), n, o, and p each mean the average number of repeating units in all molecules in the resin.

In Formula (Tx), the sum of n, o, and p is preferably 1.1≤n+o+p, more preferably 1.2≤n+o+p, still more preferably 1.5≤n+o+p, even more preferably 2.0≤n+o+p, further more preferably 2.5≤n+o+p, still further more preferably 3.0≤n+o+p, and particularly preferably 3.3≤n+o+p. In Formula (Tx), the sum of n, o, and p is preferably n+o+p≤20.0, more preferably n+o+p≤10.0, still more preferably n+o+p≤8.0, even more preferably n+o+p≤7.0, and further more preferably n+o+p≤6.4. The sum of n, o, and p can be calculated by the method described in Examples below.

In Formula (Tx), Ma and x have the same meanings as Ma and x in Formula (Txn), respectively, and preferred ranges thereof are also the same.

The resin represented by Formula (T1-1) (preferably, the resin represented by Formula (T1-1-2)) preferably has a parameter α calculated from Formula (α) of 0.55 or more and 1.00 or less, and a parameter β calculated from Formula (β) of 0.20 or more and 3.00 or less. By setting the parameters α and β within the above ranges, the resulting cured product tends to have excellent low dielectric properties (Dk and/or Df) and excellent thermal resistance.

$$\text{Parameter } \alpha = \frac{(2.55\text{ ppm} \sim 2.31\text{ ppm})}{(6.24\text{ ppm} \sim 5.91\text{ ppm}) + (2.98\text{ ppm} \sim 2.55\text{ ppm})/2 + (2.55\text{ ppm} \sim 2.31\text{ ppm})} \quad (\alpha)$$

$$\text{Parameter } \beta = \frac{\{(5.49\text{ ppm} \sim 4.89\text{ ppm}) - (4.89\text{ ppm} \sim 4.45\text{ ppm})\} \times 1.5}{(2.31\text{ ppm} \sim 1.96\text{ ppm}) - (2.55\text{ ppm} \sim 2.31\text{ ppm})} \quad (\beta)$$

(The value in each of the parentheses in Formulae (α) and (β) indicates an integral value between the corresponding chemical shift values in $^1$H-NMR.)

Here, a represents a proportion of the structural unit having an indane skeleton (the structural unit (a) in Formula (Tx)) in the resin represented by Formula (T1-1) (preferably, the resin represented by Formula (T1-1-2)). More specifically, it is presumed that the rigidity and glass transition temperature of the resulting resin molecule can be increased by adjusting the proportion of the structural unit having an indane skeleton so as to satisfy the range of the parameter α. In addition, it is presumed that since a molecule having high rigidity has lower mobility than a molecule having low rigidity, a relaxation time for dielectric relaxation becomes longer, and Df can be lowered. When the resin represented by Formula (T1-1) is synthesized, a can be increased by controlling conditions, such as decreasing the concentration of a raw material, using a highly polar solvent, increasing the amount of a catalyst, and increasing a reaction temperature.

Meanwhile, p defines the proportion of a terminal double bond in the resin represented by Formula (T1-1) (preferably, the resin represented by Formula (T1-1-2)). More specifically, for example, it is presumed that the number of crosslinking points with a functional group of the additional compound (C) described below increases, a network is easily formed at the time of thermal curing, and a cured product having a high glass transition temperature and a low Df is obtained. When the resin represented by Formula (T1-1) is synthesized, P can be increased by controlling conditions, such as decreasing the amount of a catalyst, decreasing the reaction temperature, and using a low-polarity solvent.

In synthesizing the resin represented by Formula (T1-1) (preferably, the resin represented by Formula (T1-1-2)), the parameters α and β of the resin represented by Formula (T1-1) (preferably, the resin represented by Formula (T1-1-2)) can be adjusted using the method of increasing the parameters α and β described above. Needless to say, the parameters α and β may be adjusted by a method other than that described above.

The parameter α is preferably 0.57 or more, more preferably 0.59 or more, still more preferably 0.60 or more, even more preferably 0.62 or more, and may be 0.65 or more, 0.70 or more, 0.75 or more, or 0.80 or more. When the parameter α is equal to or more than the above lower limit, the thermal resistance of the resulting cured product tends to be further improved.

The parameter α may be 0.95 or less, 0.90 or less, 0.85 or less, 0.82 or less, 0.80 or less, 0.77 or less, 0.75 or less, or 0.74 or less, although it is preferable that the parameter α is large since substantially the low dielectric properties (Dk and/or Df) and the thermal resistance tend to be excellent.

The parameter β is preferably 0.25 or more, more preferably 0.30 or more, still more preferably 0.35 or more, even more preferably 0.40 or more, further more preferably 0.43 or more, and still further more preferably 0.50 or more, and may be 0.60 or more, 0.65 or more, 0.70 or more, 0.77 or more, 0.80 or more, 0.90 or more, or 0.95 or more. When the parameter β is equal to or more than the above lower limit, the thermal resistance of the resulting cured product tends to be improved, and Df tends to be lowered. The parameter 1 is preferably 2.50 or less, more preferably 2.00 or less, still more preferably 1.50 or less, even more preferably 1.30 or less, further more preferably 1.20 or less, and still further more preferably 1.10 or less, and may be 1.00 or less, 0.95 or less, 0.90 or less, 0.85 or less, 0.83 or less, or 0.80 or less. When the parameter β is equal to or lower than the above upper limit, the thermal resistance of the resulting cured product tends to be improved, and Df tends to be lowered.

The number average molecular weight (Mn) of the resin (A) in terms of polystyrene measured by the GPC (gel permeation chromatography) method (the details are according to the method described in Examples below) is preferably 400 or more, more preferably 500 or more, still more preferably 550 or more, even more preferably 600 or more, and further more preferably 650 or more. When the number average molecular weight is equal to or higher than the above lower limit, the thermal resistance of the resulting cured product tends to be improved, and Df tends to be lowered. The upper limit of the number average molecular weight (Mn) of the resin (A) in terms of polystyrene measured by the GPC (gel permeation chromatography) method is preferably 3000 or less, more preferably 2500 or less, still more preferably 2000 or less, even more preferably 1500 or less, and further more preferably 1250 or less, and the upper limit may be 1000 or less or 800 or less depending on the intended use and the like. When the number average molecular weight is equal to or lower than the above upper limit, the thermal resistance of the resulting cured product tends to be improved, and the relative dielectric constant (Dk) and the dielectric loss tangent (Df) tend to be lowered.

The weight average molecular weight (Mw) of the resin (A) in terms of polystyrene measured by the GPC (the details are according to the method described in Examples below) is preferably 500 or more, more preferably 800 or more, still more preferably 900 or more, and even more preferably 1000 or more. When the weight average molecular weight is equal to or higher than the above lower limit, the thermal resistance of the resulting cured product tends to be improved, and Df tends to be lowered. The upper limit of the weight average molecular weight (Mw) of the resin (A) in terms of polystyrene measured by the GPC (the details are according to the method described in Examples below) is preferably 6000 or less, more preferably 5000 or less, still more preferably 4000 or less, even more preferably 3000 or less, and further more preferably 2800 or less, and the upper limit may be 2500 or less, 2000 or less, or 1500 or less depending on the intended use and the like. When the weight average molecular weight is equal to or lower than the above upper limit, the thermal resistance of the resulting cured product tends to be improved, and the relative dielectric constant (Dk) and the dielectric loss tangent (Df) tend to be lowered.

The resin (A) preferably has a Mw/Mn, which is the ratio of the weight average molecular weight to the number average molecular weight, of 1.1 to 3.0. The Mw/Mn of the resin (A) is more preferably 1.2 or more, still more preferably 1.3 or more, even more preferably 1.4 or more, further more preferably 1.5 or more, and still further more preferably 1.6 or more. The Mw/Mn of the resin (A) is more preferably 2.5 or less, still more preferably 2.4 or less, and may be 2.3 or less, 2.0 or less, or 1.8 or less.

The weight average molecular weight and the number average molecular weight are measured in accordance with methods described in Examples below.

The content of the resin (A) in the resin composition of the present embodiment is preferably 5 parts by mass or more, more preferably 8 parts by mass or more, and may be 10 parts by mass or more, relative to 100 parts by mass of the resin solid content in the resin composition, or may be 15 parts by mass or more, 20 parts by mass or more, or 25 parts by mass or more, depending on the intended use and the like. When the content of the resin (A) is equal to or more than the above lower limit, Df of the resulting cured product tends to be lowered. The upper limit of the content of the resin (A) is preferably 70 parts by mass or less, more preferably 55 parts by mass or less, still more preferably 50 parts by mass or less, even more preferably 45 parts by mass or less, further more preferably 40 parts by mass or less, and particularly preferably 35 parts by mass or less relative to 100 parts by mass of the resin solid content in the resin composition. When the content of the resin (A) is equal to or lower than the above upper limit, the moldability of the resin composition and the thermal resistance of the resulting cured product tend to be improved.

The resin composition of the present embodiments may contain only one type of resin (A) or may contain two or more types of resins (A). When two or more types of resins are contained, the total amount thereof preferably falls within the above range.

The method for producing the resin (A) of the present embodiment is not particularly limited, and the resin produced by a known production method can be used. When the resin (A) is synthesized, the raw material, the reaction temperature, the catalyst type, the catalyst amount, the reaction solvent, and the raw material concentration are not particularly limited, and can be appropriately selected or controlled depending on the desired physical properties described above.

In the present embodiment, the raw material that can be used for synthesizing the resin (A) is, for example, m-bis(α-hydroxyisopropyl)benzene, p-bis(α-hydroxyisopropyl)benzene, 1,3-diisopropenylbenzene, and 1,4-diisopropenylbenzene.

In the present embodiment, the reaction temperature at the time of synthesizing the resin (A) is preferably 40 °C or higher, more preferably 50 °C or higher, and still more preferably 60 °C or higher, and may be 70 °C or higher, 80 °C or higher, 90 °C or higher, 100 °C or higher, 110 °C or higher, or 120 °C or higher. When the reaction temperature is equal to or higher than the above lower limit, the reaction rate tends to be improved, and the proportion of an indane skeleton (the structural unit (a) in Formula (Tx)) tends to be improved, which is preferred. The reaction temperature is preferably 180 °C or lower, more preferably 150 °C or lower, and still more preferably 140 °C or lower. When the reaction temperature is equal to or lower than the upper limit, the production of a by-product tends to be effectively suppressed.

The reaction temperature does not need to be constant from the start to the end of the reaction, and the temperature may be varied. In this case, the average temperature of reaction temperatures in all processes preferably falls within the above range.

In the present embodiment, the catalyst used for synthesizing the resin (A) is not particularly limited, and an acid catalyst is exemplified. Examples of the acid catalyst that can be used include inorganic acids such as hydrochloric acid, sulfuric acid, and phosphoric acid, organic acids such as oxalic acid, benzenesulfonic acid, toluenesulfonic acid, methanesulfonic acid, and fluoromethanesulfonic acid, a $BF_3$ ether complex, a $BF_3$ phenol complex, Lewis acids such as aluminum chloride, zinc chloride, and indium chloride, solid acids such as activated clay, acid clay, silica alumina, and zeolite, heteropoly hydrochloric acid, and a strongly acidic ion exchange resin.

When the catalyst is used, the amount thereof is 0.01 to 20.0 parts by mass relative to 100 parts by mass of the raw material of the resin (A).

The catalyst is usually used alone, but two or more types may be used in combination. When two or more catalysts are used in combination, the total amount thereof preferably falls within the above range.

In the present embodiment, the reaction solvent used for synthesizing the resin (A) is not particularly limited, and can be used in combination with, for example, an aromatic hydrocarbon solvent such as toluene, benzene, chlorobenzene, or xylene, a halogenated hydrocarbon solvent such as methylene chloride or chloroform, an aliphatic hydrocarbon solvent such as hexane or heptane, an ester solvent such as ethyl acetate or propyl acetate, an amide solvent such as dimethylformamide or dimethylacetamide, an alcohol solvent, or a ketone solvent, and water may also be added. Examples of the alcohol solvent include methanol, ethanol, butanol, propanol, methyl propylene diglycol, diethylene glycol ethyl ether, butyl propylene glycol, and propyl propylene glycol, and examples of the ketone solvent include acetone, methyl ethyl ketone, diethyl ketone, methyl butyl ketone, and methyl isobutyl ketone. Other examples include, but are not limited to, tetrahydrofuran and dioxane.

An example of the reaction solvent in the present embodiment contains an aromatic hydrocarbon solvent.

In the present embodiment, the concentration of the above-described raw material at the time of synthesizing the resin (A) is preferably 5% or more, more preferably 8% or more, and preferably 10% or more, and may be 12% or more, 15% or more, 17% or more, 20% or more, 22% or more, or 25% or more. When the concentration is equal to or higher than the above lower limit, the reaction rate tends to be improved, and the proportion of an indane skeleton (the structural unit (a) in Formula (Tx)) tends to be improved, which is preferred. The concentration of the above-described raw material is preferably 49% or less, and more preferably 40% or less. When the concentration is equal to or lower than the above upper limit, the production of a by-product tends to be effectively suppressed.

The concentration does not need to be constant from the start to the end of the reaction, and the concentration may be varied.

Polyphenylene Ether Compound (B) Having Unsaturated Carbon-Carbon Double Bond at Terminal The resin composition of the present embodiment contains the polyphenylene ether compound (B) having an unsaturated carbon-carbon double bond at a terminal. In the present embodiment, the polyphenylene ether compound (B) preferably contains a polyphenylene ether compound (B2) containing two or more unsaturated carbon-carbon double bonds.

The polyphenylene ether compound (B) having an unsaturated carbon-carbon double bond at a terminal is preferably a polyphenylene ether compound having, at a terminal, a group selected from the group consisting of a group represented by Formula (Rx-1) such as a vinylbenzyl group, a group represented by Formula (Rx-2) such as a (meth) acrylic group, and a maleimide group, more preferably a polyphenylene ether compound having, at a terminal, a group represented by Formula (Rx-1) such as a vinylbenzyl group and/or a group represented by Formula (Rx-2) such as a (meth)acrylic group, and still more preferably a polyphenylene ether compound having, at a terminal, two or more groups represented by Formula (Rx-1) such as a vinylbenzyl group and/or two or more groups represented by Formula (Rx-2) such as a (meth)acrylic group.

(Rx-1)

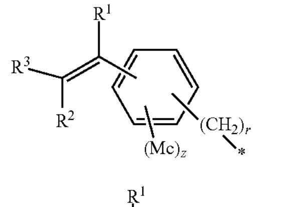

(Rx-2)

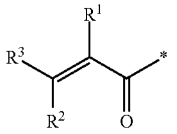

(In Formula (Rx-1) and Formula (Rx-2), $R^1$, $R^2$, and $R^3$ each independently represent a hydrogen atom, an alkyl group, an alkenyl group, or an alkynyl group; * is a bonding site to an oxygen atom; Me each independently represents a hydrocarbon group having from 1 to 12 carbons; z represents an integer of 0 to 4; and r represents an integer of 1 to 6.)

When such a polyphenylene ether compound is used, the low dielectric properties (Dk and/or Df) and low water absorbability of a printed wiring board or the like tend to be more effectively improved. In the present embodiment, a polyphenylene ether compound having a vinylbenzyl group at a terminal is particularly preferred. A polyphenylene ether compound having a vinylbenzyl group tends to have significantly improved compatibility with the resin (A).

Hereinafter, these details will be described.

The polyphenylene ether compound (B) having an unsaturated carbon-carbon double bond at a terminal (preferably, a polyphenylene ether compound (B2) having two or more unsaturated carbon-carbon double bonds) is, for example, a compound having a phenylene ether skeleton represented by Formula (X1) below.

(X1)

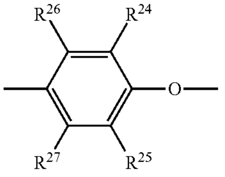

(In Formula (X1), $R^{24}$, $R^{25}$, $R^{26}$, and $R^{27}$ may be identical to or different from one another, and each represent an alkyl group having 6 or less carbons, an aryl group, a halogen atom, or a hydrogen atom.)

The polyphenylene ether compound (B) having an unsaturated carbon-carbon double bond at a terminal (preferably, the polyphenylene ether compound (B2) having two or more unsaturated carbon-carbon double bonds) may further contain a repeating unit represented by Formula (X2):

(X2)

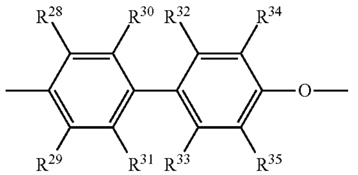

(in Formula (X2), $R^{28}$, $R^{29}$, $R^{30}$, $R^{34}$, and $R^{35}$ may be identical to or different from one another, and each represent an alkyl group having 6 or less carbons or a phenyl group; and $R^{31}$, $R^{32}$, and $R^{33}$ may be identical to or different from one another, and each represent a hydrogen atom, an alkyl group having 6 or less carbons, or a phenyl group) and/or a repeating unit represented by Formula (X3):

(X3)

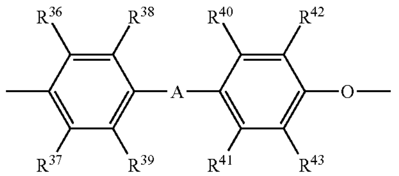

(in Formula (X3), $R^{36}$, $R^{37}$, $R^{38}$, $R^{39}$, $R^{40}$, $R^{41}$, $R^{42}$, and $R^{43}$ may be identical to or different from one another, and each represent a hydrogen atom, an alkyl group having 6 or less carbons, or a phenyl group; and -A- is a linear, branched, or cyclic divalent hydrocarbon group having 20 or less carbons).

The polyphenylene ether compound (B) having an unsaturated carbon-carbon double bond at a terminal (preferably, the polyphenylene ether compound (B2) having two or more unsaturated carbon-carbon double bonds) is preferably a modified polyphenylene ether compound (hereinafter, may be referred to as a "modified polyphenylene ether compound (g)") in which the terminal is partially or entirely functionalized with an ethylenically unsaturated group, more preferably a modified polyphenylene ether compound having, at a terminal, two or more groups selected from the group consisting of a group represented by Formula (Rx-1) such as a vinylbenzyl group, a group represented by Formula (Rx-2) such as a (meth)acrylic group, and a maleimide group, and still more preferably a group represented by Formula (Rx-1) such as a vinylbenzyl group and/or a group represented by Formula (Rx-2) such as a (meth)acrylic group. By employing such a modified polyphenylene ether compound (g), it is possible to further reduce the low dielectric properties (Dk and/or Df) of the cured product of the resin composition, improve the low water absorbability, and increase metal foil peel strength. One of these may be used, or two or more may be used in combination.

Examples of the modified polyphenylene ether compound (g) include a polyphenylene ether compound represented by Formula (OP).

$$X-\left[O-(Y-O)_{n1}Rx\right]_{n2} \qquad \text{(OP)}$$

(In Formula (OP), X represents an aromatic group; —(Y—O)$n_1$- represents a polyphenylene ether structure; $n_1$ represents an integer of 1 to 100; and $n_2$ represents an integer of 1 to 4; and Rx is a group represented by Formula (Rx-1) or Formula (Rx-2).)

(Rx-1)

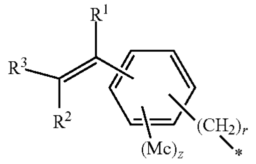

(Rx-2)

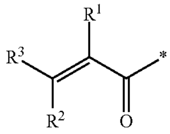

(In Formula (Rx-1) and Formula (Rx-2), $R^1$, $R^2$, and $R^3$ each independently represent a hydrogen atom, an alkyl group, an alkenyl group, or an alkynyl group; * is a bonding site to an oxygen atom; Me each independently represents a hydrocarbon group having from 1 to 12 carbons; z represents an integer of 0 to 4; and r represents an integer of 1 to 6.)

When $n_1$ and/or $n_2$ is an integer of 2 or more, $n_1$ structural units (Y—O) and/or $n_2$ structural units may be identical to or different from one another. $n_2$ is preferably 2 or more, and more preferably 2.

In Formula (Rx-1) and Formula (Rx-2), $R^1$, $R^2$, and $R^3$ each independently represent a hydrogen atom, an alkyl group, an alkenyl group, or an alkynyl group.

$R^1$ is preferably a hydrogen atom or an alkyl group, more preferably a hydrogen atom or a methyl group, and still more preferably a hydrogen atom.

$R^2$ and $R^3$ are each independently preferably a hydrogen atom or an alkyl group, more preferably a hydrogen atom or a methyl group, and still more preferably a hydrogen atom.

The number of carbons of the alkyl group, the alkenyl group, or the alkynyl group represented by each of $R^1$, $R^2$, and $R^3$ is preferably 5 or less, and more preferably 3 or less.

In Formula (Rx-1), r represents an integer of 1 to 6, and is preferably an integer of 1 to 5, more preferably an integer of 1 to 4, still more preferably an integer of 1 to 3, even more preferably 1 or 2, and further more preferably 1.

In Formula (Rx-1), Mc each independently represents a hydrocarbon group having from 1 to 12 carbons, and is preferably a hydrocarbon group having from 1 to 10 carbons, more preferably a linear or branched alkyl group having from 1 to 10 carbons, still more preferably a methyl group, an ethyl group, an isopropyl group, an isobutyl group, a t-butyl group, a pentyl group, an octyl group, or a nonyl group, and even more preferably a methyl group, an ethyl group, an isopropyl group, an isobutyl group, or a t-butyl group.

In Formula (Rx-1), z represents an integer of 0 to 4, and is preferably an integer of 0 to 3, more preferably an integer of 0 to 2, still more preferably 0 or 1, and even more preferably 0.

A specific example of the group represented by Formula (Rx-1) is a vinylbenzyl group, and a specific example of the group represented by Formula (Rx-2) is a (meth)acryloyl group.

Rx is preferably a group represented by Formula (Rx-1).

Examples of the modified polyphenylene ether compound (g) include a polyphenylene ether compound represented by Formula (OP-1).

(OP-1)

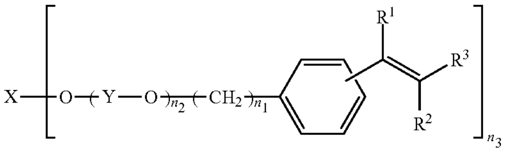

(In Formula (OP-1), X represents an aromatic group; —(Y—O)$n_2$- represents a polyphenylene ether structure; $R^1$, $R^2$, and $R^3$ each independently represent a hydrogen atom, an alkyl group, an alkenyl group, or an alkynyl group; $n_1$ represents an integer of from 1 to 6; $n_2$ represents an integer of from 1 to 100; and $n_3$ represents an integer of from 1 to 4.)

When $n_2$ and/or $n_3$ is an integer of 2 or more, $n_2$ structural units (Y—O) and/or $n_3$ structural units may be identical to or different from each other. $n_3$ is preferably 2 or more, and more preferably 2.

The modified polyphenylene ether compound (g) in the present embodiment is also preferably a compound represented by Formula (OP-2), and more preferably a compound represented by Formula (OP-2-2).

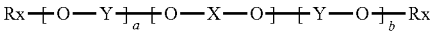

(OP-2)

(OP-2-2)

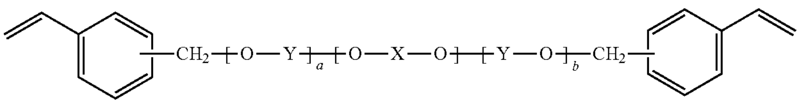

Here, —(O—X—O)— is preferably represented by Formula (OP-3):

(OP-3)

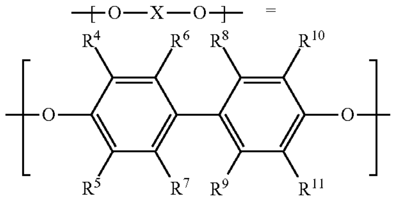

(in Formula (OP-3), $R^4$, $R^5$, $R^6$, $R^{10}$, and $R^{11}$ may be identical to or different from one another, and are each an alkyl group having 6 or less carbons or a phenyl group; and $R^7$, $R^8$, and $R^9$ may be identical to or different from one another, and are each a hydrogen atom, an alkyl group having 6 or less carbons, or a phenyl group)

and/or Formula (OP-4):

(OP-4)

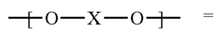

-continued

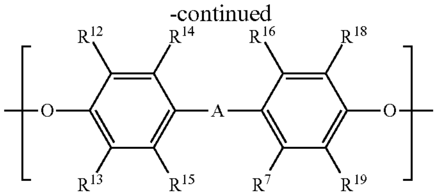

(in Formula (OP-4), $R^{12}$, $R^{13}$, $R^{14}$, $R^{15}$, $R^{16}$, $R^{17}$, $R^{18}$, and $R^{19}$ may be identical to or different from one another, and are each a hydrogen atom, an alkyl group having 6 or less carbons, or a phenyl group; and -A- is a linear, branched, or cyclic divalent hydrocarbon group having 20 or less carbons).

Moreover, —(Y—O)— is preferably represented by Formula (OP-5):

(OP-5)

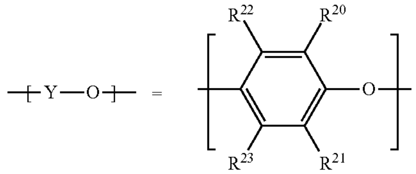

(in Formula (OP-5), $R^{20}$ and $R^{21}$ may be identical to or different from each other, and are each an alkyl group having 6 or less carbons or a phenyl group; and $R^{22}$ and $R^{23}$ may be identical to or different from each other, and are each a hydrogen atom, an alkyl group having 6 or less carbons, or a phenyl group). In particular, when $R^{20}$ and $R^{21}$ are each independently a group having one or more methyl groups and/or cyclohexyl groups, the rigidity of the resulting resin molecule is increased, and a molecule having high rigidity has lower mobility than a molecule having low rigidity, so that a relaxation time during dielectric relaxation is lengthened, and the low dielectric properties (Dk and/or Df) are improved, which is preferred.

An example of Formula (OP-5) is the following structure.

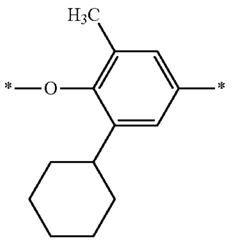 [SMILES: *Oc1c(C)cc(*)cc1C1CCCCC1]

For the polyphenylene compound having the above structure, reference can be made to the description of JP 2019-194312 A, the content of which is incorporated herein by reference.

In Formula (OP-2), a and b each independently represent an integer of 0 to 100, and at least one of a and b is an integer of 1 to 100. a and b are each independently preferably an integer of 0 to 50, more preferably an integer of 1 to 30, and preferably an integer of 1 to 10. When a and/or b is an integer of 2 or more, two or more —(Y—O)— may each independently be in an arrangement of one type of structure or a block or random arrangement of two or more types of structures.

When a plurality of compounds represented by Formula (OP-2) are contained, an average value of a is preferably $1<a<10$, and an average value of b is preferably $1<b<10$.

Examples of -A- in Formula (OP-4) include, but are not limited to, divalent organic groups such as a methylene group, an ethylidene group, a 1-methylethylidene group, a 1,1-propylidene group, a 1,4-phenylenebis(1-methylethylidene) group, a 1,3-phenylenebis(1-methylethylidene) group, a cyclohexylidene group, a phenylmethylene group, a naphthylmethylene group, and a 1-phenylethylidene group.

Rx has the same meaning as Rx in Formula (OP), and the preferred range is also the same.

Among the compounds represented by Formula (OP-2), preferred is a polyphenylene ether compound in which $R^4$, $R^5$, $R^6$, $R^{10}$, $R^{11}$, $R^{20}$, and $R^{21}$ are each an alkyl group having 3 or less carbons, and $R^7$, $R^8$, $R^9$, $R^{12}$, $R^{13}$, $R^{14}$, $R^{15}$, $R^{16}$, $R^{17}$, $R^{18}$, $R^{19}$, $R^{22}$, and $R^{23}$ are each a hydrogen atom or an alkyl group having 3 or less carbons, and in particular, —(O—X—O)-represented by Formula (OP-3) or Formula (OP-4) is preferably Formula (OP-9), Formula (OP-10), and/or Formula (OP-11), and —(Y—O)— represented by Formula (OP-5) is preferably Formula (OP-12) or Formula (OP-13). When a and/or b is an integer of 2 or more, two or more —(Y—O)— may each independently have a structure in which two or more of Formula (OP-12) and/or Formula (OP-13) are arranged, or a structure in which Formula (OP-12) and Formula (OP-13) are arranged in a block or random manner.

(OP-9)

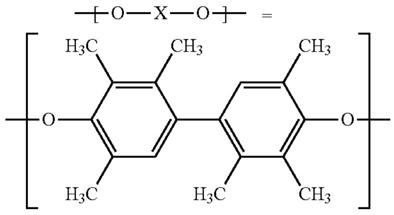

-continued (OP-10)

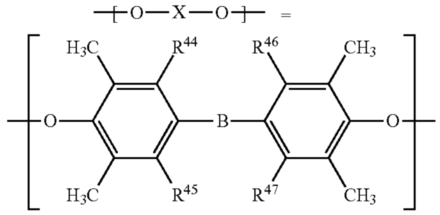

(In Formula (OP-10), $R^{44}$, $R^{45}$, $R^{46}$ and $R^{47}$ may be identical to or different from one another, and are each a hydrogen atom or a methyl group; and —B— is a linear, branched, or cyclic divalent hydrocarbon group having 20 or less carbons.)

Specific examples of —B— include the same as those for the specific examples of -A- in Formula (OP-4).

(OP-11)

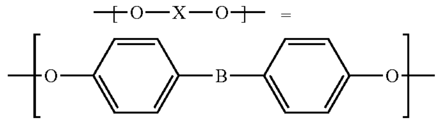

(In Formula (OP-11), —B— is a linear, branched, or cyclic divalent hydrocarbon group having 20 or less carbons.)

Specific examples of —B— include the same as those for the specific examples of -A- in Formula (OP-4).

(OP-12)

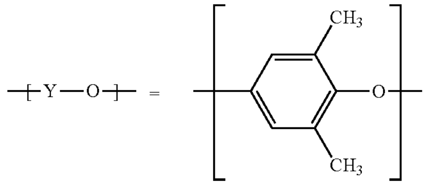

(OP-13)

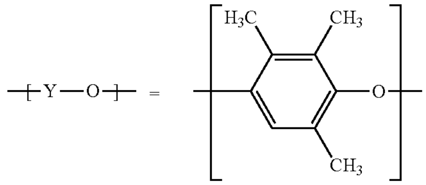

The modified polyphenylene ether compound (g) used in the present embodiment is more preferably a compound represented by Formula (OP-14) and/or a compound represented by Formula (OP-15).

(OP-14)

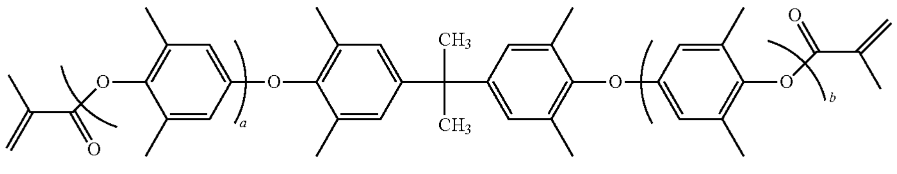

(In Formula (OP-14), a and b each independently represent an integer of 0 to 100, and at least one of a and b is an integer of 1 to 100.)

In Formula (OP-14), a and b each have the same meanings as a and b in Formula (OP-2), and preferred ranges thereof are also the same.

(OP-15)

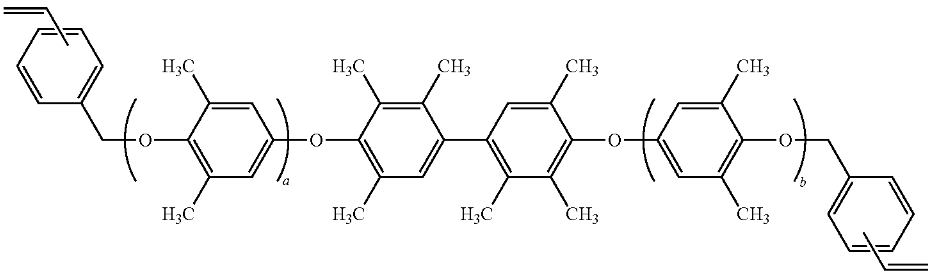

(In Formula (OP-15), a and b each independently represent an integer of 0 to 100, and at least one of a and b is an integer of 1 to 100.)

In Formula (OP-15), a and b each have the same meanings as a and b in Formula (OP-2), and preferred ranges thereof are also the same.

The number average molecular weight (Mn) of the polyphenylene ether compound (B) having an unsaturated carbon-carbon double bond at a terminal (preferably, the polyphenylene ether compound (B2) having two or more unsaturated carbon-carbon double bonds, more preferably the modified polyphenylene ether compound (g)) in terms of polystyrene measured by the GPC (gel permeation chromatography) method (the details are according to the method described in Examples below) is, for example, preferably 500 or more and further preferably 800 or more, and preferably 3000 or less. When the number average molecular weight is 500 or more, stickiness tends to be further prevented when the resin composition of the present embodiments is formed into a coating film. When the number average molecular weight is 3000 or less, the solubility in a solvent tends to be further improved.

The weight average molecular weight (Mw) of the polyphenylene ether compound (B) having an unsaturated carbon-carbon double bond at a terminal (preferably, the polyphenylene ether compound (B2) having two or more unsaturated carbon-carbon double bonds, more preferably the modified polyphenylene ether compound (g)) in terms of polystyrene measured by the GPC (the details are according to the method described in Examples below) is preferably 800 or more and 6000 or less, and more preferably 800 or more and 5000 or less. When the weight average molecular weight is equal to or higher than the lower limit, the relative dielectric constant (Dk) and dielectric loss tangent (Df) of a cured product of the resin composition tends to further decrease, whereas when the weight average molecular weight is equal to or lower than the upper limit, the solubility of the resin composition in a solvent, and the low viscosity properties and the moldability of the resin composition tend to be further improved during production of the below-described varnish.

Furthermore, in the case of the modified polyphenylene ether compound (g), the terminal unsaturated carbon-carbon double bond equivalent is preferably from 400 g to 5000 g and more preferably from 400 g to 2500 g per unsaturated carbon-carbon double bond. When the terminal unsaturated carbon-carbon double bond equivalent is equal to or more than the above lower limit, the relative dielectric constant (Dk) and dielectric loss tangent (Df) of the cured product of the resin composition tend to further decrease. When the terminal unsaturated carbon-carbon double bond equivalent is equal to or lower than the above upper limit, the solubility of the resin composition in a solvent, and the low viscosity properties and moldability of the resin composition tend to be further improved.

The lower limit of the content of the polyphenylene ether compound (B) having an unsaturated carbon-carbon double bond at a terminal (preferably, the polyphenylene ether compound (B2) having two or more unsaturated carbon-carbon double bonds) in the resin composition of the present embodiment is 10 parts by mass or more, preferably 50 parts by mass or more, more preferably 100 parts by mass or more, still more preferably 150 parts by mass or more, and may be 180 parts by mass or more, relative to 100 parts by mass of the resin (A). When the content is equal to or higher than the above lower limit, the moldability of the resin composition, the low water absorbability and the low dielectric properties (Dk and/or Df) of the resulting cured product tend to be further improved. The upper limit of the content of the polyphenylene ether compound (B) having an unsaturated carbon-carbon double bond at a terminal (preferably, the polyphenylene ether compound (B2) having two or more unsaturated carbon-carbon double bonds) is 300 parts by mass or less, preferably 280 parts by mass or less, more preferably parts by mass or less, may be 250 parts by mass or less, and may be 220 parts by mass or less, relative to 100 parts by mass of the resin (A). When the content is equal to or lower than the above upper limit, the low dielectric properties (Dk and/or Df), thermal resistance, and chemical resistance of the resulting cured product tend to be further improved.

The total content of the resin (A) and the polyphenylene ether compound (B) relative to 100 parts by mass of the resin solid content in the resin composition of the present embodiment is preferably 40 parts by mass or more, more preferably 45 parts by mass or more, still more preferably 50 parts by mass or more, and may be 55 parts by mass or more. When the total content of the resin (A) and the polyphenylene ether compound (B) is equal to or higher than the above lower limit, the low water absorbability and low dielectric properties (Dk and/or Df) of the resulting cured product tend to be further improved. The total content of the resin (A) and the polyphenylene ether compound (B) relative to 100 parts by mass of the resin solid content in the resin composition is preferably 80 parts by mass or less. When the total content of the resin (A) and the polyphenylene ether compound (B) is equal to or lower than the above upper limit, there is a tendency that the moldability of the resin composition, and the low dielectric properties (Dk and/or Df), thermal resistance, and chemical resistance of the resulting cured product are well balanced.

In the present embodiment, the mass proportion of the resin (A) relative to 100 parts by mass of the total amount of the resin (A) and the polyphenylene ether compound (B) is preferably 10 parts by mass or more, more preferably 15 parts by mass or more, still more preferably 20 parts by mass or more, even more preferably 25 parts by mass or more, and further more preferably 30 parts by mass or more. When the mass proportion is equal to or higher than the above lower limit, the low dielectric properties (Dk and/or Df) of the resulting cured product tend to be further improved. The mass proportion of the resin (A) relative to 100 parts by mass of the total amount of the resin (A) and the polyphenylene ether compound (B) is preferably 50 parts by mass or less, more preferably 45 parts by mass or less, still more preferably 40 parts by mass or less, and even more preferably 38 parts by mass or less. When the mass proportion is equal to or lower than the above upper limit, the moldability of the resin composition and the low dielectric properties (Dk and/or Df) of the resulting cured product tend to be further improved.

The lower limit of the content of the polyphenylene ether compound (B) having an unsaturated carbon-carbon double bond at a terminal (preferably, the polyphenylene ether compound (B2) having two or more unsaturated carbon-carbon double bonds) in the resin composition of the present embodiment is preferably 30 parts by mass or more, and more preferably 35 parts by mass or more, relative to 100 parts by mass of the resin solid content in the resin composition. When the content of the polyphenylene ether compound (B) is equal to or higher than the above lower limit, the low water absorbability and low dielectric properties (Dk and/or Df) of the resulting cured product tend to be further improved. The upper limit of the content of the polyphenylene ether compound (B) having an unsaturated carbon-carbon double bond at a terminal (preferably, the polyphenylene ether compound (B2) having two or more unsaturated carbon-carbon double bonds) is preferably 75 parts by mass or less, more preferably 70 parts by mass or less, and may be 65 parts by mass or less, and may be 60 parts by mass or less, relative to 100 parts by mass of the resin solid content in the resin composition. When the content of the polyphenylene ether compound (B) is equal to or lower than the above upper limit, the thermal resistance and chemical resistance of the resulting cured product tend to be further improved.

The resin composition of the present embodiment may contain only one type, or two or more types of polyphenylene ether compounds (B) having an unsaturated carbon-carbon double bond at a terminal. When two or more types are contained, the total amount thereof preferably falls within the above range.

Polymer Having Structural Unit Represented by Formula (V)

The resin composition of the present embodiment contains a polymer having a structural unit represented by Formula (V). When the polymer having a structural unit represented by Formula (V) is contained, a resin composition capable of providing a cured product having excellent low dielectric properties (Dk and/or Df) is obtained.

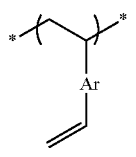

(V)

(In Formula (V), Ar represents an aromatic hydrocarbon linking group; and * represents a bonding position.)

The aromatic hydrocarbon linking group may be a group containing only an aromatic hydrocarbon that may have a substituent, or a group containing a combination of an aromatic hydrocarbon that may have a substituent and any other linking group, and is preferably a group containing only an aromatic hydrocarbon that may have a substituent. Examples of the substituent which may be possessed by the aromatic hydrocarbon include a substituent Z (for example, an alkyl group having from 1 to 6 carbons, an alkenyl group having from 2 to 6 carbons, an alkynyl group having from 2 to 6 carbons, an alkoxy group having from 1 to 6 carbons, a hydroxy group, an amino group, a carboxy group, or a halogen atom). Preferably, the aromatic hydrocarbon has no substituent.

The aromatic hydrocarbon linking group is typically a divalent linking group.

Specific examples of the aromatic hydrocarbon linking group include a phenylene group, a naphthalenediyl group, an anthracenediyl group, a phenanthrenediyl group, a biphenyldiyl group, and a fluorenediyl group, all of which may have a substituent. Among these, a phenylene group that may have a substituent is preferred. The substituent is exemplified by the substituent Z described above, while the group described above such as a phenylene group preferably has no substituent.

The structural unit represented by Formula (V) more preferably contains at least one of a structural unit represented by Formula (V1) below, a structural unit represented by Formula (V2) below, or a structural unit represented by Formula (V3) below. In Formulae below, * represents a bonding position. Hereinafter, structural units represented by Formulae (V1) to (V3) may be collectively referred to as "structural unit (a)".

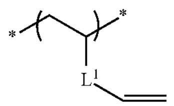

(V)

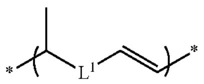

(V2)

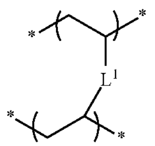

(V3)

In Formulae (V1) to (V3), $L^1$ is an aromatic hydrocarbon linking group (having preferably from 6 to 22, more preferably from 6 to 18, and even more preferably from 6 to 10 carbons). Specific examples of the aromatic hydrocarbon linking group include a phenylene group, a naphthalenediyl group, an anthracenediyl group, a phenanthrenediyl group, a biphenyldiyl group, and a fluorenediyl group, all of which may have a substituent. Among these, a phenylene group that may have a substituent is preferred. The substituent is exemplified by the substituent Z described above, while the group described above such as a phenylene group preferably has no substituent.

The compound forming the structural unit (a) is preferably a divinyl aromatic compound, and examples thereof include divinylbenzene, bis(1-methylvinyl)benzene, divinylnaphthalene, divinylanthracene, divinylbiphenyl, and divinylphenanthrene. Among these, divinylbenzene is particularly preferred. One of these divinyl aromatic compounds may be used, or two or more types may be used as necessary.

The polymer having the structural unit represented by Formula (V) may be a homopolymer of the structural unit (a) as described above, but it may be a copolymer with a structural unit derived from an additional monomer.

When the polymer having the structural unit represented by Formula (V) is a copolymer, the copolymerization ratio of the structural unit (a) is preferably 3 mol % or more, more preferably 5 mol % or more, even more preferably 10 mol % or more, and yet even more preferably 15 mol % or more. The upper limit is preferably 90 mol % or less, more preferably 85 mol % or less, even more preferably 80 mol % or less, yet even more preferably 70 mol % or less, yet even more preferably 60 mol % or less, yet even more preferably 50 mol % or less, yet even more preferably 40 mol % or less, and particularly preferably 30 mol % or less, and further may be 25 mol % or less, or 20 mol % or less.

Examples of the structural unit derived from an additional monomer include a structural unit (b) derived from an aromatic compound having one vinyl group (monovinyl aromatic compound).

The structural unit (b) derived from the monovinyl aromatic compound is preferably a structural unit represented by Formula (V4) below.

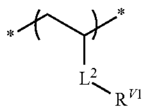

(V4)

In Formula (V4), $L^2$ is an aromatic hydrocarbon linking group, and specific preferred examples include the above-exemplified ones for $L^1$.

$R^{V1}$ is a hydrogen atom or a hydrocarbon group having from 1 to 12 carbons (preferably an alkyl group). When $R^{V1}$ is a hydrocarbon group, the number of its carbons is preferably from 1 to 6 and more preferably from 1 to 3. $R^{V1}$ and $L^2$ may have the substituent Z described above.

When the polymer having the structural unit represented by Formula (V) is a copolymer containing the structural unit (b) derived from a monovinyl aromatic compound, examples of the monovinyl aromatic compound include vinyl aromatic compounds such as styrene, vinylnaphthalene, and vinylbiphenyl; and nuclear alkyl-substituted vinyl aromatic compounds such as o-methylstyrene, m-methylstyrene, p-methylstyrene, o,p-dimethylstyrene, o-ethylvinylbenzene, m-ethylvinylbenzene, p-ethylvinylbenzene, methylvinylbiphenyl, and ethylvinylbiphenyl. The monovinyl aromatic compound exemplified here may have the substituent Z described above as appropriate. In addition, one, or two or more of these monovinyl aromatic compounds may be used.

When the polymer having the structural unit represented by Formula (V) is a copolymer containing the structural unit (b), the copolymerization ratio of the structural unit (b) is preferably 10 mol % or more, and more preferably 15 mol % or more, and further may be 20 mol % or more, 30 mol % or more, 40 mol % or more, 50 mol % or more, 60 mol % or more, 70 mol % or more, or 75 mol % or more. The upper limit is preferably 98 mol % or less, more preferably 90 mol % or less, and even more preferably 85 mol % or less.

The polymer having the structural unit represented by Formula (V) may have an additional structural unit other than the structural unit (a) and the structural unit (b). Examples of the additional structural unit include a structural unit (c) derived from a cycloolefin compound. Examples of the cycloolefin compound include hydrocarbons having a double bond in the ring structure. Specific examples include monocyclic olefins, such as cyclobutene, cyclopentene, cyclohexene, and cyclooctene; compounds having a norbornene ring structure, such as norbomene and dicyclopentadiene; and cycloolefin compounds in which an aromatic ring is fused, such as indene and acenaphthylene. Examples of the norbornene compound include those described in paragraphs [0037] to [0043] of JP 2018-39995 A, the content of which is incorporated herein by reference. The cycloolefin compounds exemplified here may further have the substituent Z described above.

When the polymer having the structural unit represented by Formula (V) is a copolymer containing the structural unit (c), the copolymerization ratio of the structural unit (c) is preferably 10 mol % or more, more preferably 20 mol % or more, and still more preferably 30 mol % or more. The upper limit is preferably 90 mol % or less, more preferably 80 mol % or less, even more preferably 70 mol % or less, and may be 50 mol % or less or 30 mol % or less.

The polymer having the structural unit represented by Formula (V) may further contain a structural unit (d) derived from a different polymerizable compound (hereinafter may be referred to as an additional polymerizable compound). Examples of the additional polymerizable compound (monomer) include compounds containing three vinyl groups. Specific examples include 1,3,5-trivinylbenzene, 1,3,5-trivinylnaphthalene, and 1,2,4-trivinylcyclohexane. Alternatively, ethylene glycol diacrylate or butadiene is exemplified. The copolymerization ratio of the structural unit (d) derived from the additional polymerizable compound is preferably 30 mol % or less, more preferably 20 mol % or less, and even more preferably 10 mol % or less.

An embodiment of the polymer having the structural unit represented by Formula (V) is exemplified by a polymer containing the structural unit (a) as an essential unit and at least one of the structural units (b) to (d). Furthermore, an aspect in which the total of the structural units (a) to (d) accounts for 95 mol % or more or even 98 mol % or more of all the structural units is exemplified.

Another embodiment of the polymer having the structural unit represented by Formula (V) is a polymer containing the structural unit (a) as an essential unit, in which a structural unit containing an aromatic ring accounts for preferably 90 mol % or more, and more preferably 95 mol % or more, or may account for 100 mol %, of all the structural units excluding the terminal.

In calculating the mol % relative to all the structural units, one structural unit is defined as a unit derived from one molecule of a monomer (for example, a divinyl aromatic compound, or a monovinyl aromatic compound) used for producing the polymer having the structural unit represented by Formula (V).

The method for producing the polymer having the structural unit represented by Formula (V) is not particularly limited, and the production may be performed according to a common method. Examples of the method include polymerizing a raw material containing a divinyl aromatic compound (in the coexistence of a monovinyl aromatic compound, a cycloolefin compound, or the like as necessary) in the presence of a Lewis acid catalyst. A metal fluoride such as boron trifluoride or its complex can be used as the Lewis acid catalyst.

The structure of the chain end of the polymer having the structural unit represented by Formula (V) is not particularly limited, but for the group derived from the divinyl aromatic compound, examples of the chain end structure include a structure of Formula (E1) below. In Formula (E1), $L^1$ is the same meaning as defined in Formula (V1) above, and * represents a bonding position.

$$*\text{—CH=CH-}L^1\text{-CH=CH}_2 \quad \text{(E1)}$$

When the group derived from the monovinyl aromatic compound is at a chain end, examples of the chain end structure include a structure of Formula (E2) below. In the formula, $L^2$ and $R^{V1}$ each have the same meaning as defined in Formula (V4) above, and * represents a bonding position.

$$*\text{—CH=CH-}L^2\text{-}R^{V1} \quad \text{(E2)}$$

The molecular weight of the polymer having the structural unit represented by Formula (V) in terms of number average molecular weight Mn is preferably 300 or more, more preferably 500 or more, still more preferably 1000 or more, and further preferably 1500 or more. The upper limit is preferably 130000 or less, more preferably 120000 or less, even more preferably 110000 or less, and still more preferably 100000 or less.

The molecular weight of the polymer having the structural unit represented by Formula (V) in terms of weight average molecular weight Mw is preferably 3000 or more, more preferably 5000 or more, and still more preferably 10000 or more. When the molecular weight is equal to or higher than the lower limit, a cured product of the resin composition can effectively exhibit the excellent low dielectric properties, particularly the Df and the dielectric properties after moisture absorption, which are originally possessed by the polymer having the structural unit represented by Formula (V). The upper limit is preferably 130000 or less, more preferably 100000 or less, still more preferably 80000 or less, and even more preferably 50000 or less. When the molecular weight is equal to or lower than the above upper limit, an embedding defect tends to hardly occur when the prepreg or the resin sheet is laminated on a circuit-forming substrate.

The monodispersity represented by the ratio of weight average molecular weight Mw to number average molecular weight Mn (Mw/Mn) is preferably 100 or less, more preferably 50 or less, and even more preferably 20 or less. The lower limit is practically 1.1 or more, preferably 5 or more, more preferably 7 or more, and still more preferably 10 or more.

The above-described Mw and Mn are measured according to the description of Examples below.

When the resin composition of the present embodiments contains two or more polymers having the structural unit represented by Formula (V), the Mw, Mn, and Mw/Mn of the mixture preferably satisfy the ranges described above.

The vinyl group equivalent of the polymer having the structural unit represented by Formula (V) is preferably 200 g/eq. or more, more preferably 230 g/eq. or more, and still more preferably 250 g/eq. or more. The vinyl group equivalent is preferably 1200 g/eq. or less, and more preferably 1000 g/eq. or less, and further may be 800 g/eq. or less, 600 g/eq. or less, 400 g/eq. or less, or 300 g/eq. or less. When the vinyl group equivalent is equal to or higher than the lower limit, the storage stability of the resin composition tends to be improved, and the fluidity of the resin composition tends to be improved. Therefore, there is a tendency that moldability is improved, voids are less likely to occur at the time of forming a prepreg, and a printed wiring board having higher reliability is obtained. Meanwhile, when the vinyl group equivalent is equal to or lower than the above upper limit, the thermal resistance of the resulting cured product tends to be improved.

For the polymer having the structural unit represented by Formula (V) in the present specification, reference can be made to compounds, their synthesis conditions, and the like described in paragraphs [0029] to [0058] of WO 2017/115813, compounds, their synthesis conditions, and the like described in paragraphs [0013] to [0058] of JP 2018-039995 A, compounds, their synthesis conditions, and the like described in paragraphs [0008] to [0043] of JP 2018-168347 A, compounds, their synthesis conditions, and the like described in paragraphs [0014] to [0042] of JP 2006-070136 A, compounds, their synthesis conditions, and the like described in paragraphs [0014] to [0061] of JP 2006-089683 A, and compounds, their synthesis conditions, and the like described in paragraphs [0008] to [0036] of JP 2008-248001 A, the contents of which are incorporated herein by reference.

The lower limit of the content of the polymer having the structural unit represented by Formula (V) is 10 parts by mass or more, more preferably 20 parts by mass or more, still more preferably 40 parts by mass or more, even more preferably 60 parts by mass or more, and further more preferably 80 parts by mass or more, relative to 100 parts by mass of the resin (A). Meanwhile, the upper limit of the content of the polymer having the structural unit represented by Formula (V) is 300 parts by mass or less, preferably 280 parts by mass or less, more preferably 260 parts by mass or less, still more preferably 240 parts by mass or less, and even more preferably 220 parts by mass or less, relative to 100 parts by mass of the resin (A). When the content falls within the above range, there is a tendency that the moldability of the resin composition, and the low dielectric properties (Dk and/or Df), thermal resistance, and chemical resistance of the resulting cured product are achieved in a well-balanced manner.

The lower limit of the content of the polymer having the structural unit represented by Formula (V) is more preferably 5 parts by mass or more, still more preferably 10 parts by mass or more, even more preferably 15 parts by mass or more, and further more preferably 20 parts by mass or more, when the resin solid content in the resin composition is defined as 100 parts by mass. Meanwhile, the upper limit of the content of the polymer having the structural unit represented by Formula (V) is preferably 60 parts by mass or less, more preferably 55 parts by mass or less, still more preferably 50 parts by mass or less, and even more preferably 45 parts by mass or less, when the resin solid content in the resin composition is defined as 100 parts by mass.

In the present embodiment, the mass proportion of the resin (A) relative to 100 parts by mass of the total amount of the resin (A) and the polymer having a structural unit represented by Formula (V) is preferably 10 parts by mass or more, more preferably 15 parts by mass or more, still more preferably 20 parts by mass or more, and even more preferably 25 parts by mass or more. When the mass proportion is equal to or higher than the above lower limit, the low dielectric properties (Dk and/or Df) tend to be further improved.

The mass proportion of the resin (A) relative to 100 parts by mass of the total amount of the resin (A) and the polymer having a structural unit represented by Formula (V) is preferably 70 parts by mass or less, and may be 65 parts by mass or less. When the mass proportion is equal to or lower than the above upper limit, the heat resistance tends to be further improved.

Only one type, or two or more types of the polymers having the structural unit represented by Formula (V) may be contained in the resin composition. When two or more types are contained, the total amount thereof preferably falls within the above range.

In the present embodiment, there is exemplified an aspect in which the total of the resin (A), the polyphenylene ether compound (B), and the polymer having a structural unit represented by Formula (V) accounts for 90 parts by mass or more of the resin composition in 100 parts by mass of the resin solid content.

Additional Compound (C)

The resin composition of the present embodiment preferably further contains an additional compound (C) (preferably an additional curable compound and/or plastic compound, more preferably an additional thermosetting compound and/or thermoplastic compound, still more preferably an additional thermosetting compound) other than the resin (A), the polyphenylene ether compound (B), and the polymer having a structural unit represented by Formula (V). The additional compound (C) preferably contains one or more selected from the group consisting of a maleimide compound, a cyanate ester compound, an epoxy compound, a phenol compound, a compound containing a (meth)allyl group (for example, an alkenyl nadiimide compound), an oxetane resin, a benzoxazine compound, an arylcyclobutene resin, a polyamide resin, a polyimide resin, a perfluorovinyl ether resin, a compound having a styrene group other than the polyphenylene ether compound (B) having an unsaturated carbon-carbon double bond at a terminal, a compound having an isopropenyl group other than the resin (A) having an indane skeleton, a polyfunctional (meth)acrylate compound other than the polyphenylene ether compound (B) having an unsaturated carbon-carbon double bond at a terminal, an elastomer, and a petroleum resin, and more preferably contains at least one or more selected from the group consisting of a maleimide compound, a cyanate ester compound, an epoxy compound, a phenol compound, a compound containing a (meth)allyl group (for example, an alkenyl nadiimide compound), an oxetane resin, and a benzoxazine compound. When such a component is contained, it is possible to more effectively achieve a desired performance required for a printed wiring board.

When the resin composition of the present embodiment contains the additional compound (C), the content (total content) thereof is preferably 1 part by mass or more, more preferably 10 parts by mass or more, still more preferably 15 parts by mass or more, even more preferably 20 parts by mass or more, and further more preferably 30 parts by mass or more, relative to 100 parts by mass of the resin solid content. When the content is equal to or higher than the above lower limit, thermal resistance, plating adhesion, and low thermal expansion tend to be further improved. The upper limit of the content of the additional compound (C) (preferably an additional curable compound and/or plastic compound, more preferably an additional thermosetting compound and/or thermoplastic compound, still more preferably an additional thermosetting compound) is preferably 50 parts by mass or less, more preferably 45 parts by mass or less, and still more preferably 40 parts by mass or less, relative to 100 parts by mass of the resin solid content. When the content is equal to or lower than the above upper limit, the low dielectric properties (Dk and/or Df) and the low water absorbability tend to be further improved.

The resin composition of the present embodiment may contain only one type, or two or more types of additional compounds (C). When two or more types are contained, the total amount thereof preferably falls within the above range.

Maleimide Compound

The resin composition of the present embodiment may contain a maleimide compound.

The maleimide compound is not particularly limited as long as it is a compound having one or more (preferably from 2 to 12, more preferably from 2 to 6, still more preferably from 2 to 4, even more preferably 2 or 3, and further more preferably) maleimide groups per molecule. The maleimide compound can be selected from a wide variety of compounds commonly used in the field of printed wiring boards.

In the present embodiment, the maleimide compound preferably contains one or more selected from the group consisting of a compound represented by Formula (M0), a compound represented by Formula (M1), a compound represented by Formula (M2), a compound represented by Formula (M3), a compound represented by Formula (M4), a compound represented by Formula (M5), a maleimide compound (M6), and a maleimide compound (M7); more preferably contains one or more selected from the group consisting of a compound represented by Formula (M0), a compound represented by Formula (M1), a compound represented by Formula (M3), a compound represented by Formula (M4), a compound represented by Formula (M5), and a maleimide compound (M6); still more preferably contains one or more selected from the group consisting of a compound represented by Formula (M1), a compound represented by Formula (M3), a compound represented by Formula (M4), and a compound represented by Formula (M5); even more preferably contains one or more selected from the group consisting of a compound represented by Formula (M1), a compound represented by Formula (M3), and a compound represented by Formula (M5); further more preferably contains a compound represented by Formula (M1) and/or a compound represented by Formula (M3); and still further more preferably is a compound represented by Formula (M1). When such a maleimide compound is used in a material for a printed wiring board (for example, a metal foil-clad laminate), the material can be provided with excellent thermal resistance.

(M0)

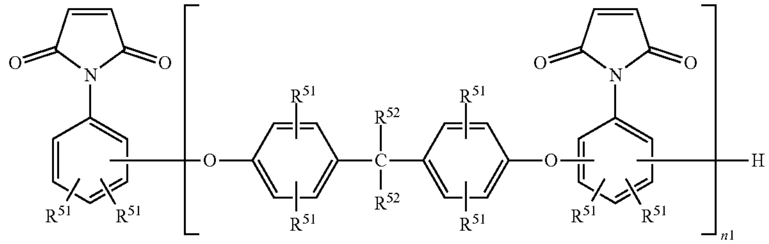

(In Formula (M0), $R^{51}$ each independently represents a hydrogen atom, an alkyl group having from 1 to 8 carbons, or a phenyl group; $R^{52}$ each independently represents a hydrogen atom or a methyl group; and $n_1$ represents an integer of 1 or more.)

$R^{51}$ is each independently preferably one selected from the group consisting of a hydrogen atom, a methyl group, an ethyl group, an n-propyl group, an isopropyl group, an n-butyl group, an isobutyl group, a t-butyl group, an n-pentyl group, and a phenyl group, more preferably a hydrogen atom and/or a methyl group, and still more preferably a hydrogen atom.

$R^{52}$ is preferably a methyl group.

$n_1$ is preferably an integer of from 1 to 10, more preferably an integer of from 1 to 5, still more preferably an integer of from 1 to 3, further preferably 1 or 2, and further still more preferably 1.

Specifically, the following compound is a preferred example of a compound represented by Formula (M0).

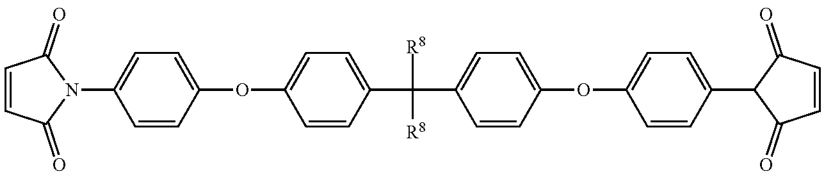

In the above formula, $R^8$ each independently represents a hydrogen atom, a methyl group, or an ethyl group, and a methyl group is preferred.

The compound represented by Formula (M0) may be one type, or a mixture of two or more types. Examples of such a mixture include a mixture of compounds having different $n_1$, a mixture of compounds having different types of substituents of $R^{51}$ and/or $R^{52}$, a mixture of compounds having different bonding positions (meta-position, para-position, ortho-position) of a maleimide group and an oxygen atom with respect to a benzene ring, and a mixture of compounds having a combination of two or more different points described above. The same shall apply to compounds represented by Formulae (M1) to (M6).

(M1)

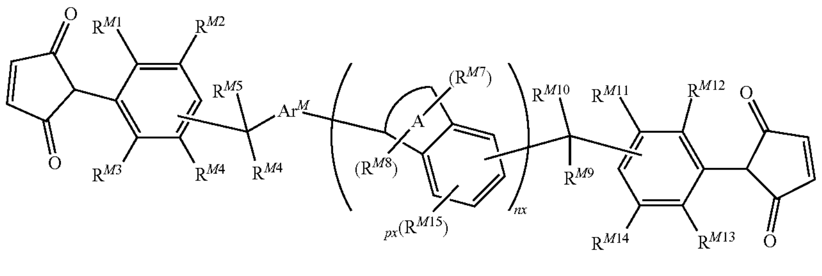

(In Formula (M1), $R^{M1}$, $R^{M2}$, $R^{M3}$, and $R^{M4}$ each independently represent a hydrogen atom or an organic group; $R^{M5}$ and $R^{M6}$ each independently represent a hydrogen atom or an alkyl group; $Ar^{M}$ represents a divalent aromatic group; A is a four- to six-membered alicyclic group; $R^{M7}$ and $R^{M8}$ are each independently an alkyl group; mx is 1 or 2; 1× is 0 or 1; $R^{M9}$ and $R^{M10}$ each independently represent a hydrogen atom or an alkyl group; $R^{M11}$, $R^{M12}$, $R^{M13}$, and $R^{M14}$ each independently represent a hydrogen atom or an organic group; $R^{M15}$ each independently represents an alkyl group having from 1 to 10 carbons, an alkyloxy group having from 1 to 10 carbons, an alkylthio group having from 1 to 10 carbons, a cycloalkyl group having from 3 to 10 carbons, an aryl group having from 6 to 10 carbons, an aryloxy group having from 6 to 10 carbons, an arylthio group having from 6 to 10 carbons, a halogen atom, a hydroxyl group, or a mercapto group; px represents an integer of from 0 to 3; and nx represents an integer of from 1 to 20.)

$R^{M1}$, $R^{M2}$, $R^{M3}$, and $R^{M4}$ in the formula each independently represent a hydrogen atom or an organic group. The organic group here is preferably an alkyl group, more preferably an alkyl group having from 1 to 12 carbons, even more preferably an alkyl group having from 1 to 6 carbons, still more preferably a methyl group, an ethyl group, a propyl group, or a butyl group, and particularly preferably a methyl group. $R^{M1}$ and $R^{M3}$ are each independently preferably an alkyl group, and $R^{M2}$ and $R^{M4}$ are preferably a hydrogen atom.

$R^{M5}$ and $R^{M6}$ each independently represent a hydrogen atom or an alkyl group, and are preferably an alkyl group. The alkyl group here is preferably an alkyl group having from 1 to 12 carbons, more preferably an alkyl group having from 1 to 6 carbons, even more preferably a methyl group, an ethyl group, a propyl group, or a butyl group, and particularly preferably a methyl group.

$Ar^{M}$ represents a divalent aromatic group and is preferably a phenylene group, a naphthalenediyl group, a phenanthrenediyl group, or an anthracenediyl group, more preferably a phenylene group, and even more preferably an m-phenylene group. $Ar^{M}$ may have a substituent, and the substituent is preferably an alkyl group, more preferably an alkyl group having from 1 to 12 carbons, even more preferably an alkyl group having from 1 to 6 carbons, still more preferably a methyl group, an ethyl group, a propyl group, or a butyl group, and particularly preferably a methyl group. However, $Ar^{M}$ is preferably unsubstituted.

A is a four- to six-membered alicyclic group and more preferably a five-membered alicyclic group (preferably a group to form an indane ring with a benzene ring). $R^{M7}$ and $R^{M8}$ are each independently an alkyl group, preferably an alkyl group having from 1 to 6 carbons, more preferably an alkyl group having from 1 to 3 carbons, and particularly preferably a methyl group.

mx is 1 or 2 and preferably 2.

lx is 0 or 1 and preferably 1.

$R^{M9}$ and $R^{M10}$ each independently represent a hydrogen atom or an alkyl group, and are more preferably an alkyl group. The alkyl group here is preferably an alkyl group having from 1 to 12 carbons, more preferably an alkyl group having from 1 to 6 carbons, even more preferably a methyl group, an ethyl group, a propyl group, or a butyl group, and particularly preferably a methyl group.

$R^{M11}$, $M^{12}$, $R^{M13}$, and $R^{M14}$ each independently represent a hydrogen atom or an organic group. The organic group here is preferably an alkyl group, more preferably an alkyl group having from 1 to 12 carbons, even more preferably an alkyl group having from 1 to 6 carbons, still more preferably a methyl group, an ethyl group, a propyl group, or a butyl group, and particularly preferably a methyl group. $R^{M12}$ and $R^{M13}$ are each independently preferably an alkyl group, and $R^{M11}$ and $R^{M14}$ are preferably a hydrogen atom.

$R^{M15}$ each independently represents an alkyl group having from 1 to 10 carbons, an alkyloxy group having from 1 to 10 carbons, an alkylthio group having from 1 to 10 carbons, a cycloalkyl group having from 3 to 10 carbons, an aryl group having from 6 to 10 carbons, an aryloxy group having from 6 to 10 carbons, an arylthio group having from 6 to 10 carbons, a halogen atom, a hydroxyl group, or a mercapto group, and is preferably an alkyl group having from 1 to 4 carbons, a cycloalkyl group having from 3 to 6 carbons, or an aryl group having from 6 to 10 carbons.

px represents an integer of from 0 to 3, and is preferably an integer of from 0 to 2, more preferably 0 or 1, and even more preferably 0.

nx represents an integer of from 1 to 20. nx may be an integer of 10 or less.

The resin composition of the present embodiment may contain only one type or two or more types of compounds represented by Formula (M1) having different values of at least nx.

When the resin composition contains two or more types of compounds, the average value (average repeating unit number) n of nx in the compound represented by Formula (M1) in the resin composition is preferably 0.92 or more, more preferably 0.95 or more, still more preferably 1.0 or more, and further preferably 1.1 or more in order to lower the melting point (softening point), reduce the melt viscosity, and provide excellent handling properties. Also, n is preferably 10.0 or less, more preferably 8.0 or less, even more preferably 7.0 or less, and still more preferably 6.0 or less, and may be 5.0 or less. The same shall apply to compounds represented by Formula (M1-2) and Formula (M1-3) described below.

The compound represented by Formula (M1) is preferably a compound represented by Formula (M1-1) below.

(M1-1)

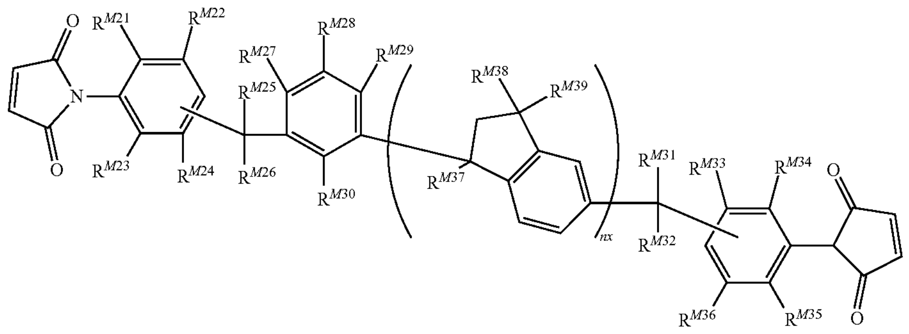

(In Formula (M1-1), $R^{M21}$, $R^{M22}$, $R^{M23}$, and $R^{M24}$ each independently represent a hydrogen atom or an organic group; $R^{M25}$nd $R^{M26}$ each independently represent a hydrogen atom or an alkyl group; $R^{M27}$, $R^{M28}$, $R^{M29}$, and $R^{M30}$ each independently represent a hydrogen atom or an organic group; $R^{M31}$ and $R^{M32}$ each independently represent a hydrogen atom or an alkyl group; $R^{M33}$, $R^{M34}$, $R^{M35}$, and $R^{M36}$ each independently represent a hydrogen atom or an organic group; $R^{M37}$, $R^{M38}$, and $R^{M39}$ each independently represent a hydrogen atom or an alkyl group; and nx represents an integer of 1 or more and 20 or less.)

$R^{M21}$, $R^{M22}$, $R^{M23}$, and $R^{M24}$ in the formula each independently represent a hydrogen atom or an organic group. The organic group here is preferably an alkyl group, more preferably an alkyl group having from 1 to 12 carbons, even more preferably an alkyl group having from 1 to 6 carbons, still more preferably a methyl group, an ethyl group, a propyl group, or a butyl group, and particularly preferably a methyl group. $R^{M21}$ and $R^{M23}$ are preferably an alkyl group, and $R^{M22}$ and $R^{M24}$ are preferably a hydrogen atom.

$R^{M25}$ and $R^{M26}$ each independently represent a hydrogen atom or an alkyl group, and are preferably an alkyl group. The alkyl group here is preferably an alkyl group having from 1 to 12 carbons, more preferably an alkyl group having from 1 to 6 carbons, even more preferably a methyl group, an ethyl group, a propyl group, or a butyl group, and particularly preferably a methyl group.

$R^{M27}$, $R^{M28}$, $R^{M29}$, and $R^{M30}$ each independently represent a hydrogen atom or an organic group and are preferably hydrogen atoms. The organic group here is preferably an alkyl group, more preferably an alkyl group having from 1 to 12 carbons, even more preferably an alkyl group having from 1 to 6 carbons, still more preferably a methyl group, an ethyl group, a propyl group, or a butyl group, and particularly preferably a methyl group.

$R^{M31}$ and $R^{M32}$ each independently represent a hydrogen atom or an alkyl group, and are preferably an alkyl group. The alkyl group here is preferably an alkyl group having from 1 to 12 carbons, more preferably an alkyl group having from 1 to 6 carbons, even more preferably a methyl group, an ethyl group, a propyl group, or a butyl group, and particularly preferably a methyl group.

$R^{M33}$, $R^{M34}$, $R^{M35}$, and $R^{M36}$ each independently represent a hydrogen atom or an organic group. The organic group here is preferably an alkyl group, more preferably an alkyl group having from 1 to 12 carbons, even more preferably an alkyl group having from 1 to 6 carbons, still more preferably a methyl group, an ethyl group, a propyl group, or a butyl group, and particularly preferably a methyl group.

$R^{M33}$ and $R^{M36}$ are preferably a hydrogen atom, and $R^{M34}$ and $R^{M35}$ are preferably an alkyl group.

$R^{M37}$, $R^{M38}$, and $R^{M39}$ each independently represent a hydrogen atom or an alkyl group, and are preferably an alkyl group. The alkyl group here is preferably an alkyl group having from 1 to 12 carbons, more preferably an alkyl group having from 1 to 6 carbons, even more preferably a methyl group, an ethyl group, a propyl group, or a butyl group, and particularly preferably a methyl group.

nx represents an integer of 1 or more and 20 or less. nx may be an integer of 10 or less.

The compound represented by Formula (M1-1) is preferably a compound represented by Formula (M1-2) below.

(M1-2)

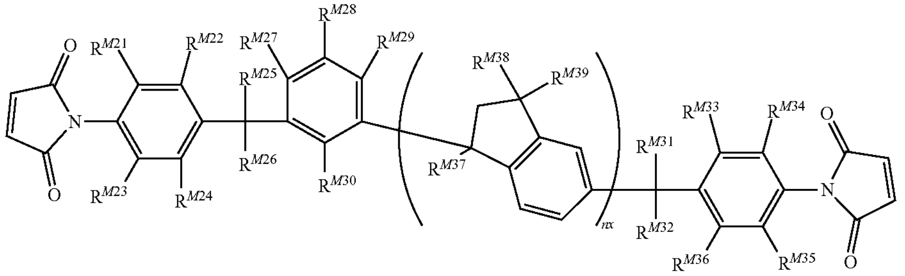

(In Formula (M1-2), $R^{M21}$, $R^{M22}$, $R^{M23}$, and $R^{M24}$ each independently represent a hydrogen atom or an organic group; $R^{M25}$ and $R^{M26}$ each independently represent a hydrogen atom or an alkyl group; $R^{M27}$, $R^{M28}$, $R^{M29}$, and $R^{M30}$ each independently represent a hydrogen atom or an organic group; $R^{M31}$ and $R^{M32}$ each independently represent a hydrogen atom or an alkyl group; $R^{M33}$, $R^{M34}$, $R^{M35}$, and $R^{M36}$ each independently represent a hydrogen atom or an organic group; $R^{M37}$, $R^{M38}$, and $R^{M39}$ each independently represent a hydrogen atom or an alkyl group; and nx represents an integer of 1 or more and 20 or less.)

In Formula (M1-2), $R^{M21}$, $R^{M22}$, $R^{M23}$, $R^{M24}$, $R^{M25}$, $R^{M26}$, $R^{M27}$, $R^{M28}$, $R^{M29}$, $R^{M30}$, $R^{M31}$, $R^{M32}$, $R^{M33}$, $R^{M34}$, $R^{M35}$, $R^{M36}$, $R^{M37}$, $R^{M38}$, $R^{M39}$, and nx have the same meanings as $R^{21}$, $R^{M22}$, $R^{M23}$, $R^{M24}$, $R^{M25}$, $R^{M26}$, $R^{M27}$, $R^{M28}$, $R^{M29}$, $R^{M30}$, $R^{M31}$, $R^{M32}$, $R^{M33}$, $R^{M34}$, $R^{M35}$, $R^{M36}$, $R^{M37}$, $R^{M38}$, $R^{M39}$, and nx in Formula (M1-1), respectively, and preferred ranges thereof are also the same.

The compound represented by Formula (M1-1) is preferably a compound represented by Formula (M1-3) below, and more preferably a compound represented by Formula (M1-4) below.

(M1-3)

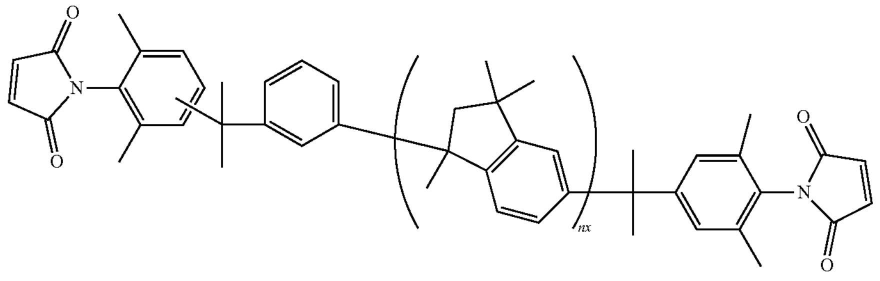

(In Formula (M1-3), nx represents an integer of 1 or more and 20 or less.) nx may be an integer of 10 or less.

(M1-4)

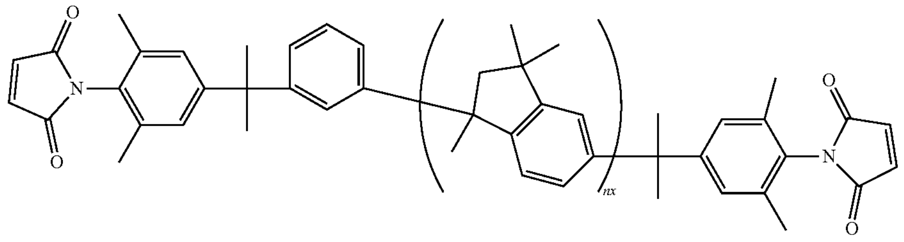

(In Formula (M1-4), nx represents an integer of 1 or more and 20 or less.)

nx may be an integer of 10 or less.

The molecular weight of the compound represented by Formula (M1) is preferably 500 or more, more preferably 600 or more, and still more preferably 700 or more. When the molecular weight is equal to or higher than the above lower limit, the low dielectric properties (Dk and/or Df) and the low water absorbability of the resulting cured product tend to be further improved. The molecular weight of the compound represented by Formula (M1) is preferably 10000 or less, more preferably 9000 or less, still more preferably 7000 or less, further preferably 5000 or less, and further still more preferably 4000 or less. When the molecular weight is equal to or lower than the above upper limit, the thermal resistance and handling properties of the resulting cured product tend to be further improved.

The compound represented by Formula (M1) has a maleimide group equivalent of preferably 50 g/eq. or more, more preferably 100 g/eq. or more, and still more preferably 200 g/eq. or more. The upper limit of the maleimide equivalent is preferably 2000 g/eq. or less, more preferably 1000 g/eq. or less, and still more preferably 800 g/eq. or less. Here, the maleimide group equivalent represents the mass of the maleimide compound per equivalent of the maleimide group. When the maleimide group equivalent of the compound represented by Formula (M1) falls within the above range, the low dielectric properties (Dk and/or Df), low water absorbability, thermal resistance, and handleability of the resulting cured product tend to be further improved.

The compound represented by Formula (M1) has a molecular weight distribution Mw/Mn as calculated by gel permeation chromatography (GPC) measurement of preferably 1.0 to 4.0, more preferably 1.1 to 3.8, still more preferably 1.2 to 3.6, and even more preferably 1.3 to 3.4. When the Mw/Mn of the compound represented by Formula (M1) falls within the above range, the low dielectric properties (Dk and/or Df), low water absorbability, thermal resistance, and handleability of the resulting cured product tend to be further improved.

In addition, for details of the compound represented by Formula (M1), reference can be made to the description of WO 2020-217679, the content of which is incorporated herein by reference.

(M2)

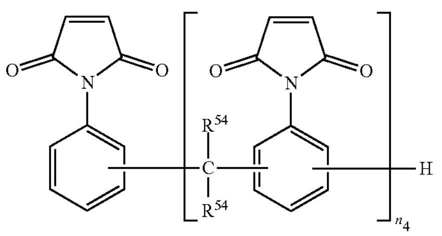

(In Formula (M2), $R^{54}$ each independently represents a hydrogen atom or a methyl group; and $n_4$ represents an integer of 1 or more.)

$n_4$ is preferably an integer of from 1 to 10, more preferably an integer of from 1 to 5, still more preferably an integer of from 1 to 3, further preferably 1 or 2, and may be 1.

The compound represented by Formula (M2) may be a mixture of compounds differing in $n_4$, and is preferably the mixture. It may be a mixture of compounds differing in other portions as described for the compound represented by Formula (M0).

(In Formula (M4), $R^{56}$ each independently represents a hydrogen atom, a methyl group, or an ethyl group, and $R^{57}$ each independently represents a hydrogen atom or a methyl group.)

$R^{56}$ is each independently preferably a methyl group or an ethyl group, more preferably a methyl group or an ethyl group in each of the two benzene rings, and $R^{57}$ is preferably a methyl group.

(M5)

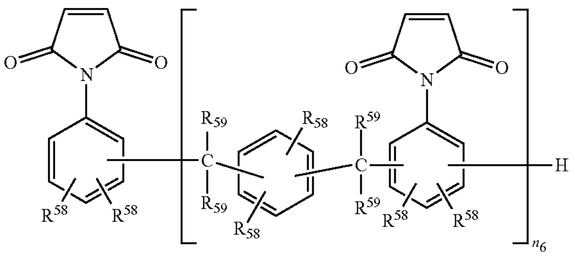

(M3)

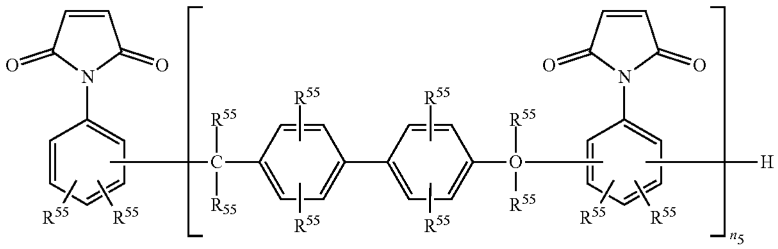

(In Formula (M3), $R^{55}$ each independently represents a hydrogen atom, an alkyl group having from 1 to 8 carbons, or a phenyl group; and $n_5$ represents an integer of 1 or more and 10 or less.)

$R^{55}$ is each independently preferably one selected from the group consisting of a hydrogen atom, a methyl group, an ethyl group, an n-propyl group, an isopropyl group, an n-butyl group, an isobutyl group, a t-butyl group, an n-pentyl group, or a phenyl group, more preferably a hydrogen atom and/or a methyl group, and still more preferably a hydrogen atom.

$n_5$ is preferably an integer from 1 to 5, more preferably an integer from 1 to 3, and even more preferably 1 or 2.

The compound represented by Formula (M3) may be a mixture of compounds differing in $n_5$, and is preferably the mixture. It may be a mixture of compounds differing in other portions as described for the compound represented by Formula (M0).

(M4)

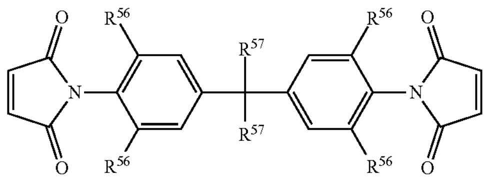

(In Formula (M5), $R^{58}$ each independently represents a hydrogen atom, an alkyl group having from 1 to 8 carbons, or a phenyl group; $R^{59}$ each independently represents a hydrogen atom or a methyl group; and $n_6$ represents an integer of 1 or more.) $R^{58}$ is each independently preferably one selected from the group consisting of a hydrogen atom, a methyl group, an ethyl group, an n-propyl group, an isopropyl group, an n-butyl group, an isobutyl group, a t-butyl group, an n-pentyl group, and a phenyl group, more preferably a hydrogen atom and/or a methyl group, and still more preferably a hydrogen atom.

$R^{59}$ is preferably a methyl group.

$n_6$ is preferably an integer of from 1 to 10, more preferably an integer of from 1 to 5, even more preferably an integer of from 1 to 3, and still more preferably 1 or 2, and may be 1.

The compound represented by Formula (M5) may be a mixture of compounds differing in $n_6$, and is preferably the mixture. It may be a mixture of compounds differing in other portions as described for the compound represented by Formula (M0).

The maleimide compound (M6) is a compound having a structural unit represented by Formula (M6) and maleimide groups at both terminals of the molecular chain.

(M6)

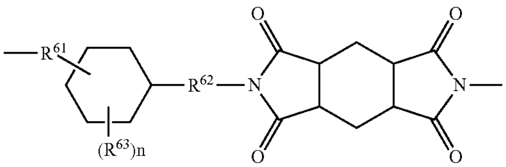

(In Formula (M6), $R^{61}$ represents a linear or branched alkylene group having from 1 to 16 carbons, or a linear or branched alkenylene group having from 2 to 16 carbons; $R^{62}$ represents a linear or branched alkylene group having from 1 to 16 carbons, or a linear or branched alkenylene group having from 2 to 16 carbons; $R^{63}$ each independently represents a linear or branched alkyl group having from 1 to 16 carbons or a linear or branched alkenyl group having from 2 to 16 carbons; and n each independently represents an integer of 0 to 10.) For details of the maleimide compound (M6) and a method for producing the maleimide compound, reference can be made to the description in paragraphs [0061] to [0066] of WO 2020/262577, the content of which is incorporated herein by reference.

The maleimide compound (M7) is a maleimide compound formed from reaction raw materials (1); i.e., an aromatic amine compound (a1) having one or more and three or less alkyl groups in an aromatic ring, an aromatic divinyl compound (a2) having two ethenyl groups, and maleic anhydride.

The maleimide compound (M7) is preferably a compound represented by Formula (M7).

(M7)

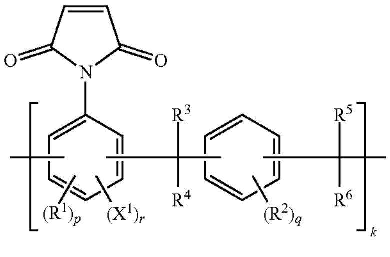

(In Formula (M7) above, $R^1$ each independently represents the aforementioned alkyl group, $R^2$ each independently represents an alkyl, alkoxy, or alkylthio group having from 1 to 10 carbons; an aryl, aryloxy, or arylthio group having from 6 to 10 carbons; a cycloalkyl group having from 3 to 10 carbons; a halogen atom; a hydroxyl group; or a mercapto group;

$R^3$, $R^4$, $R^5$ and $R^6$ each independently represent a hydrogen atom or a methyl group, one of $R^3$ and $R^4$ is a hydrogen atom, the other is a methyl group, one of $R^5$ and $R^6$ is a hydrogen atom, the other is a methyl group, $X^1$ represents a substituent represented by Formula (x) below:

(x)

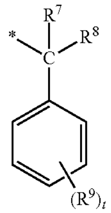

(in Formula (x), $R^7$ and $R^8$ each independently represent a hydrogen atom or a methyl group, one of $R^7$ and $R^8$ is a hydrogen atom, the other is a methyl group, $R^9$ each independently represents an alkyl, alkoxy, or alkylthio group having from 1 to 10 carbons; an aryl, aryloxy, or arylthio group having from 6 to 10 carbons; a cycloalkyl group having from 3 to 10 carbons; a halogen atom; a hydroxyl group; or a mercapto group, and t represents an integer of 0 to 4); r represents an average value of the number of substituents of $X^1$ per one benzene ring to which $X^1$ is bonded and a number of 0 to 4, p represents an integer of 1 to 3, q represents an integer of 0 to 4, and k represents an integer of 1 to 100.)

For details of the polymaleimide compound (M7) used in the present embodiment, reference can be made to the description of JP 7160151 B, the content of which is incorporated herein by reference.

The maleimide compound may be produced by a known method, or may be a commercially available product. For the commercially available product, examples of the compound represented by Formula (M0) include "BMI-80" available from K-I Chemical Industry Co., Ltd., examples of the compound represented by Formula (M1) include "NE-X-9470S" available from DIC Corporation, examples of the compound represented by Formula (M2) include "BMI-2300" available from Daiwa Kasei Industry Co., Ltd., examples of the compound represented by Formula (M3) include "MIR-3000-70MT" available from Nippon Kayaku Co., Ltd., examples of the compound represented by Formula (M4) include "BMI-70" available from K-I Chemical Industry Co., Ltd., examples of the compound represented by Formula (M5) include "MIR-5000" available from Nippon Kayaku Co., Ltd., examples of the maleimide compound (M6) include "MIZ-001" available from Nippon Kayaku Co., Ltd., and examples of the maleimide compound (M7) include "NE-X-9500" available from DIC Corporation.

Examples of the maleimide compound other than those described above include oligomers of N-phenylmaleimide, N-cyclohexylmaleimide, or phenylmethane maleimide, m-phenylene bismaleimide, 4-methyl-1,3-phenylene bismaleimide, 1,6-bismaleimide-(2,2,4-trimethyl)hexane, 4,4'-diphenylether bismaleimide, 4,4'-diphenylsulfone bismaleimide, 1,3-bis(3-maleimidophenoxy)benzene, 1,3-bis(4-maleimidophenoxy)benzene, and prepolymers of these, and prepolymers of such a maleimide and an amine.

In particular, a monofunctional maleimide compound such as N-phenylmaleimide or N-cyclohexylmaleimide tends to yield a resin composition capable of providing a cured product having more excellent low dielectric properties in combination with a polymer having a structural unit represented by Formula (V) below.

When the resin composition of the present embodiment contains a maleimide compound, the lower limit of the content of the maleimide compound is preferably 1 part by mass or more, more preferably 5 parts by mass or more, even more preferably 10 parts by mass or more, still more preferably 20 parts by mass or more, and yet still more preferably 25 parts by mass or more, relative to 100 parts by mass of the resin solid content in the resin composition. When the content of the maleimide compound is 1 part by mass or more, the low dielectric properties and flame resistance of the resulting cured product tend to be improved. The upper limit of the content of the maleimide compound is preferably 70 parts by mass or less, and more preferably 50 parts by mass or less, and may be 40 parts by mass or less, relative to 100 parts by mass of the resin solid content in the resin composition. When the content of the maleimide compound is 70 parts by mass or less, the metal foil peel strength and the low water absorbability tend to be improved.

The resin composition of the present embodiment may contain only one type or two or more types of maleimide compounds. When two or more types of maleimide compounds are contained, the total amount thereof preferably falls within the above range.

The resin composition of the present embodiments may contain substantially no maleimide compound. The phrase "contain substantially no maleimide compound" means that the content of the maleimide compound is less than 1 part by mass relative to 100 parts by mass of the resin solid content in the resin composition, and the content is preferably less than 0.1 parts by mass, and more preferably less than 0.01 parts by mass.

Cyanate Ester Compound

The resin composition of the present embodiments may contain a cyanate ester compound.

The cyanate ester compound is not particularly limited as long as the compound contains one or more (preferably 2 to 12, more preferably 2 to 6, still more preferably 2 to 4, even more preferably 2 or 3, and further more preferably 2) cyanate groups (cyanato groups) per molecule, and can be selected from a wide variety of compounds commonly used in the field of printed wiring boards.

The cyanate ester compound is preferably a cyanate ester compound that is commonly used in a printed wiring board and contains two or more aromatic moieties per molecule, each of the aromatic moieties being substituted with at least one cyanato group.

Specifically, the lower limit of the number of cyanato groups contained in the cyanate ester compound is preferably 2 or more and more preferably 3 or more. When the number of cyanato groups is equal to or more than the above lower limit, the thermal resistance tends to be further improved. The upper limit of the number of cyanato groups is preferably 100 or less, and more preferably 50 or less.

Preferably, a cured product of the cyanate ester compound has excellent low dielectric properties (Dk and/or Df). For example, the cured product of the cyanate ester compound has a dielectric constant (Dk) at a frequency of 10 GHz as measured according to a cavity resonator perturbation method of preferably 4.0 or less and more preferably of 3.5 or less. The lower limit of the dielectric constant is, for example, practically 2.0 or higher. The cured product of the cyanate ester compound (B) has a dielectric loss tangent (Df) at a frequency of 10 GHz as measured according to a cavity resonator perturbation method of preferably 0.02 or less and more preferably of 0.015 or less. The lower limit of the dielectric loss tangent is, for example, practically 0.0001 or higher. The dielectric constant and the dielectric loss tangent can be measured according to, for example, the method described in Examples (curing conditions, measurement conditions).

Preferably, the cured product of the cyanate ester compound has high thermal resistance. The cured product of the cyanate ester compound has a glass transition temperature as measured according to the JIS C 6481 dynamic viscoelasticity measurement of preferably 150 °C or higher, more preferably 180 °C or higher, and still more preferably 200 °C or higher. When the glass transition temperature is equal to or higher than the above lower limit, a cured product having excellent thermal resistance is obtained.

The cyanate ester compound has a weight average molecular weight in terms of polystyrene measured by the GPC method of preferably 200 or more, more preferably 300 or more, and still more preferably 400 or more. When the weight average molecular weight is equal to or higher than the above lower limit, the thermal resistance tends to be further improved. The weight average molecular weight of the cyanate ester compound is preferably 1000 or less, more preferably 900 or less, and still more preferably 800 or less. When the weight average molecular weight is equal to or lower than the above upper limit, the moldability and the handling properties tend to be further improved.

For preferred cyanate ester compounds, reference can be made to paragraphs [0028] to [0033] of WO 2021/172317, the content of which is incorporated herein by reference.

Preferred examples of the cyanate ester compound include at least one selected from the group consisting of phenol novolac-type cyanate ester compounds, naphthol aralkyl-type cyanate ester compounds (naphthol aralkyl-type cyanates), naphthylene ether-type cyanate ester compounds, biphenyl aralkyl-type cyanate ester compounds, xylene resin-type cyanate ester compounds, trisphenol methane-type cyanate ester compounds, adamantane skeleton-type cyanate ester compounds, bisphenol M-type cyanate ester compounds, and bisphenol A-type cyanate ester compounds. Among them, from the viewpoint of further improving the low water absorbability, the cyanate ester compound is preferably at least one selected from the group consisting of phenol novolac-type cyanate ester compounds, naphthol aralkyl-type cyanate ester compounds, naphthylene ether-type cyanate ester compounds, xylene resin-type cyanate ester compounds, bisphenol M-type cyanate ester compounds, and bisphenol A-type cyanate ester compounds, more preferably at least one selected from the group consisting of phenol novolac-type cyanate ester compounds, naphthol aralkyl-type cyanate ester compounds, naphthylene ether-type cyanate ester compounds, bisphenol A-type cyanate ester compounds, and bisphenol M-type cyanate ester compounds, still more preferably at least one selected from the group consisting of phenol novolac-type cyanate ester compounds, naphthol aralkyl-type cyanate ester compounds, and bisphenol A-type cyanate ester compounds, even more preferably a naphthol aralkyl-type cyanate ester compound and/or a bisphenol A-type cyanate ester compound, and further more preferably a naphthol aralkyl-type cyanate ester compound.

The naphthol aralkyl-type cyanate ester compound is more preferably a compound represented by Formula (N1).

Formula (N1)

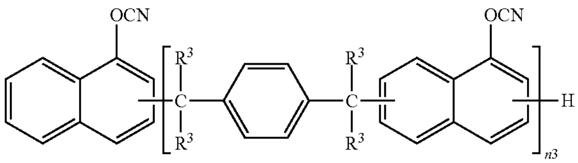

(In Formula (N1), $R^3$ each independently represents a hydrogen atom or a methyl group, and $n_3$ represents an integer of 1 or more.)

In Formula (N1), $R^3$ each independently represents a hydrogen atom or a methyl group, and is preferably a hydrogen atom among these.

In Formula (N1), $n_3$ is an integer of 1 or more, preferably an integer of 1 to 50, more preferably an integer of 1 to 20, still more preferably an integer of 1 to 10, and even more preferably an integer of 1 to 6.

The phenol novolac-type cyanate ester compound is not particularly limited, and, for example, is preferably a compound represented by Formula (VII).

(VII)

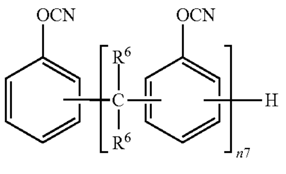

(In Formula (VII), $R^6$ each independently represents a hydrogen atom or a methyl group; and $n_7$ represents an integer of 1 or more.)

In Formula (VII), $R^6$ each independently represents a hydrogen atom or a methyl group, and is preferably a hydrogen atom among these.

In Formula (VII), $n_7$ is an integer of 1 or more, and preferably an integer of from 1 to 20, more preferably an integer of from 1 to 10, and even more preferably an integer of from 1 to 6.

The bisphenol A-type cyanate ester compound used may be one or more selected from the group consisting of 2,2-bis(4-cyanatophenyl)propane and a prepolymer of 2,2-bis(4-cyanatophenyl)propane.

Such a cyanate ester compound may be prepared by a known method, or a commercially available product may be used. A cyanate ester compound having a naphthol aralkyl skeleton, a naphthylene ether skeleton, a xylene skeleton, a trisphenol methane skeleton, or an adamantane skeleton has a relatively large functional group equivalents and a small number of unreacted cyanate ester groups, and thus the resin composition formed using such a cyanate ester compound tends to have even better low water absorbability. In addition, the plating adhesion tends to be further improved mainly due to having an aromatic skeleton or an adamantane skeleton.

When the resin composition of the present embodiment contains a cyanate ester compound, the lower limit of the content of the cyanate ester compound is preferably 1 part by mass or more, more preferably 5 parts by mass or more, and still more preferably 10 parts by mass or more, and may be 20 parts by mass or more, relative to 100 parts by mass of the resin solid content in the resin composition. When the content of the cyanate ester compound is equal to or higher than the above lower limit, the thermal resistance, the combustion resistance, the chemical resistance, the low dielectric constant, the low dielectric loss tangent, and the insulation tend to be improved. When the resin composition of the present embodiment contains the cyanate ester compound, the upper limit of the content of the cyanate ester compound is preferably 70 parts by mass or less, more preferably 60 parts by mass or less, and still more preferably 50 parts by mass or less, and may be 40 parts by mass or less or 30 parts by mass or less, relative to 100 parts by mass of the resin solid content in the resin composition.

The resin composition of the present embodiments may contain only one type of cyanate ester compound or may contain two or more types of cyanate ester compounds. When two or more types of cyanate ester compounds are contained, the total amount thereof preferably falls within the above range.

The resin composition of the present embodiments may contain substantially no cyanate ester compound. The phrase "contain substantially no" means that the content of the cyanate ester compound is less than 1 part by mass relative to 100 parts by mass of the resin solid content in the resin composition, and the content is preferably less than 0.1 parts by mass, and more preferably less than 0.01 parts by mass.

Epoxy Compound

The resin composition of the present embodiment may contain an epoxy compound.

The epoxy compound is not particularly limited as long as it is a compound or resin having one or more (preferably from 2 to 12, more preferably from 2 to 6, even more preferably from 2 to 4, still more preferably 2 or 3, and yet more preferably 2) epoxy groups per molecule, and can be selected from a wide variety of compounds commonly used in the field of printed wiring boards.

Examples of the epoxy compound include bisphenol A-type epoxy resins, bisphenol E-type epoxy resins, bisphenol F-type epoxy resins, bisphenol S-type epoxy resins, phenol novolac-type epoxy resins, bisphenol A novolac-type epoxy resins, glycidyl ester-type epoxy resins, aralkyl novolac-type epoxy resins, biphenyl aralkyl-type epoxy resins, naphthylene ether-type epoxy resins, cresol novolac-type epoxy resins, multifunctional phenol-type epoxy resins, naphthalene-type epoxy resins, anthracene-type epoxy resins, naphthalene skeleton-modified novolac-type epoxy resins, phenol aralkyl-type epoxy resins, naphthol aralkyl-type epoxy resins, dicyclopentadiene-type epoxy resins, biphenyl-type epoxy resins, alicyclic epoxy resins, polyol-type epoxy resins, phosphorus-containing epoxy resins, glycidyl amine, glycidyl ester, compounds obtained by epoxidation of a double bond of butadiene, and compounds obtained by reaction of a hydroxyl group-containing silicone resin with epichlorohydrin. The use of such a compound improves the moldability and adhesion of the resin composition. Among these, the epoxy compound is preferably a biphenyl aralkyl-type epoxy resin, a naphthylene ether-type epoxy resin, a multifunctional phenol-type epoxy resin, or a naphthalene-type epoxy resin, and more preferably a biphenyl aralkyl-type epoxy resin, from the viewpoint of further improving the flame resistance and thermal resistance.

The resin composition of the present embodiment preferably contains the epoxy compound to such an extent that the effects of the present invention are not impaired. When the resin composition of the present embodiment contains the epoxy compound, the content of the epoxy compound is preferably 0.1 parts by mass or more, more preferably 1 part by mass or more, and still more preferably 2 parts by mass or more, relative to 100 parts by mass of the resin solid content in the resin composition, from the viewpoint of the moldability and the adhesion. When the content of the epoxy compound is 0.1 parts by mass or more, the metal foil peel strength and toughness tend to be improved. When the resin composition of the present embodiment contains the epoxy compound, the upper limit of the content of the epoxy compound is preferably 50 parts by mass or less, more preferably 30 parts by mass or less, still more preferably 20 parts by mass or less, and even more preferably 10 parts by mass or less, and may be 8 parts by mass or less or 5 parts by mass or less, relative to 100 parts by mass of the resin solid content in the resin composition. When the content of the epoxy compound is 50 parts by mass or less, the electrical properties of the resulting cured product tend to be improved.

The resin composition of the present embodiments may contain only one type of epoxy compound or may contain two or more types of epoxy compounds. When two or more types of epoxy compounds are contained, the total amount thereof preferably falls within the above range.

In addition, the resin composition of the present embodiment may contain substantially no epoxy compound. The phrase "contain substantially no" means that the content of the epoxy compound is less than 0.1 parts by mass relative to 100 parts by mass of the resin solid content in the resin composition, and the content is preferably less than 0.01 parts by mass and may be less than 0.001 parts by mass.

Phenol Compound

The resin composition of the present embodiment may contain a phenol compound.

For details of the phenol resin, reference can be made to the description in paragraph [0049] of WO 2021/172317, the content of which is incorporated herein by reference.

The resin composition of the present embodiment preferably contains the phenol compound to such an extent that the effects of the present invention are not impaired. When the resin composition of the present embodiment contains the phenol compound, the content of the phenol compound is preferably 0.1 parts by mass or more and preferably 50 parts by mass or less relative to 100 parts by mass of the resin solid content in the resin composition.

The resin composition of the present embodiment may contain only one phenol compound or may contain two or more phenol compounds. When two or more types of phenol compounds are contained, the total amount thereof preferably falls within the above range.

In addition, the resin composition of the present embodiment may contain substantially no phenol compound. The phrase "contain substantially no" means that the content of the phenol compound is less than 0.1 parts by mass relative to 100 parts by mass of the resin solid content in the resin composition.

Compound Containing (Meth)allyl Group

The resin composition of the present embodiment preferably contains a compound containing a (meth)allyl group, and more preferably contains a compound containing an allyl group.

The compound containing a (meth)allyl group is preferably a compound containing two or more (meth)allyl groups, and more preferably a compound containing two or more allyl groups.

The compound containing a (meth)allyl group preferably contains at least one selected from the group consisting of a (meth)allyl isocyanurate compound, a tri(meth)allyl cyanurate compound, a (meth)allyl group-substituted nadiimide compound, a (meth)allyl compound having a glycoluril structure, and diallyl phthalate, more preferably contains at least one selected from the group consisting of a (meth)allyl isocyanurate compound, a (meth)allyl group-substituted nadiimide compound, and a (meth)allyl compound having a glycoluril structure, still more preferably contains a (meth) allyl isocyanurate compound and/or a (meth)allyl group-substituted nadiimide compound, and even more preferably contains a (meth)allyl group-substituted nadiimide compound.

Examples of the tri(meth)allyl cyanurate compound include a tri(meth)allyl cyanurate compound (for example, triallyl cyanurate having the following structure).

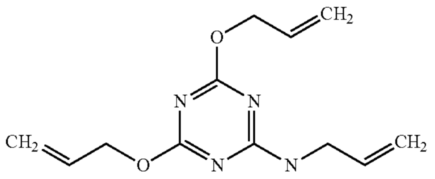 [SMILES: C=CCNc1nc(OCC=C)nc(OCC=C)n1]

Examples of the compound containing a (meth)allyl group include a resin having an allyl group described in WO 2022/210095 (for example, compounds described in Synthesis Examples 3, 4, 6, 20, and 22 of the same publication), the content of which is incorporated herein by reference.

When the resin composition of the present embodiment contains a compound containing a (meth)allyl group, the molecular weight thereof is preferably 195 or more, more preferably 300 or more, still more preferably 400 or more, and even more preferably 500 or more. When the molecular weight is equal to or higher than the above lower limit, the low dielectric properties and the thermal resistance tend to be further improved. The molecular weight of the compound containing a (meth)allyl group is preferably 3000 or less, more preferably 2000 or less, still more preferably 1000 or less, and even more preferably 800 or less. When the molecular weight is equal to or lower than the above upper limit, the low thermal expansion tends to be further improved.

When the resin composition of the present embodiment contains a compound containing a (meth)allyl group, the content of the compound is preferably 1 part by mass or more, more preferably 3 parts by mass or more, still more preferably 5 parts by mass or more, and may be 10 parts by mass or more, relative to 100 parts by mass of the resin solid content in the resin composition. When the content of the compound containing a (meth)allyl group is equal to or higher than the above lower limit, the moldability tends to be excellent, and the thermal resistance tends to be further improved. The upper limit of the content of the compound containing a (meth)allyl group is preferably 40 parts by mass or less, more preferably 30 parts by mass or less, and still more preferably 20 parts by mass or less, relative to 100 parts by mass of the resin solid content in the resin composition. When the content of the compound containing a (meth)allyl group is equal to or lower than the above upper limit, the low thermal expansion tends to be further improved.

The resin composition of the present embodiment may contain only one compound containing a (meth)allyl group, or may contain two or more compounds containing a (meth) allyl group. When two or more types of such compounds are contained, the total amount thereof preferably falls within the above range.

(Meth)allyl Isocyanurate Compound

The (meth)allyl isocyanurate compound is not particularly limited as long as it is a compound having two or more (meth)allyl groups and having an isocyanurate ring (nurate skeleton). Since the (meth)allyl isocyanurate compound has a large number of (meth)allyl groups serving as crosslinking points, the (meth)allyl isocyanurate compound tends to be firmly cured together with the resin (A), the polyphenylene ether compound (B), and an additional resin component (for example, additional compound (C)), so that a cured product having excellent low dielectric properties (Dk and/or Df) and thermal resistance is obtained. The (meth)allyl isocyanurate compound is preferably a compound represented by Formula (TA).

Formula (TA)

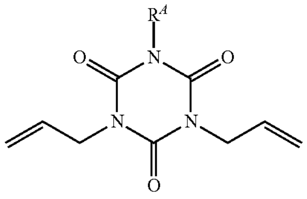

(In Formula (TA), $R^A$ represents a substituent.)

In Formula (TA), $R^A$ represents a substituent, and is more preferably a substituent having a formula weight of 15 to 500.

A first example of $R^A$ is an alkyl group having from 1 to 22 carbons or an alkenyl group having from 2 to 22 carbons. By using an allyl compound having an alkyl group having from 1 to 22 carbons or an alkenyl group having from 2 to 22 carbons, it is possible to provide a resin composition capable of producing a cured product having excellent crosslinkability and high toughness. As a result, even when a substrate such as glass cloth is not contained in the resin composition, it is possible to suppress cracking during etching treatment or the like.

The number of carbons in the alkyl group and/or the alkenyl group is preferably 3 or more, and more preferably 8 or more, and may be further 12 or more or 18 or less from the viewpoint of improving handleability. It is considered that the resin flowability of the resin composition is accordingly improved, and circuit filling properties are more excellent when a multilayer circuit board or the like is produced using the resin composition of the present embodiment.

A second example of $R^A$ is a group containing an allyl isocyanurate group. When $R^A$ contains an allyl isocyanurate group, the compound represented by Formula (TA) is preferably a compound represented by Formula (TA-1).

Formula (TA-1)

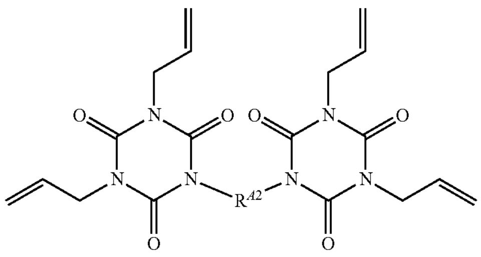

(In Formula (TA-1), $R^{A2}$ is a divalent linking group.)

In Formula (TA-1), $R^{A2}$ is preferably a divalent linking group having a formula weight of 54 to 250, more preferably a divalent linking group having a formula weight of 54 to 250 and having carbon atoms at both terminals, and still more preferably an aliphatic hydrocarbon group having from 2 to 20 carbons (note: the aliphatic hydrocarbon group may contain an ether group or may have a hydroxyl group). More specifically, $R^{A2}$ is preferably a group represented by any one of Formulae (i) to (iii) below.

(I)

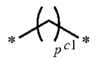

(II)

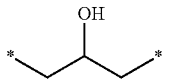

(III)

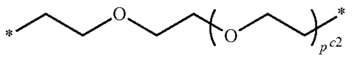

(In Formulae (i) to (iii), $p^{c1}$ represents the number of repeating units of a methylene group, and is an integer of 2 to 18; $p^{c2}$ represents the number of repeating units of an oxyethylene group and is 0 or 1; and * is a bonding site.)

The $p^{c1}$ is preferably an integer of 2 to 10, more preferably an integer of 3 to 8, and still more preferably an integer of 3 to 5.

The $p^{c2}$ may be 0 or 1, and is preferably 1.

A third example of $R^A$ is a phosphorus-based substituent. $R^A$ is preferably the first example.

In the present embodiment, the reactive group (allyl group) equivalent of the compound represented by Formula (TA) is preferably 1000 g/eq. or less. When the equivalent is 1000 g/eq. or less, it is considered that a high Tg can be more reliably obtained.

Examples of the alkyl group having from 1 to 22 carbons include linear or branched alkyl groups, and examples thereof include a methyl group, an ethyl group, a propyl group, a butyl group, a pentyl group, a hexyl group, a heptyl group, an octyl group, a nonyl group, a decyl group, a dodecyl group, a tetradecyl group, a hexadecyl group, an octadecyl group, an eicosyl group, and a docosyl group. Examples of the alkenyl group having from 2 to 22 carbons include an allyl group and a decenyl group.

Specific examples of the compound represented by Formula (TA) include triallyl isocyanurate, 5-octyl-1,3-diallyl isocyanurate, 5-dodecyl-1,3-diallyl isocyanurate, 5-tetradecyl-1,3-diallyl isocyanurate, 5-hexadecyl-1,3-diallyl isocyanurate, 5-octadecyl-1,3-diallyl isocyanurate, 5-eicosyl-1,3-diallyl isocyanurate, 5-docosyl-1,3-diallyl isocyanurate, and 5-decenyl-1,3-diallyl isocyanurate. These may be used singly or in combination of two or more types thereof, or may be used as a prepolymer.

The method of producing the compound represented by Formula (TA) is not particularly limited, and for example, the compound can be produced by reacting diallyl isocyanurate and an alkyl halide in an aprotic polar solvent such as N,N'-dimethylformamide in the presence of a basic substance such as sodium hydroxide, potassium carbonate, or triethylamine at a temperature of about 60 °C to 150 °C.

The compound represented by Formula (TA) may also be a commercially available compound. The commercially available product is not particularly limited, and examples thereof include L-DAIC available from Shikoku Chemicals Corporation and P-DAIC having a phosphorus-based substituent available from Shikoku Chemicals Corporation. Examples of the triallyl isocyanurate include TAIC available from Shinryo Corporation. Examples of the compound represented by Formula (TA-1) include DD-1 available from Shikoku Chemicals Corporation.

The molecular weight of the (meth)allyl isocyanurate compound (preferably, the compound represented by Formula (TA)) is preferably 200 or more, more preferably 300 or more, still more preferably 400 or more, and even more preferably 500 or more. When the molecular weight is equal to or higher than the above lower limit, the low dielectric properties (Dk and/or Df) and the thermal resistance of the resulting cured product tend to be further improved. The molecular weight of the (meth)allyl isocyanurate compound (preferably, the compound represented by Formula (TA)) is preferably 3000 or less, more preferably 2000 or less, still more preferably 1000 or less, and even more preferably 800 or less. When the molecular weight is equal to or lower than the above upper limit, the low thermal expansion of the resulting cured product tends to be further improved.

When the resin composition of the present embodiment contains a (meth)allyl isocyanurate compound, the content of the compound is preferably 1 part by mass or more, more preferably 3 parts by mass or more, still more preferably 5 parts by mass or more, and may be 10 parts by mass or more, relative to 100 parts by mass of the resin solid content in the resin composition. When the content of the (meth)allyl isocyanurate compound is equal to or higher than the above lower limit, the resin composition tends to have excellent moldability, and the thermal resistance and low thermal expansion of the resulting cured product tend to be further improved. The upper limit of the content of the (meth)allyl isocyanurate compound is preferably 40 parts by mass or less, and more preferably 30 parts by mass or less, and may be 20 parts by mass or less, relative to 100 parts by mass of the resin solid content in the resin composition. When the content of the (meth)allyl isocyanurate compound is equal to or lower than the above upper limit, the thermal resistance and low dielectric properties (Dk and/or Df) of the resulting cured product tend to be further improved.

The resin composition of the present embodiment may contain only one (meth)allyl isocyanurate compound, or may contain two or more (meth)allyl isocyanurate compounds. When two or more types of (meth)allyl isocyanurate compounds are contained, the total amount thereof preferably falls within the above range.

(Meth)allyl Group-Substituted Nadiimide Compound

The (meth)allyl group-substituted nadiimide compound is not particularly limited as long as it is a compound having two or more (meth)allyl group-substituted nadiimide groups per molecule. Specific examples thereof include a compound represented by Formula (AN) below.

Formlua (AN)

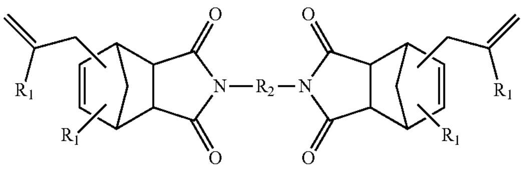

(In Formula (AN), $R_1$ each independently represents a hydrogen atom or an alkyl group having from 1 to 6 carbons, and $R_2$ represents an alkylene group having from 1 to 6 carbons, a phenylene group, a biphenylene group, a naphthylene group, or a group represented by Formula (AN-2) or (AN-3).)

Formula (AN-2)

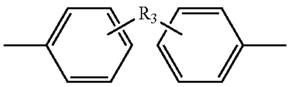

(In Formula (AN-2), $R_3$ represents a methylene group, an isopropylidene group, or a group represented by —C(=O)—, —O—, —S—, or $—S(=O)_2—$.)

Formula (AN-3)

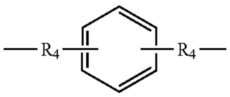

(In Formula (AN-3), $R_4$ each independently represents an alkylene group having from 1 to 4 carbons or a cycloalkylene group having from 5 to 8 carbons.)

The compound represented by Formula (AN) may also be a commercially available compound. Examples of the commercially available product include, but are not particularly limited to, a compound represented by Formula (AN-4) (BANI-M (available from Maruzen Petrochemical Co., Ltd.)) and a compound represented by Formula (AN-5) (BANI-X (available from Maruzen Petrochemical Co., Ltd.)). One of these may be used, or two or more may be used in combination.

Formula (AN-4)

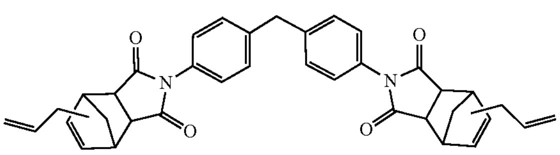

Formula (AN-5)

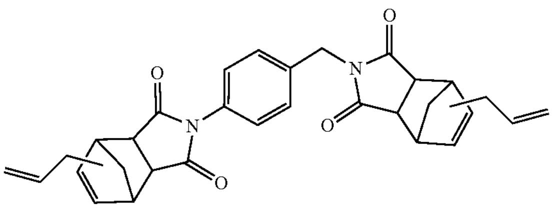

The molecular weight of the (meth)allyl group-substituted nadiimide compound (preferably, the compound represented by Formula (AN)) is preferably 400 or more, more preferably 500 or more, and may be 550 or more. When the molecular weight of the (meth)allyl group-substituted nadiimide compound is equal to or higher than the above lower limit, the low dielectric properties, the low thermal expansion, and the thermal resistance tend to be further improved. The molecular weight of the (meth)allyl group-substituted nadiimide compound (preferably the compound represented by Formula (AN)) is preferably 1500 or less, more preferably 1000 or less, and still more preferably 800 or less, and may be 700 or less or 600 or less. When the molecular weight of the (meth)allyl group-substituted nadiimide compound is equal to or lower than the above upper limit, moldability and peel strength tend to be further improved.

When the resin composition of the present embodiment contains the (meth)allyl group-substituted nadiimide compound (preferably the compound represented by Formula (AN)), the content of the compound is preferably 1 part by mass or more, more preferably 3 parts by mass or more, and still more preferably 5 parts by mass or more, and may be 10 parts by mass or more, relative to 100 parts by mass of the resin solid content in the resin composition. When the content of the (meth)allyl group-substituted nadiimide compound is equal to or higher than the above lower limit, the moldability tends to be excellent, and the low dielectric properties, the low thermal expansion, and the thermal resistance tend to be further improved. The upper limit of the content of the (meth)allyl group-substituted nadiimide compound (preferably, the compound represented by Formula (AN)) is preferably 40 parts by mass or less, more preferably 30 parts by mass or less, and still more preferably 25 parts by mass or less, and may be 20 parts by mass or less, relative to 100 parts by mass of the resin solid content in the resin composition. When the content of the (meth)allyl group-substituted nadiimide compound is equal to or lower than the above upper limit, the moldability and the peel strength tend to be further improved.

The resin composition of the present embodiment may contain only one (meth)allyl group-substituted nadiimide compound, or may contain two or more (meth)allyl group-substituted nadiimide compounds. When two or more types of (meth)allyl group-substituted nadiimide compounds are contained, the total amount thereof preferably falls within the above range.

(Meth)allyl Compound Having Glycoluril Structure

The (meth)allyl compound having a glycoluril structure is not particularly limited as long as it is a compound containing a glycoluril structure and two or more (meth)allyl groups. Even when the (meth)allyl compound having a glycoluril structure is blended in the resin composition, the number of (meth)allyl groups can be increased, that is, the number of crosslinking points can be increased. Thus, similar to the (meth)allyl isocyanurate compound, the (meth) allyl compound having a glycoluril structure tends to be firmly cured together with the resin (A), the polyphenylene ether compound (B), and an additional resin component (for example, additional compound (C)), so that a cured product having excellent low dielectric properties (Dk and/or Df) and thermal resistance is produced.

In the present embodiment, the (meth)allyl compound having a glycoluril structure is preferably a compound represented by Formula (GU).

Formula (GU)

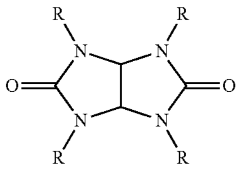

(In Formula (GU), each R is independently a hydrogen atom or a substituent, and at least two of the groups represented by R contain a (meth)allyl group.)

In Formula (GU), each R is independently preferably a hydrogen atom, an alkyl group having from 1 to 5 carbons, or an alkenyl group having from 2 to 5 carbons, preferably an alkenyl group having from 2 to 5 carbons, more preferably a (meth)allyl group, and still more preferably an allyl group.

In Formula (GU), preferably, three or four of Rs are groups containing a (meth)allyl group, and more preferably, four of Rs are groups containing a (meth)allyl group.

Specific examples of the compound represented by Formula (GU) include 1,3,4,6-tetraallylglycoluril (compound of Formula (GU) in which all Rs are allyl groups).

The compound represented by Formula (GU) may also be a commercially available compound. The commercially available product is not particularly limited, and examples thereof include TA-G available from Shikoku Chemicals Corporation.

The molecular weight of the (meth)allyl compound having a glycoluril structure (preferably, the compound represented by Formula (GU)) is preferably 195 or more, more preferably 220 or more, and still more preferably 250 or more, and may be 300 or more or 400 or more. When the molecular weight of the (meth)allyl compound having a glycoluril structure is equal to or higher than the above lower limit, the thermal resistance and low thermal expansion of the resulting cured product tend to be further improved. The molecular weight of the (meth)allyl compound having a glycoluril structure (preferably, the compound represented by Formula (GU)) is preferably 1500 or less, more preferably 1000 or less, still more preferably 800 or less, and may be 700 or less or 600 or less. When the molecular weight of the (meth)allyl compound having a glycoluril structure is equal to or lower than the above upper limit, the low dielectric properties (Dk and/or Df) and the thermal resistance of the resulting cured product tend to be further improved.

When the resin composition of the present embodiment contains the (meth)allyl compound having a glycoluril structure (preferably, the compound represented by Formula (GU)), the content of the compound is preferably 1 part by mass or more, more preferably 3 parts by mass or more, and still more preferably 5 parts by mass or more, and may be 10 parts by mass or more, relative to 100 parts by mass of the resin solid content in the resin composition. When the content of the (meth)allyl compound having a glycoluril structure is equal to or higher than the above lower limit, the resin composition tends to have excellent moldability, and the thermal resistance and low thermal expansion of the resulting cured product tend to be further improved. The upper limit of the content of the (meth)allyl compound having a glycoluril structure (preferably, the compound represented by Formula (GU)) is preferably 40 parts by mass or less, more preferably 30 parts by mass or less, and still more preferably 25 parts by mass or less, and may be 20 parts by mass or less, relative to 100 parts by mass of the resin solid content in the resin composition. When the content of the (meth)allyl compound having a glycoluril structure is equal to or lower than the above upper limit, the low dielectric properties (Dk and/or Df) of the resulting cured product tend to be further improved.

The resin composition of the present embodiment may contain only one (meth)allyl compound having a glycoluril structure, or may contain two or more (meth)allyl compounds having a glycoluril structure. When two or more types of (meth)allyl compounds having a glycoluril structure are contained, the total amount thereof preferably falls within the above range.

Oxetane Resin

The resin composition of the present embodiment may contain an oxetane resin.

The oxetane resin is not particularly limited as long as it is a compound having one or more (preferably from 2 to 12, more preferably from 2 to 6, even more preferably from 2 to 4, still more preferably 2 or 3, and yet more preferably 2) oxetanyl groups, and can be selected from a wide variety of compounds commonly used in the field of printed wiring boards.

Examples of the oxetane resin include oxetane, alkyloxetanes (e.g., 2-methyloxetane, 2,2-dimethyloxetane, 3-methyloxetane, and 3,3-dimethyloxatane), 3-methyl-3-methoxymethyloxetane, 3,3-di(trifluoromethyl)oxetane, 2-chloromethyloxetane, 3,3-bis(chloromethyl)oxetane, biphenyl-type oxetane, OXT-101 (available from Toagosei Co., Ltd.), and OXT-121 (available from Toagosei Co., Ltd.).

The resin composition of the present embodiment preferably contains the oxetane resin to such an extent that the effects of the present invention are not impaired. When the resin composition of the present embodiment contains the oxetane resin, the content of the oxetane resin is preferably 0.1 parts by mass or more, more preferably 1 part by mass or more, and even more preferably 2 parts by mass or more, relative to 100 parts by mass of the resin solid content in the resin composition. When the content of the oxetane resin is 0.1 parts by mass or more, the metal foil peel strength and toughness of the resulting cured product tend to be improved. When the resin composition of the present embodiment contains the oxetane resin, the upper limit of the content of the oxetane resin is preferably 50 parts by mass or less, more preferably 30 parts by mass or less, even more preferably 20 parts by mass or less, still more preferably 10 parts by mass or less, and yet more preferably 8 parts by mass or less, relative to 100 parts by mass of the resin solid content in the resin composition. When the content of the oxetane resin is 50 parts by mass or less, the electrical properties of the resulting cured product tend to be improved.

The resin composition of the present embodiment may contain only one oxetane resin or may contain two or more oxetane resins. When two or more types of oxetane resins are contained, the total amount thereof preferably falls within the above range.

The resin composition of the present embodiment may also contain substantially no oxetane resin. The phrase "contain substantially no" means that the content of the oxetane resin is less than 0.1 parts by mass relative to 100 parts by mass of the resin solid content in the resin composition.

Benzoxazine Compound

The resin composition of the present embodiment may contain a benzoxazine compound.

The benzoxazine compound is not particularly limited as long as it is a compound having two or more (preferably from 2 to 12, more preferably from 2 to 6, even more preferably from 2 to 4, still more preferably 2 or 3, and yet more preferably 2) dihydrobenzoxazine rings per molecule, and can be selected from a wide variety of compounds commonly used in the field of printed wiring boards.

Examples of the benzoxazine compound include a bisphenol A-type benzoxazine BA-BXZ (available from Konishi Chemical Ind. Co., Ltd.), a bisphenol F-type benzoxazine BF—BXZ (available from Konishi Chemical Industry Co., Ltd.), and a bisphenol S-type benzoxazine BS—BXZ (available from Konishi Chemical Industry Co., Ltd.).

The resin composition of the present embodiment preferably contains the benzoxazine compound to such an extent that the effects of the present invention are not impaired. When the resin composition of the present embodiment contains the benzoxazine compound, the content of the benzoxazine compound is preferably 0.1 parts by mass or more and preferably 50 parts by mass or less relative to 100 parts by mass of the resin solid content in the resin composition.

The resin composition of the present embodiment may contain only one benzoxazine compound or may contain two or more benzoxazine compounds. When two or more types of benzoxazine compounds are contained, the total amount thereof preferably falls within the above range.

The resin composition of the present embodiment may also contain substantially no benzoxazine compound. The phrase "contain substantially no" means that the content of the benzoxazine compound is less than 0.1 parts by mass relative to 100 parts by mass of the resin solid content in the resin composition.

Arylcyclobutene Resin

The resin composition of the present embodiment may contain an arylcyclobutene resin.

For details thereof, the arylcyclobutene resins described in paragraph [0042] of JP 2019-194312 A are exemplified, the content of which is incorporated herein by reference.

Polyamide Resin

The resin composition of the present embodiment may contain a polyamide resin or a thermosetting polyamide resin.

For details thereof, reference can be made to the polyamide described in paragraph [0065] of JP 2019-194312 A, and the polyamide described in paragraph [0063] of JP 6951829 B, the contents of which are incorporated herein by reference.

Polyimide Resin

The resin composition of the present embodiment may contain a polyimide resin or a thermosetting polyimide resin.

For details thereof, reference can be made to the polyimide described in paragraphs [0063] to [0064] of JP 6951829 B, the content of which is incorporated herein by reference.

Perfluorovinyl Ether Resin

The resin composition of the present embodiment may contain a perfluorovinyl ether resin or a perfluorovinyl benzyl ether resin.

For details thereof, the perfluorovinyl ether resins described in paragraph [0043] of JP 2019-194312 A are exemplified, the content of which is incorporated herein by reference.

Compound Having Styrene Group Other than Polyphenylene Ether Compound (B) Having Unsaturated Carbon-Carbon Double Bond at Terminal The resin composition of the present embodiment may contain a compound having a styrene group other than the polyphenylene ether compound (B) having an unsaturated carbon-carbon double bond at a terminal.

For details thereof, the compound having styrene at a terminal described in WO 2022/210095 (for example, compounds described in Synthesis Examples 12 to 16 of the same publication), the description in paragraphs [0029] to [0038] of JP 2022-85610 A, and the vinyl benzyl ether resin described in paragraph [0041] of JP 2019-194312 A are exemplified, the contents of which are incorporated herein by reference.

Compound Having Isopropenyl Group Other than Resin (A) Having Indane Skeleton

The resin composition of the present embodiment may contain a compound having an isopropenyl group other than the resin (A) having an indane skeleton.

For details thereof, the resin having an isopropenyl group described in WO 2022/210095 (for example, compounds described in Synthesis Examples 1, 2, 7, and 8 of the same publication) are exemplified, the content of which is incorporated herein by reference.

Polyfunctional (Meth)acrylate Compound Other than Polyphenylene Ether Compound (B) Having Unsaturated Carbon-Carbon Double Bond at Terminal The resin composition of the present embodiment may contain a polyfunctional (meth)acrylate compound other than the polyphenylene ether compound (B) having an unsaturated carbon-carbon double bond at a terminal. Here, the polyfunctional (meth)acrylate compound means a compound containing two or more (meth)acryloyloxy groups in one molecule, and preferably contains three or more (meth) acryloyloxy groups in one molecule.

The polyfunctional (meth)acrylate compound is preferably a compound having three to five (meth)acryloyloxy groups, more preferably a compound having three or four (meth)acryloyloxy groups, and still more preferably a compound having three (meth)acryloyloxy groups. The (meth) acrylate compound is preferably a compound having a methacryloyloxy group.

Since the polyfunctional (meth)acrylate compound has a large number of (meth)acrylate groups serving as crosslinking points, the polyfunctional (meth)acrylate compound is firmly cured together with the resin (A), the polyphenylene ether compound (B), and an additional resin component (for example, additional compound (C)), so that a cured product having excellent low dielectric properties (Dk and/or Df) and thermal resistance is obtained. The polyfunctional (meth)acrylate compound is preferably a compound represented by Formula (MA).

Formula (MA)

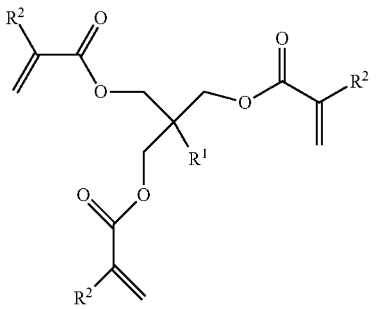

(In Formula (MA), $R^1$ represents a hydrogen atom or a substituent, and $R^2$ each independently represents a hydrogen atom or a methyl group.)

In Formula (MA), $R^1$ represents a hydrogen atom or a substituent, and is more preferably a substituent having a formula weight of 15 to 500, more preferably a substituent having a formula weight of 15 to 300, still more preferably a substituent having a formula weight of 15 to 100, and even more preferably a substituent having a formula weight of 15 to 50.

$R^1$ is preferably a hydrocarbon group or a (meth)acryloyloxy group, more preferably a hydrocarbon group having 22 or less carbons, and still more preferably an alkyl group having from 1 to 22 carbons or an alkenyl group having from 2 to 22 carbons. The use of a compound having an alkyl group having from 1 to 22 carbons or an alkenyl group having from 2 to 22 carbons can provide a resin composition capable of producing a cured product having excellent crosslinkability and high toughness. Thus, even when a substrate such as glass cloth is not contained in the resin composition, it is possible to suppress cracking during etching treatment.

The number of carbons in the alkyl group and/or the alkenyl group is preferably 2 or more, may be 8 or more, and may be 12 or more or 18 or less from the viewpoint of improving handleability. It is considered that the resin flowability of the resin composition is accordingly improved, and circuit filling properties are more excellent when a multilayer circuit board or the like is produced using the resin composition of the present embodiment.

In the present embodiment, the (meth)acrylic group equivalent of the compound represented by Formula (MA) is preferably 1000 g/eq. or less. When the equivalent is 1000 g/eq. or less, a high Tg tends to be achieved more reliably. The lower limit of the (meth)acrylic group equivalent is, for example, 99 g/eq. or more.

The alkyl group having from 1 to 22 carbons is preferably a linear alkyl group having from 1 to 22 carbons or a branched alkyl group having from 3 to 22 carbons, and examples thereof include a methyl group, an ethyl group, a propyl group, a butyl group, a pentyl group, a hexyl group, a heptyl group, an octyl group, a nonyl group, a decyl group, a dodecyl group, a tetradecyl group, a hexadecyl group, an octadecyl group, an eicosyl group, and a docosyl group. The alkenyl group having from 2 to 22 carbons is preferably an alkenyl group having 2 to 15 carbons, and examples thereof include an allyl group and a decenyl group.

Specific examples of the compound represented by Formula (MA) include trimethylolpropane trimethacrylate, trimethylolpropane triacrylate, and pentaerythritol tetra(m-eth)acrylate. These may be used singly or in combination of two or more types thereof, or may be used as a prepolymer.

The compound represented by Formula (MA) to be used may be a commercially available product. The commercially available product is not particularly limited, and examples of trimethylolpropane trimethacrylate include "NK Ester TMPT" available from Shin-Nakamura Chemical Co., Ltd.

The molecular weight of the polyfunctional (meth)acrylate compound is preferably 300 or more, more preferably 330 or more, and may be 400 or more or 500 or more. When the molecular weight is equal to or higher than the above lower limit, the low dielectric properties (Dk and/or Df) and the thermal resistance of the resulting cured product tend to be further improved. The molecular weight of the (meth) acrylate compound (preferably, the compound represented by Formula (MA)) is preferably 3000 or less, more preferably 2000 or less, still more preferably 1000 or less, and even more preferably 800 or less. When the molecular weight is equal to or lower than the above upper limit, the low thermal expansion of the resulting cured product tends to be further improved.

For details thereof, the resin having a (meth)acrylic group described in WO 2022/210095 (for example, compounds described in Synthesis Examples 5 and 21 of the same publication) and the resin having a (meth)acrylic group described in JP 6962507 B (for example, compounds described in Examples 1 to 9) are exemplified, the contents of which are incorporated herein by reference.

When the resin composition of the present embodiment contains a polyfunctional (meth)acrylate compound, the content of the compound is preferably 1 part by mass or more, more preferably 3 parts by mass or more, still more preferably 5 parts by mass or more, and may be 10 parts by mass or more, relative to 100 parts by mass of the resin solid content in the resin composition. When the content of the polyfunctional (meth)acrylate compound is equal to or higher than the above lower limit, the resin composition tends to have excellent moldability, and the thermal resistance and low thermal expansion of the resulting cured product tend to be further improved. The upper limit of the content of the (meth)acrylate compound is preferably 40 parts by mass or less, and more preferably 30 parts by mass or less, and may be 20 parts by mass or less, relative to 100 parts by mass of the resin solid content in the resin composition. When the content of the polyfunctional (meth)acrylate compound is equal to or lower than the above upper limit, the thermal resistance and low dielectric properties (Dk and/or Df) of the resulting cured product tend to be further improved.

The resin composition of the present embodiment may contain only one polyfunctional (meth)acrylate compound, or may contain two or more polyfunctional (meth)acrylate compounds. When two or more types of polyfunctional (meth)acrylate compounds are contained, the total amount thereof preferably falls within the above range.

Elastomer

The resin composition of the present embodiment may contain an elastomer. The elastomer may be thermoplastic, thermosetting, or neither thermoplastic nor thermosetting, and is preferably thermoplastic.

The elastomer in the present embodiment is not particularly limited, and examples of the elastomer include at least one selected from the group consisting of polyisoprene, polybutadiene, styrene-butadiene, butyl rubber, ethylene-propylene rubber, styrene-butadiene-ethylene, styrene-butadiene-styrene, styrene-isoprene-styrene, styrene-ethylene-butylene-styrene, styrene-propylene-styrene, styrene-ethylene-propylene-styrene, fluororubber, silicone rubber, their hydrogenated compounds, their alkylated compounds, and their copolymers.

Other examples of the elastomer include oligomers or polymers having a curable vinyl functional group and polybutadiene resins described in paragraphs [0044] and [0045] of JP 2019-194312 A, the content of which is incorporated herein by reference.

The number average molecular weight of the elastomer (preferably, thermoplastic elastomer) used in the present embodiment is preferably 1000 or more. When the number average molecular weight is 1000 or more, the resulting cured product tends to have more excellent low dielectric properties (Dk and/or Df, in particular, low dielectric loss tangent). The number average molecular weight is preferably 1500 or more, more preferably 2000 or more, and may be 600000 or more, 700000 or more, or 800000 or more depending on the intended use. The upper limit of the number average molecular weight of the elastomer is preferably 400000 or less, more preferably 350000 or less, and still more preferably 300000 or less. When the number average molecular weight is equal to or lower than the above upper limit, the solubility of the elastomer component in the resin composition tends to be improved.

In a case where the resin composition of the present embodiment contains two or more elastomers, the number average molecular weight of a mixture thereof preferably satisfies the range described above.

Examples of the elastomer used in the present embodiment include a resin containing a polybutadiene structure. The polybutadiene structure may be partially or fully hydrogenated. Specific examples thereof include B-1000, B-2000, B-3000, BI-2000, and BI-3000 available from Nippon Soda Co., Ltd., and Ricon 100, Ricon 130, Ricon 131, Ricon 142, Ricon 150, Ricon 181, and Ricon 184 available from CRAY VALLEY.

Examples of the elastomer used in the present embodiment include a resin containing a poly(meth)acrylate structure. Specific examples thereof include Teisan Resin available from Nagase ChemteX Corporation, and ME-2000, W-197C, KG-15, and KG-3000 available from Negami Chemical Industrial Co., Ltd.

Examples of the elastomer used in the present embodiment include a resin containing a polycarbonate structure. The resin containing a polycarbonate structure may be referred to as a "polycarbonate resin". Examples of such a resin include a carbonate resin having no reactive group, a hydroxy group-containing carbonate resin, a phenolic hydroxyl group-containing carbonate resin, a carboxy group-containing carbonate resin, an acid anhydride group-containing carbonate resin, an isocyanate group-containing carbonate resin, a urethane group-containing carbonate resin, and an epoxy group-containing carbonate resin. Here, the reactive group refers to a functional group capable of reacting with other components such as a hydroxy group, a phenolic hydroxyl group, a carboxy group, an acid anhydride group, an isocyanate group, a urethane group, and an epoxy group.

Specific examples of the polycarbonate resin include FPC 0220 and FPC 2136 available from MITSUBISHI GAS CHEMICAL COMPANY, INC., and T6002 and T6001 (polycarbonate diol) available from Asahi Kasei Chemicals Corporation.

Examples of the elastomer used in the present embodiment include a resin containing a polysiloxane structure. Specific examples thereof include SMP-2006, SMP-2003

PGMEA, SMP-5005 PGMEA, KR-510, and SMP-7014-35 available from Shin-Etsu Chemical Co., Ltd.

Examples of the elastomer used in the present embodiment include a resin containing a polyalkylene structure and/or a polyalkyleneoxy structure. The polyalkyleneoxy structure is preferably a polyalkyleneoxy structure having from 2 to 15 carbons, more preferably a polyalkyleneoxy structure having from 3 to 10 carbons, and particularly preferably a polyalkyleneoxy structure having from 5 to 6 carbons. Specific examples of the resin containing a polyalkylene structure and/or a polyalkyleneoxy structure include PTXG-1000 and PTXG-1800 available from Asahi Kasei Fibers Corporation.

Examples of the elastomer used in the present embodiment includea resin containing a polyisoprene structure. Specific examples thereof include KL-610 and KL613 available from Kuraray Co., Ltd.

Examples of the elastomer used in the present embodiment include a resin containing a polyisobutylene structure. Specific examples thereof include SIBSTAR-073T (styrene-isobutylene-styrene triblock copolymer) and SIBSTAR-042D (styrene-isobutylene diblock copolymer) available from KANEKA CORPORATION.

In the present embodiment, the elastomer is preferably an elastomer containing a styrene monomer unit and a conjugated diene monomer unit (hereinafter referred to as "elastomer (e)"). By using such an elastomer (e), the resulting cured product has more excellent low dielectric properties (Dk and/or Df, in particular, low dielectric loss tangent).

The elastomer (e) contains a styrene monomer unit. When the elastomer (e) contains the styrene monomer unit, the solubility of the elastomer (e) in the resin composition is improved. Examples of the styrene monomer include styrene, α-methylstyrene, p-methylstyrene, divinylbenzene (vinylstyrene), N,N-dimethyl-p-aminoethylstyrene, and N,N-diethyl-p-aminoethylstyrene. Of these, styrene, α-methylstyrene, and p-methylstyrene are preferred from the viewpoint of availability and productivity. Of these, styrene is particularly preferred.

The content of the styrene monomer unit in the elastomer (e) is preferably in a range of from 10 to 50 mass %, more preferably in a range of from 13 to 45 mass %, and still more preferably in a range of from 15 to 40 mass % of all the monomer units. When the content of the styrene monomer unit is 50 mass % or less, adhesion and pressure sensitive adhesion to a substrate or the like are further improved. In addition, the content of 10 mass % or more is preferred because there is a tendency that it is possible to suppress an increase in pressure sensitive adhesion, an adhesive residue or a stop mark is less likely to occur, and easy peelability between pressure sensitive adhesive surfaces is improved when the content is 10 mass % or more.

The elastomer (e) may contain only one styrene monomer unit, or two or more styrene monomer units. When two or more styrene monomer units are contained, the total amount thereof preferably falls within the above range.

As for a method for measuring the content of the styrene monomer unit in the elastomer (e) of the present embodiment, reference can be made to WO 2017/126469, the content of which is incorporated herein by reference. The same shall apply to the conjugated diene monomer unit described below.

The elastomer (e) contains a conjugated diene monomer unit. When the elastomer (e) contains the conjugated diene monomer unit, the solubility of the elastomer (e) in the resin composition is improved. The conjugated diene monomer is not particularly limited as long as it is a diolefin having a pair of conjugated double bonds. Examples of the conjugated diene monomer include 1,3-butadiene, 2-methyl-1,3-butadiene (isoprene), 2,3-dimethyl-1,3-butadiene, 1,3-pentadiene, 2-methyl-1,3-pentadiene, 1,3-hexadiene, and farnesene. Of these, 1,3-butadiene and isoprene are preferred, and 1,3-butadiene is more preferred.

The elastomer (e) may contain only one conjugated diene monomer unit, or two or more conjugated diene monomer units.

In the elastomer (e), the mass ratio of the styrene monomer unit to the conjugated diene monomer unit (styrene monomer unit/conjugated diene monomer unit) is preferably in a range of from 5/95 to 80/20, more preferably in a range of from 7/93 to 77/23, and still more preferably in a range of from 10/90 to 70/30. When the mass ratio of the styrene polymer unit to the conjugated diene monomer unit is in a range of from 5/95 to 80/20, it is possible to suppress an increase in pressure sensitive adhesion and to maintain the pressure sensitive adhesive strength at a high level, and easy peelability between pressure sensitive adhesive surfaces is improved.

In the elastomer (e), all of the conjugated diene bonds of the elastomer may be hydrogenated, some of the conjugated diene bonds may be hydrogenated, or the conjugated diene bonds may not be hydrogenated.

The elastomer (e) may or may not contain an additional monomer unit in addition to the styrene monomer unit and the conjugated diene monomer unit. Examples of the additional monomer unit include an aromatic vinyl compound unit other than the styrene monomer unit.

In the elastomer (e), the total of the styrene monomer unit and the conjugated diene monomer unit is preferably 90 mass % or more, more preferably 95 mass % or more, still more preferably 97 mass % or more, and even more preferably 99 mass % or more of all the monomer units.

As described above, the elastomer (e) may contain only one type of each of the styrene monomer unit and the conjugated diene monomer unit, or may contain two or more types of each of the styrene monomer unit and the conjugated diene monomer unit. When two or more types of each of the monomer units are contained, the total amount thereof preferably falls within the above range.

The elastomer (e) used in the present embodiment may be a block polymer or a random polymer. The elastomer (e) may be a hydrogenated elastomer in which the conjugated diene monomer units are hydrogenated, an unhydrogenated elastomer in which the conjugated diene monomer units are not hydrogenated, or a partially hydrogenated elastomer in which the conjugated diene monomer units are partially hydrogenated, and is preferably an unhydrogenated elastomer or a partially hydrogenated elastomer.

In one embodiment of the present embodiment, the elastomer (e) is a hydrogenated elastomer. Here, the hydrogenated elastomer means, for example, one in which double bonds based on a conjugated diene monomer unit in an elastomer is hydrogenated, and is intended to include one having a hydrogenation percentage (hydrogenation rate) of 80% or more in addition to one having a hydrogenation rate of 100%. The hydrogenation rate of the hydrogenated elastomer is preferably 85% or more, more preferably 90% or more, and even more preferably 95% or more. In the present embodiment, the hydrogenation rate is calculated from the measurement results of $^1$H-NMR spectrum measurement.

In one embodiment of the present embodiment, the elastomer (e) is an unhydrogenated elastomer. Here, the "unhydrogenated elastomer" is intended to include an elastomer in which the proportion of hydrogenated double bonds among double bonds based on a conjugated diene monomer unit; i.e., a hydrogenation percentage (hydrogenation rate) is 20% or less. The hydrogenation rate is preferably 15% or less, more preferably 10% or less, and still more preferably 5% or less.

Meanwhile, the partially hydrogenated elastomer means one in which some of double bonds based on a conjugated diene monomer unit in an elastomer are hydrogenated, and usually refers to one having a hydrogenation percentage (hydrogenation rate) of less than 80% and more than 20%.

Examples of commercially available products of the elastomer (e) used in the present embodiment include SEPTON® 2104, V9461, and S8104 available from Kuraray Co., Ltd., S.O.E.® S1606, S1613, S1609, and S1605 available from Asahi Kasei Corporation, TUFTEC® H1041, H1043, P2000, and MP10 available from Asahi Kasei Corporation, and DYNARON® 9901 P and TR2250 available from JSR Corporation.

The elastomer used in the present embodiment may also be a liquid diene. The liquid diene means a liquid elastomer containing a conjugated diene monomer unit. Examples of the conjugated diene monomer include 1,3-butadiene, 2-methyl-1,3-butadiene (isoprene), 2,3-dimethyl-1,3-butadiene, 1,3-pentadiene, 2-methyl-1,3-pentadiene, 1,3-hexadiene, and farnesene. Of these, 1,3-butadiene and isoprene are preferred, and 1,3-butadiene is more preferred.

Examples of the liquid diene used in the present embodiment include liquid polybutadiene, liquid polyisoprene, a modified product of liquid polybutadiene, a modified product of liquid polyisoprene, a liquid acrylonitrile-butadiene copolymer, and a liquid styrene-butadiene copolymer.

The number average molecular weight of the liquid diene is not particularly limited as long as it is liquid at 20 °C, and is preferably 500 or more and 10000 or less.

When the resin composition of the present embodiment contains the elastomer (preferably, the elastomer (e)), the content thereof is preferably 1 part by mass or more, more preferably 5 parts by mass or more, and still more preferably 8 parts by mass or more, relative to 100 parts by mass of the resin solid content in the resin composition, and may be 10 parts by mass or more, or 12 parts by mass or more depending on the intended use. When the content is equal to or higher than the above lower limit, the dielectric properties (low dielectric loss tangent) tend to be further improved. The upper limit of the content of the elastomer is preferably 45 parts by mass or less, more preferably 40 parts by mass or less, still more preferably 35 parts by mass or less, even more preferably 32 parts by mass or less, and further more preferably 28 parts by mass or less, relative to 100 parts by mass of the resin solid content in the resin composition. When the content is equal to or lower than the above upper limit, the heat resistance tends to be further improved.

The resin composition of the present embodiment may contain only one elastomer or may contain two or more elastomers. When two or more types of elastomers are contained, the total amount thereof preferably falls within the above range.

The resin composition in the present embodiment may also contain substantially no elastomer. The phrase "contain substantially no elastomer" means that the content of the elastomer is less than 1 part by mass relative to 100 parts by mass of the resin solid content in the resin composition, and the content is preferably less than 0.1 parts by mass, and more preferably less than 0.01 parts by mass.

Petroleum Resin

The resin composition of the present embodiment may contain a petroleum resin. The incorporation of the petroleum resin can reduce the melt viscosity.

The petroleum resin is a resin produced by thermally decomposing petroleum naphtha, collecting necessary fractions, and polymerizing the remaining fraction without isolating an unsaturated hydrocarbon in the absence of a catalyst or in the presence of a catalyst. The remaining fraction is mainly a fraction containing C5 fractions (e.g., isoprene, piperylene, cyclopentadiene, pentenes, and pentanes) or C9 fractions (e.g., vinyltoluene, indene, and dicyclopentadiene).

The catalyst used for the production of the petroleum resin is preferably an acidic catalyst. Specific examples of the usable catalyst include Lewis acids such as a boron trifluoride phenol complex, a boron trifluoride ether complex, aluminum chloride, aluminum bromide, iron (III) chloride, and iron (III) bromide, solid acids such as zeolite, silica, montmorillonite, and alumina, ion exchange resins such as a sulfonate group-containing fluororesin and a sulfonate group-containing polystyrene resin, and protic acids such as sulfuric acid, hydrochloric acid, acetic acid, phosphoric acid, oxalic acid, nitric acid, paratoluenesulfonic acid, and trifluoroacetic acid. Among them, a Lewis acid or a solid acid, which hardly causes a side reaction and achieves a high reaction rate, is preferably used, and any complex of boron trifluoride or aluminum chloride is more preferred from the viewpoint of availability and high reactivity.

The weight average molecular weight of the petroleum resin is not particularly limited, and is preferably 500 to 10000 and more preferably 500 to 5000. When the weight average molecular weight is equal to or lower than the above upper limit, the resin is easily compatible with other resins, and the solubility in a solvent tends to be increased. When the weight average molecular weight is equal to or higher than the above lower limit, the thermal resistance and mechanical strength of the resulting cured product tends to be further improved.

The softening point of the petroleum resin is not particularly limited, and is preferably high, preferably 80 °C or higher, and more preferably 100 °C or higher. When the softening point is equal to or higher than the above lower limit, the thermal resistance of the resulting cured product tends to be further improved.

Examples of the petroleum resin include aliphatic petroleum resins, aromatic petroleum resins, copolymer-based petroleum resins, and dicyclopentadiene-based petroleum resins, and dicyclopentadiene-based petroleum resins are preferred.

Examples of the dicyclopentadiene-based petroleum resin include resins produced by polymerizing a dicyclopentadiene-based fraction such as dicyclopentadiene, isopropenylnorbomene, dimethyldicyclopentadiene, or tricyclopentadiene, and resins produced by polymerizing a dicyclopentadiene-based fraction and an additional monomer having an unsaturated bond, preferably an unsaturated cyclic olefin.

Examples of the unsaturated cyclic olefin include cyclopentadiene; norbornene-based monomers such as 2-norbornene, 5-methyl-2-norbornene, 5-ethylidene-2-norbornene, 5-phenylnorbomene, 5-propenyl-2-norbornene, and 5-ethylidene-2-norbornene; and tri- or more-cyclic norbornene-based monomers, for example, tricyclic compounds other than dicyclopentadiene-based fractions, such as diethyldicyclopentadiene and dihydrodicyclopentadiene, tetracyclic compounds such as tetracyclododecene, pentacyclic compounds such as tricyclopentadiene, heptacyclic compounds such as tetracyclopentadiene, and alkyl-substituted, alkylidene-substituted, and aryl-substituted compounds of these polycyclic compounds. Examples of the alkyl-substituted compound of the polycyclic compound include methyl, ethyl, propyl, and butyl-substituted compounds, examples of the alkylidene-substituted compound of the polycyclic compound include ethylidene-substituted compounds, and examples of the aryl-substituted compound of the polycyclic compound include phenyl, tolyl, and naphthyl-substituted compounds.

In addition, as an additional monomer having an unsaturated bond other than the unsaturated cyclic olefin, an olefin having from 3 to 12 carbons may be copolymerized, and examples of such an olefin include α-olefins such as propylene, butene-1, pentene-1, 1,3-pentadiene, hexene-1, heptene-1, octene-1, diisobutylene, nonene-1, decene-1, 4-phenylbutene-1, 6-phenylhexene-1, 3-methylbutene-1, 4-methylpentene-1, 3-methylpentene-1, 3-methylhexene-1, 4-methylhexene-1, 5-methylhexene-1, 3,3-dimethylpentene-1, 3,4-dimethylpentene-1, 4,4-dimethylpentene-1, vinylcyclohexane, and vinylcyclohexene; and halogen-substituted α-olefins such as hexafluoropropene, 2-fluoropropene, 3-fluoropropene, and 3,4-dichlorobutene-1.

Examples of additional monomers having an unsaturated bond other than the above-described monomers include ethylene, tetrafluoroethylene, fluoroethylene, 1,1-difluoroethylene, and trifluoroethylene; alkylstyrenes such as styrene, p-methylstyrene, o-methylstyrene, m-methylstyrene, 2,4-dimethylstyrene, 2,5-dimethylstyrene, 3,4-dimethylstyrene, 3,5-dimethylstyrene, and p-t-butylstyrene; halogenated styrenes such as p-chlorostyrene, m-chlorostyrene, o-chlorostyrene, p-bromostyrene, m-bromostyrene, o-bromostyrene, p-fluorostyrene, m-fluorostyrene, o-fluorostyrene, and o-methyl-p-fluorostyrene; maleic anhydride, maleic acid, fumaric acid, allyl alcohol, 3-butene-2-ol, methylbutene-1-ol, vinyl acetate, and vinyl chloride.

The aforementioned monomers may be used singly, or two or more types may be used in combination.

Commercially available petroleum resins can be appropriately used. Examples of the aliphatic petroleum resin include Quintone A100, Quintone B170, Quintone K100, Quintone M100, Quintone R100, and Quintone C200S available from Zeon Corporation, and Marukarez T-100AS and Marukarez R-100AS available from Maruzen Petrochemical Co., Ltd., examples of the aromatic petroleum resin include Neopolymer L-90, Neopolymer 120, Neopolymer 130, Neopolymer 140, Neopolymer 150, Neopolymer 170S, Neopolymer 160, Neopolymer E-100, Neopolymer E-130, Neopolymer 130S, and Neopolymer S available from JXTG Nippon Oil & Energy Corporation, and Petcol LX, Petcol LX-HS, Petcol 100T, Petcol 120, Petcol 120HS, Petcol 130, Petcol 140, Petcol 140HM, Petcol 140HM5, Petcol 150, Petcol 150AS available from Tosoh Corporation, examples of the copolymer-based petroleum resins include Quintone D100, Quintone N180, Quintone P195N, Quintone S100, Quintone S195, Quintone U185, Quintone G100B, Quintone G115, Quintone D200, Quintone E200SN, and Quintone N295 available from Zeon Corporation, Petrotac 60, Petrotac 70, Petrotac 90, Petrotac 90V, Petrotac 100, Petrotac 100V, and Petrotac 90HM available from Tosoh Corporation, and examples of DCPD (dicyclopentadiene)-based petroleum resins Marukarez M-890A and Marukarez M-845A available from Maruzen Petrochemical Co., Ltd., Quintone 1325, Quintone 1345, Quintone 1500, Quintone 1525L, and Quintone 1700 available from Zeon Corporation, and HA085, HA103, HA105, HA125, HB103, and HB125 available from ENEOS Corporation.

The petroleum resin to be employed may be those described in Organic Synthetic Chemistry, Vol. 25, No. 6 (1967).

When the resin composition of the present embodiment contains a petroleum resin, the lower limit of the content thereof is preferably 1 part by mass or more, more preferably 5 parts by mass or more, still more preferably 10 parts by mass or more, even more preferably 20 parts by mass or more, and further more preferably 25 parts by mass or more, relative to 100 parts by mass of the resin solid content in the resin composition. When the content is equal to or higher than the lower limit, the melt viscosity tends to be decreased. The upper limit of the content of the petroleum resin is preferably 70 parts by mass or less, more preferably 50 parts by mass or less, and may be 40 parts by mass or less, relative to 100 parts by mass of the resin solid content in the resin composition. When the content is equal to or lower than the upper limit, Df tends to be decreased.

The resin composition of the present embodiment may contain only one type of petroleum resin, or may contain two or more types thereof. When two or more types of petroleum resins are contained, the total amount thereof preferably falls within the above range.

The resin composition of the present embodiment may also contain substantially no petroleum resin. The phrase "contain substantially no petroleum resin" means that the content of the petroleum resin is less than 1 part by mass relative to 100 parts by mass of the resin solid content in the resin composition, and the content is preferably less than 0.1 parts by mass, and more preferably less than 0.01 parts by mass.

Filler (D)

The resin composition of the present embodiment preferably contains a filler (D). The incorporation of the filler (D) can further improve the physical properties of the resin composition or a cured product thereof, such as low dielectric properties (Dk and/or Df), flame resistance, and low thermal expansion.

The filler (D) used in the present embodiment more preferably has excellent low dielectric properties (Dk and/or Df). For example, the filler (D) used in the present embodiment has a relative dielectric constant (Dk) at a frequency of 10 GHz as measured according to a cavity resonator perturbation method of preferably 8.0 or less, more preferably 6.0 or less, and still more preferably 4.0 or less. Furthermore, the lower limit of the relative dielectric constant is, for example, practically 2.0 or more. The filler (D) used in the present embodiment has a dielectric loss tangent (Df) at a frequency of 10 GHz as measured according to a cavity resonator perturbation method of preferably 0.05 or less, and more preferably 0.01 or less. The lower limit of the dielectric loss tangent is, for example, practically 0.0001 or more.

The type of the filler (D) used in the present embodiment is not particularly limited, and any filler commonly used in the art can be suitably used. Specific examples of the filler include silicas such as natural silica, fused silica, synthetic silica, amorphous silica, aerosil, and hollow silica; metal oxides such as alumina, white carbon, titanium white, titanium oxide, zinc oxide, magnesium oxide, and zirconium oxide; composite oxides such as zinc borate, zinc stannate, forsterite, barium titanate, strontium titanate, and calcium titanate; nitrides such as boron nitride, aggregated boron nitride, silicon nitride, and aluminum nitride; metal hydroxides such as aluminum hydroxide, aluminum hydroxide heat treated products (aluminum hydroxide subjected to heat treatment to reduce a part of crystal water), boehmite, and magnesium hydroxide (including hydrates); molybdenum compounds such as molybdenum oxide and zinc molybdate; inorganic fillers such as barium sulfate, clay, kaolin, talc, fired clay, fired kaolin, fired talc, mica, E-glass, A-glass, NE-glass, NER-glass, C-glass, L-glass, D-glass, S-glass, M-glass G20, short glass fibers (including fine powders of glass such as E glass, T glass, D glass, S glass, and Q glass), hollow glass, and spherical glass; and organic fillers such as styrene type, butadiene type, and acrylic type rubber powders, core-shell type rubber powders, silicone resin powders, silicone rubber powders, and silicone composite powders.

In the present embodiment, an inorganic filler is preferred, and more preferably the filler contains one or more selected from the group consisting of silica, aluminum hydroxide, aluminum nitride, boron nitride, forsterite, titanium oxide, barium titanate, strontium titanate, and calcium titanate. From the viewpoint of the low dielectric properties (Dk and/or Df), the filler more preferably contains one or more selected from the group consisting of silica and aluminum hydroxide, and even more preferably contains silica. The use of such an inorganic filler further improves the properties of the cured product of the resin composition, such as thermal resistance, low dielectric properties (Dk and/or Df), thermal expansion characteristics, dimensional stability, and flame resistance.

The content of the filler (D) in the resin composition of the present embodiment can be appropriately determined depending on the desired properties, and is not particularly limited. The content is preferably 10 parts by mass or more, more preferably 20 parts by mass or more, even more preferably 40 parts by mass or more, yet even more preferably 60 parts by mass or more, and yet even more preferably 80 parts by mass or more, relative to 100 parts by mass of the resin solid content in the resin composition. When the content is equal to or higher than the lower limit, the thermal resistance, the low thermal expansion, and the low dielectric loss tangent of the resulting cured product tend to be further improved. The upper limit of the content of the filler (D) is preferably 1000 parts by mass or less, more preferably 500 parts by mass or less, still more preferably 300 parts by mass or less, and even more preferably 250 parts by mass or less, and may be 200 parts by mass or less or 120 parts by mass or less, relative to 100 parts by mass of the resin solid content. When the content is equal to or lower than the above upper limit, the moldability of the resin composition tends to be further improved.

In one preferred embodiment of the resin composition of the present embodiment, the content of the filler (D) is from 30 mass % to 90 mass % of components excluding a solvent.

The resin composition of the present embodiment may contain only one type of filler (D) or may contain two or more types of fillers (D). When two or more types of fillers are contained, the total amount thereof preferably falls within the above range.

When the filler (D), in particular, an inorganic filler, is used in the resin composition of the present embodiment, a silane coupling agent may be further contained. The resin composition containing a silane coupling agent tends to further improve dispersibility of the filler (D) and adhesive strength between the resin components, the filler (D), and a substrate described below.

Examples of the silane coupling agent include, but are not particularly limited to, a silane coupling agent that is ordinarily used for surface treatment of an inorganic material. Examples of the silane coupling agent include aminosilane-based compounds (e.g., γ-aminopropyltriethoxysilane and N-β-(aminoethyl)-γ-aminopropyltrimethoxysilane), epoxysilane-based compounds (e.g., γ-glycidoxypropyltrimethoxysilane), vinylsilane-based compounds (e.g., vinyltrimethoxysilane), styrylsilane-based compounds, acrylic silane-based compounds (e.g., γ-acryloxypropyltrimethoxysilane), cationic silane-based compounds (e.g., N-β-(N-vinylbenzylaminoethyl)-γ-aminopropyltrimethoxysilane hydrochloride), and phenylsilane-based compounds. The silane coupling agents may be used singly or in combination of two or more types.

The content of the silane coupling agent is not particularly limited, but may be from 0.1 to 5.0 parts by mass relative to 100 parts by mass of resin solid content.

Monomer or Oligomer Having Ethylenically Unsaturated Group

In the resin composition of the present embodiment, a monomer or oligomer having an ethylenically unsaturated group may be used in combination in order to enhance the thermosetting property and the curability with an active energy ray (for example, photocurability with ultraviolet rays). The oligomer or monomer having an ethylenically unsaturated group used in the present embodiment is not particularly limited as long as it is an oligomer or monomer having one or more ethylenically unsaturated groups per molecule. Examples thereof include a monomer or oligomer having a vinyl group, an isopropenyl group, an allyl group, or a (meth)acryloyl group, and a monomer or oligomer having a vinyl group is preferred.

In the present specification, a compound corresponding to a monomer or oligomer having an ethylenically unsaturated group and also corresponding to the polyphenylene ether compound (B) is defined as the polyphenylene ether compound (B).

More specific examples of the monomer having an ethylenically unsaturated group include a compound (F1) (compound (F1)) having a molecular weight of less than 1000 and containing one organic group containing an ethylenically unsaturated bond in the molecule.

The ethylenically unsaturated bond fonning the ethylenically unsaturated bond-containing organic group does not include one contained as a part of an aromatic ring. Meanwhile, the ethylenically unsaturated bond includes an ethylenically unsaturated bond contained as a part of a non-aromatic ring. Examples of the ethylenically unsaturated bond contained as a part of a non-aromatic ring include a cyclohexenyl group in the molecule. It is also intended to include an ethylenically unsaturated bond contained in a portion other than a terminal of a linear or branched organic group, that is, in a linear or branched chain.

The organic group containing an ethylenically unsaturated bond is more preferably one selected from the group consisting of a vinyl group, an isopropenyl group, an allyl group, an aciyloyl group, and a methacryl group, and still more preferably a vinyl group.

In the present specification, a compound corresponding to a monomer or oligomer having an ethylenically unsaturated group and also corresponding to a silane coupling agent is defined as a silane coupling agent.

Compound (F1) used in the present embodiment preferably contains only atoms selected from a carbon atom, a hydrogen atom, an oxygen atom, a nitrogen atom, and a silicon atom, more preferably contains only atoms selected from a carbon atom, a hydrogen atom, an oxygen atom, and a silicon atom, and still more preferably contains only atoms selected from a carbon atom, a hydrogen atom, an oxygen atom, and an oxygen atom.

Compound (F1) used in the present embodiment may have a polar group or may have no polar group. Compound (F1) used in the present embodiment preferably has no polar group. Examples of the polar group include an amino group, a carboxyl group, a hydroxy group, and a nitro group.

In the present embodiment, the molecular weight of compound (F1) is preferably 70 or more, more preferably 80 or more, and still more preferably 90 or more. When the molecular weight is equal to or higher than the above lower limit, volatilization of compound (F1) from the resin composition of the present embodiment or a cured product thereof tends to be suppressed. The upper limit of the molecular weight of compound (F1) is preferably 500 or less, more preferably 400 or less, still more preferably 300 or less, further preferably 200 or less, and may be 150 or less. When the molecular weight is equal to or lower than the above upper limit, the effect of enhancing the reactivity with an additional resin compound tends to be further improved.

When two or more types of compounds (F1) are contained in the resin composition of the present embodiment, it is preferable that the average of the molecular weights of the compounds (F1) falls within the above range, and it is more preferable that the molecular weight of each of the compounds falls within the above preferable range.

In the present embodiment, the boiling point of compound (F1) is preferably 110 °C or higher, more preferably 115 °C or higher, and still more preferably 120 °C or higher. When the boiling point is equal to or higher than the above lower limit, volatilization of compound (F1) when the resin composition is thermally cured is suppressed, thereby allowing for reaction between the additional compound (C) and compound (F1). The boiling point of compound (F1) is preferably 300 °C or lower, more preferably 250 °C or lower, and still more preferably 200 °C or lower. When the boiling point is equal to or lower than the above upper limit, the compound is less likely to remain as a residual solvent in the cured product.

When two or more types of compounds (F1) are contained in the resin composition of the present embodiment, the average value of the boiling points may fall within the above range, and the boiling point of each of the compounds preferably falls within the above preferable range.

Examples of compound (F1) include (meth)acrylic acid ester compounds, aromatic vinyl compounds (preferably styrenic compounds), isopropenyl group-containing compounds, saturated fatty acid vinyl compounds, vinyl cyanide compounds, ethylenically unsaturated carboxylic acids, ethylenically unsaturated carboxylic acid anhydrides, ethylenically unsaturated dicarboxylic acid monoalkyl esters, ethylenically unsaturated carboxylic acid amides, unsaturated polyester compounds based on maleic anhydride, fumaric acid, itaconic acid, and citraconic acid; unsaturated epoxy (meth)acrylate compounds containing an acryloyl group or a methacryloyl group; unsaturated epoxy compounds containing a vinyl group or a (meth)allyl group, urethane (meth)acrylate compounds, polyether (meth)acrylate compounds, polyalcohol (meth)acrylate compounds, alkyd acrylate compounds, polyester acrylate compounds, spiroacetal acrylate compounds, diallyl phthalate compounds, diallyl tetrabromophthalate compounds, diethylene glycol bisallyl carbonate, and polyethylene polythiol. Preferred is at least one selected from the group consisting of a (meth)acrylic acid ester compound, an aromatic vinyl compound, and a saturated fatty acid vinyl compound, and more preferred is an aromatic vinyl compound.

Specific examples of compound (F1) include methylstyrene (for example, 4-methylstyrene), ethylvinylbenzene, diethyl 4-vinylbenzylphosphonate, 4-vinylbenzylglycidyl ether, and α-methylstyrene. As specific examples of the compound (F1), reference can be made to the descriptions in paragraphs [0046] and [0049] of JP 2019-194312 A, the contents of which are incorporated herein by reference.

The resin composition according to the present embodiment preferably contains a styrene oligomer (F2) in order to improve the low dielectric constant and the low dielectric loss tangent. The styrene oligomer (F2) according to the present embodiment is preferably formed by polymerizing at least one selected from the group consisting of styrene, the aforementioned styrene derivative, and vinyltoluene. The number average molecular weight of the styrene oligomer (F2) is preferably 178 or more and preferably 1600 or less. The styrene oligomer (F2) is preferably a compound having no branched structure in which the average number of aromatic rings is 2 to 14, the total amount of 2 to 14 aromatic rings is 50 mass % or more, and the boiling point is 300 °C or higher.

Examples of the styrene oligomer (F2) used in the present embodiment include a styrene polymer, a vinyltoluene polymer, an α-methylstyrene polymer, a vinyltoluene-α-methylstyrene polymer, and a styrene-α-styrene polymer. The styrene polymer to be used may be a commercially available product, and examples thereof include Piccolastic A5 (available from Eastman Chemical), Piccolastic A-75 (available from Eastman Chemical), Piccotex 75 (available from Eastman Chemical), FTR-8100 (available from Mitsui Chemicals, Inc.), and FTR-8120 (available from Mitsui Chemicals, Inc.). Examples of the vinyltoluene-α-methylstyrene polymer include Piccotex LC (available from Eastman Chemical). Examples of the α-methylstyrene polymer include Crystalex 3070 (available from Eastman Chemical), Crystalex 3085 (available from Eastman Chemical), Crystalex (3100), Crystalex 5140 (available from Eastman Chemical), FMR-0100 (available from Mitsui Chemicals, Inc.), and FMR-0150 (available from Mitsui Chemicals, Inc.). Examples of the styrene-α-styrene polymer include FTR-2120 (available from Mitsui Chemicals, Inc.). These styrene oligomers may be used alone, or two or more types may be used in combination.

In the resin composition of the present embodiment, an α-methylstyrene oligomer is preferably used because it is thermally cured in a favorable manner and is excellent in fine wiring embeddability, solder heat resistance, low relative dielectric constant, and low dielectric loss tangent.

The resin composition according to the present embodiment preferably also contains a divinyl compound (F3) as a monomer having an ethylenically unsaturated group in order to improve the low dielectric constant and the low dielectric loss tangent.

The divinyl compound is a low molecular weight compound having two vinyl groups. Since the number of vinyl groups is two, the crosslinking density is such a favorable level that the crosslinking density is not excessively increased, and thus, the free volume of molecules increases, so that the dielectric loss tangent (Df) of the resulting cured product can be reduced. Since the divinyl compound (F3) is used as a substitute for the resin (A), the polyphenylene ether compound (B), and some of the additional compounds (C), it is considered that a reduction in content of a component having a polar group also contributes to the reduction of the dielectric loss tangent (Df). It is considered that since each of the two functional groups of the divinyl compound is a vinyl group, the reactivity with the resin (A) and the polyphenylene ether compound (B) is improved, and as a result, the thermal resistance tends to be easily improved.

Here, the divinyl compound (F3) refers to a compound having a molecular weight of less than 600. The molecular weight is preferably 300 or less, and more preferably less than 195. The lower limit of the molecular weight is practically 54. Examples of the divinyl compound (F3) include divinylbenzene, 1-ethynyl-4-[2-(4-ethynylphenyl) ethyl]benzene (BVPE), and 1,3-vinyltetramethylsiloxane As the monomer or oligomer having an ethylenically unsaturated group, 1,3-diisopropenylbenzene and 1,4-diisopropenylbenzene are also preferably used.

For other details of the monomer or oligomer having an ethylenically unsaturated group, a reference can be made to paragraphs [0069] to [0087] of WO 2017/135168 and paragraphs [0065] to [0067] of WO 2019/230945, the contents of which are incorporated herein by reference.

When the resin composition of the present embodiment contains a monomer or oligomer having an ethylenically unsaturated group, the content thereof is preferably 0.5 parts by mass or more, more preferably 1 part by mass or more, still more preferably 2 parts by mass or more, and even more preferably 3 parts by mass or more, and may be 5 parts by mass or more, relative to 100 parts by mass of the resin solid content in the resin composition. When the content is equal to or higher than the above lower limit, the low dielectric properties (Dk and/or Df) of the resulting cured product tend to be further improved. The upper limit of the content of the monomer or oligomer having an ethylenically unsaturated group is preferably 30 parts by mass or less, more preferably 25 parts by mass or less, still more preferably 20 parts by mass or less, even more preferably 15 parts by mass or less, and further more preferably 10 parts by mass or less, relative to 100 parts by mass of the resin solid content in the resin composition. When the content is equal to or lower than the above upper limit, the thermal resistance of the resulting cured product tends to be further improved. In addition, the low dielectric constant, the low dielectric loss tangent, and the chemical resistance tend to be further improved.

The resin composition of the present embodiment may contain only one type of monomer or oligomer having an ethylenically unsaturated group or may contain two or more types thereof. When two or more types are contained, the total amount thereof preferably falls within the above range.

Flame Retardant

The resin composition of the present embodiment may contain a flame retardant. Examples of the flame retardant include a phosphorus-based flame retardant, a halogen-based flame retardant, an inorganic flame retardant, and a silicone-based flame retardant, and a phosphorus-based flame retardant is preferred.

For the flame retardant, known flame retardants can be used, and examples include halogen-based flame retardants, such as a brominated epoxy resin, brominated polycarbonate, brominated polystyrene, brominated styrene, brominated phthalimide, tetrabromobisphenol A, pentabromobenzyl (meth)acrylate, pentabromotoluene, tribromophenol, hexabromobenzene, decabromodiphenyl ether, bis-1,2-pentabromophenylethane, chlorinated polystyrene, and chlorinated paraffin; phosphorus-based flame retardants, such as red phosphorus, tricresyl phosphate, triphenyl phosphate, cresyl diphenyl phosphate, trixylenyl phosphate, trialkyl phosphate, dialkyl phosphate, tris(chloroethyl) phosphate, phosphazene, 1,3-phenylene bis(2,6-dixylenyl phosphate), and 10-(2,5-dihydroxyphenyl)-10H-9-oxa-10-phosphaphenanthrene-10-oxide; inorganic flame retardants, such as aluminum hydroxide, magnesium hydroxide, partial boehmite, boehmite, zinc borate, and antimony trioxide; and silicone-based flame retardants, such as a silicone rubber and a silicone resin.

In the present embodiment, among these, 1,3-phenylene bis(2,6-dixylenyl phosphate) is preferred since the low dielectric properties (Dk and/or Df) of the resulting cured product are not impaired.

When the resin composition of the present embodiment contains a flame retardant, the content of the flame retardant is preferably 1 part by mass or more, and more preferably 5 parts by mass or more, relative to 100 parts by mass of the resin solid content in the resin composition. The lower limit of the content of the flame retardant is preferably 30 parts by mass or less, and more preferably 25 parts by mass or less.

One flame retardant may be used alone, or two or more flame retardants may be used in combination. When two or more types are used, the total amount thereof falls within the above range.

Active Ester Compound

The resin composition of the present embodiment may contain an active ester compound. The active ester compound is not particularly limited, and for example, reference can be made to the descriptions in paragraphs [0064] to [0066] of WO 2021/172317, the content of which is incorporated herein by reference.

When the resin composition of the present embodiment contains an active ester compound, the content of the active ester compound is preferably 1 part by mass or more, and preferably 90 parts by mass or less, and may be 50 parts by mass or less, relative to 100 parts by mass of the resin solid content in the resin composition.

The resin composition of the present embodiment may contain only one type of active ester compound or may contain two or more types of active ester compounds. When two or more types of active ester compounds are contained, the total amount thereof preferably falls within the above range.

The resin composition of the present embodiment may contain substantially no active ester compound. The phrase "contain substantially no" means that the content of the active ester compound is less than 1 part by mass relative to 100 parts by mass of the resin solid content in the resin composition, and the content is preferably less than 0.1 parts by mass, and more preferably less than 0.01 parts by mass.

Dispersant

The resin composition of the present embodiment may contain a dispersant. A dispersant commonly used in paints can be suitably used, and the type of the dispersant is not particularly limited. The dispersant to be used is preferably a copolymer-based wet dispersant or a fluorine-containing fluorine-based dispersant.

Specific examples of the dispersant include DISPERBYK®-110, 111, 161, 180, 2009, 2152, 2155, BYK®-W996, W9010, W903, and W940 available from BYK Japan KK, Ftergent available from NEOS COMPANY LIMITED, and MPT available from MITSUBISHI PENCIL COMPANY, LIMITED.

When the resin composition of the present embodiment contains a dispersant, the lower limit of the content of the dispersant is preferably 0.01 parts by mass or more, more preferably 0.1 parts by mass or more, and may be 0.3 parts by mass or more relative to 100 parts by mass of the resin solid content in the resin composition. The upper limit of the content of the dispersant is preferably 10 parts by mass or less, more preferably 5 parts by mass or less, and even more preferably 3 parts by mass or less relative to 100 parts by mass of the resin solid content in the resin composition.

One type of dispersant may be used alone, or two or more types of dispersants may be used in combination. When two or more types are used, the total amount falls within the above range.

Curing Accelerator

The resin composition of the present embodiment may further contain a curing accelerator. The curing accelerator is not particularly limited, and examples thereof include imidazoles such as 2-ethyl-4-methylimidazole and triphenylimidazole; organic peroxides such as benzoyl peroxide, bis(1-methyl-1-phenylethyl) peroxide), di-t-butyl peroxide, lauroyl peroxide, acetyl peroxide, parachlorobenzoyl peroxide, di-tert-butyl-di-perphthalate, α,α'-di(t-butylperoxy)diisopropylbenzene, 2,5-dimethyl-2,5-di(t-butylperoxy) hexane, and 2,5-dimethyl-2,5-bis(t-butylperoxy)hexine-3; azo compounds such as azobisnitriles (for example, azobisisobutyronitrile); tertiary amines such as N,N-dimethylbenzylamine, N,N-dimethylaniline, N,N-dimethyltoluidine, 2-N-ethylanilinoethanol, tri-n-butylamine, pyridine, quinoline, N-methylmorpholine, triethanolamine, triethylenediamine, tetramethylbutanediamine, and N-methylpiperidine; phenols such as phenol, xylenol, cresol, resorcin, and catechol; high-temperature decomposition type radical generators such as 2,3-dimethyl-2,3-diphenylbutane; organometallic salts such as lead naphthenate, lead stearate, zinc naphthenate, zinc octylate, manganese octylate, tin oleate, dibutyltin malate, manganese naphthenate, cobalt naphthenate, and iron acetylacetone; products formed by dissolving these organometallic salts in hydroxyl group-containing compounds such as phenol and bisphenol; inorganic metal salts such as tin chloride, zinc chloride, and aluminum chloride; and organotin compounds such as dioctyltin oxide, other alkyltins, and alkyltin oxides.

The curing accelerator is preferably at least one selected from the group consisting of an imidazole, an organic peroxide, and an organometallic salt, more preferably at least one selected from the group consisting of an imidazole and an organometallic salt, and still more preferably an imidazole.

In the present embodiment, the resin composition may contain substantially no polymerization initiator such as an organic peroxide or an azo compound. The phrase "contain substantially no polymerization initiator" means that the content of the polymerization initiator is less than 0.1 parts by mass relative to 100 parts by mass of the resin solid content in the resin composition, and the content is preferably less than 0.01 parts by mass, and more preferably less than 0.001 parts by mass.

In particular, when the polyphenylene ether compound represented by Formula (OP-1) is used as the polyphenylene ether compound (B) having an unsaturated carbon-carbon double bond at a terminal, sufficient curing can be achieved even when the resin composition contains substantially no polymerization initiator (including a curing accelerator).

When the resin composition of the present embodiment contains a curing accelerator, the lower limit of the content of the curing accelerator is preferably 0.005 parts by mass or more, more preferably 0.01 parts by mass or more, and even more preferably 0.1 parts by mass or more relative to 100 parts by mass of the resin solid content in the resin composition. The upper limit of the content of the curing accelerator is preferably 10 parts by mass or less, more preferably 5 parts by mass or less, and still more preferably 2 parts by mass or less with respect to 100 parts by mass of the resin solid content in the resin composition.

One type of curing accelerator may be used alone, or two or more types of curing accelerators may be used in combination. When two or more types are used, the total amount thereof falls within the above range.

Solvent

The resin composition of the present embodiment may contain a solvent and preferably contains an organic solvent. When the resin composition of the present embodiment contains a solvent, the resin composition is in a (solution or varnish) form in which at least some, or preferably all of the respective resin solid contents described above are dissolved or homogeneously mixed in the solvent. The solvent is not particularly limited as long as it is any polar organic solvent or non-polar organic solvent capable of dissolving or homogeneously mixing at least some, or preferably all of the respective resin solid contents described above. Examples of the polar organic solvent include ketones (e.g., acetone, methyl ethyl ketone, and methyl isobutyl ketone), cellosolves (e.g., propylene glycol monomethyl ether and propylene glycol monomethyl ether acetate), esters (e.g., ethyl lactate, methyl acetate, ethyl acetate, butyl acetate, isoamyl acetate, ethyl lactate, methyl methoxypropionate, and methyl hydroxyisobutyrate), and amides (e.g., dimethoxyacetamide and dimethylformamide). Examples of the non-polar organic solvent include aromatic hydrocarbons (e.g., toluene and xylene).

One type of solvent may be used alone, or two or more types of solvents may be used in combination. When two or more types are used, the total amount thereof falls within the above range.

Additional Component

The resin composition of the present embodiment may contain any polymer compound such as a resin or an oligomer thereof, or any additive in addition to the above components. Examples of the additive include ultraviolet absorbers, antioxidants, photopolymerization initiators, fluorescent whitening agents, photosensitizers, dyes, pigments, thickeners, flow control agents, lubricants, antifoaming agents, leveling agents, brighteners, and polymerization inhibitors. One of these additives may be used alone, or two or more types thereof may be used in combination.

The resin composition of the present embodiment may contain substantially no polymerization inhibitor. The phrase "contain substantially no polymerization inhibitor" means that the resin composition contains no polymerization inhibitor, or the content of the polymerization inhibitor in the resin composition is, for example, less than 0.008 parts by mass, and preferably 0.007 parts by mass or less, more preferably 0.001 parts by mass or less, and still more preferably 0.0001 parts by mass or less, relative to 100 parts by mass of the resin solid content.

Applications

The resin composition of the present embodiment is used as a cured product. Specifically, the resin composition of the present embodiment can be suitably used as a material having low dielectric properties (Dk and/or Df), or as a resin composition for an electronic material, such as an insulating layer of a printed wiring board or a material for a semiconductor package. The resin composition of the present embodiment can be suitably used as a material for a prepreg, a metal foil-clad laminate including the prepreg, a resin composite sheet, and a printed wiring board.

The resin composition of the present embodiment preferably has a minimum melt viscosity of 100000 Pa·s or less, and more preferably 20000 Pa·s or less. The lower limit of the minimum melt viscosity is not particularly limited, and is practically 10 Pa s or more. Such a low melt viscosity is achieved by using the resin (A) and the polymer having a structural unit represented by Formula (V).

In the resin composition of the present embodiment, the viscosity at (minimum melt temperature+10 °C.)_the minimum melt viscosity is preferably 80 times or less, and more preferably 20 times or less. When the viscosity at (minimum melt temperature+10 °C.)÷the minimum melt viscosity is low, the curing reaction tends to proceed mildly and generation of voids tends to be effectively suppressed.

The minimum melt viscosity is measured according to the method described in Examples below.

The minimum melt temperature of the resin composition of the present embodiment is preferably 210 °C or lower, more preferably 200 °C or lower, still more preferably 190 °C or lower, even more preferably 180 °C or lower, and further more preferably 175 °C or lower. The lower limit is, for example, practically 120 °C or higher.

The minimum melt temperature is measured according to the method described in Examples below.

The cured product of the resin composition of the present embodiment preferably has a glass transition temperature according to DMA (dynamic mechanical analysis) of 130 °C or higher, more preferably 150 °C or higher, still more preferably 165 °C or higher, and even more preferably 175 °C or higher, and may have a glass transition temperature of 180 °C or higher or 190 °C or higher.

Such a high glass transition temperature is mainly achieved by using the polyphenylene ether compound (B). The upper limit of the glass transition temperature is, for example, practically 350 °C or lower.

The glass transition temperature is measured in accordance with a method described in Examples below.

The cured product of the resin composition of the present embodiment preferably has a low relative dielectric constant (Dk). Specifically, the relative dielectric constant (Dk) at a frequency of 10 GHz measured according to a cavity resonator perturbation method is preferably 2.50 or less, more preferably less than 2.45, and still more preferably 2.44 or less. The lower limit of the relative dielectric constant (Dk) is not particularly determined but is, for example, practically 0.01 or more.

Preferably, the cured product of the resin composition of the present embodiment has a low dielectric loss tangent (Df). Specifically, the dielectric loss tangent (Df) at a frequency of 10 GHz measured according to a cavity resonator perturbation method is preferably less than 0.0022, more preferably 0.0021 or less, still more preferably 0.0020 or less, and may be 0.0018 or less, 0.0015 or less, 0.0014 or less, or 0.0013 or less. The lower limit of the dielectric loss tangent (Df) is not particularly determined but is, for example, practically 0.0001 or higher.

Such low dielectric properties are achieved by mainly using the resin (A) and the polymer having a structural unit represented by Formula (V).

The relative dielectric constant (Dk) and the dielectric loss tangent (Df) are measured by methods described in Examples below.

The resin composition of the present embodiment is used in the formi of a layered material (intended to include a film-like or sheet-like material), such as a prepreg or a resin composite sheet serving as an insulating layer of a printed wiring board. When the resin composition is formed into such a layered material, the thickness of the layered material is preferably 5 μm or more and more preferably 10 μm or more. The upper limit of the thickness is preferably 200 μm or less and more preferably 180 μm or less. The thickness of the layered material means, for example, a thickness including that of a glass cloth when the glass cloth is impregnated with the resin composition of the present embodiment.

The material formed from the resin composition of the present embodiment may be used in an application to form a pattern by exposure and development or may be used in an application not involving exposure and development. In particular, the material is suitable for an application not involving exposure and development.

Prepreg

The prepreg of the present embodiment is formed from a substrate (prepreg substrate) and the resin composition of the present embodiment. The prepreg of the present embodiment is produced by, for example, applying the resin composition of the present embodiment to a substrate (e.g., impregnating and/or coating the substrate with the resin composition) and then semi-curing the resin composition by heating (e.g., by a method of drying at 120 to 220 °C for 2 to 15 minutes). In this case, the amount of the resin composition adhered to the substrate, that is, the amount of the resin composition (including the filler (D)) relative to the total amount of the prepreg after semi-curing is preferably in a range of 20 to 99 mass % and more preferably in a range of 20 to 80 mass %.

The substrate is not particularly limited as long as it is a substrate used in various printed wiring board materials. Examples of the material of the substrate include glass fibers (e.g., E-glass, D-glass, L-glass, S-glass, T-glass, Q-glass, UN-glass, NE-glass, NER-glass, and spherical glass), inorganic fibers other than glass (e.g., quartz), and organic fibers (e.g., polyimide, polyamide, polyester, liquid crystal polyester, and polytetrafluoroethylene). The form of the substrate is not particularly limited, and examples of the form include woven fabrics, nonwoven fabrics, rovings, chopped strand mats, and surfacing mats. One of these substrates may be used alone, or two or more types may be used in combination. Among these substrates, from the viewpoint of dimensional stability, the substrate is preferably a woven fabric subjected to ultra fiber opening or fine weaving; from the viewpoints of strength and low water absorbability, the substrate is preferably a glass woven fabric having a thickness of 200 μm or less and a mass of 250 $g/m^2$ or less; and from the viewpoint of moisture absorption and thermal resistance, the substrate is preferably a glass woven fabric having a surface treated with a silane coupling agent such as an epoxysilane or an aminosilane. From the viewpoint of electrical properties, the substrate is more preferably a low dielectric glass cloth made of a glass fiber exhibiting a low relative dielectric constant and a low dielectric loss tangent, such as L-glass, NE-glass, NER-glass, or Q-glass.

The substrate of low relative dielectric constant is exemplified by a substrate having a relative dielectric constant of 5.0 or less (preferably from 3.0 to 4.9). The substrate of low dielectric loss tangent is exemplified by a substrate having a dielectric loss tangent of 0.006 or lower (preferably from 0.001 to 0.005). The relative dielectric constant and the dielectric loss tangent are values measured at a frequency of 10 GHz with a cavity resonator for perturbation.

Metal Foil-Clad Laminate

The metal foil-clad laminate of the present embodiment includes at least one layer formed from the prepreg of the present embodiment, and a metal foil disposed on one surface or both surfaces of the layer formed from the prepreg. Examples of the method for producing the metal foil-clad laminate of the present embodiment include a method of disposing at least one prepreg (preferably stacking two or more prepregs) of the present embodiment, disposing a metal foil on one surface or both surfaces of the prepreg, and laminate-molding the metal foil and the prepreg. More specifically, the metal foil-clad laminate can be produced by disposing a metal foil of copper, aluminum, or the like on one surface or both surfaces of the prepreg, and laminate-molding the metal foil and the prepreg. The number of prepregs is preferably from 1 to 10, more preferably from 2 to 10, and even more preferably from 2 to 9. The metal foil is not particularly limited as long as it is any metal foil used in materials for printed wiring boards, and examples of the metal foil include copper foils, such as a rolled copper foil and an electrolytic copper foil. The thickness of the metal foil (preferably a copper foil) is not particularly limited and may be approximately from 1.5 to 70 μm. When a copper foil is used as the metal foil, the surface roughness Rz of the copper foil as measured in accordance with JIS B0601:2013 is adjusted to from 0.2 to 4.0 μm. When the copper foil surface roughness Rz of is 0.2 μm or more, the roughness of the copper foil surface is adjusted to a suitable level, and the copper foil peel strength tends to be further improved. Meanwhile, when the copper foil surface roughness Rz is 4.0 m or less, the roughness of the copper foil surface is adjusted to a suitable level, and the dielectric loss tangent properties tend to be further improved. From the viewpoint of reducing the dielectric loss tangent, the copper foil surface roughness Rz is more preferably 0.5 m or more, still more preferably 0.6 μm or more, particularly preferably 0.7 μm or more, and is more preferably 3.5 m or less, still more preferably 3.0 μm or less, particularly preferably 2.0 μm or less.

Examples of the laminate-molding method include methods commonly used in molding a laminate and a multilayer board for a printed wiring board, and more specific examples include a method of laminate-molding using a multi-stage press, a multi-stage vacuum press, a continuous molding machine, or an autoclave molding machine at a temperature of approximately 180 to 350 °C, a heating time of approximately 100 to 300 minutes, and a surface pressure of approximately 20 to 100 kg/cm$^2$. The prepreg of the present embodiment can be combined and laminate-molded with a separately produced wiring board for an inner layer, to thereby form a multilayer board. According to a multilayer board production method, a multilayer board can be produced by, for example, disposing copper foils of approximately 35 μm on both surfaces of one prepreg of the present embodiment, laminate-molding them by the molding method described above, then forming an inner layer circuit, subjecting the inner layer circuit to a blackening treatment to form an inner layer circuit board, then alternately disposing the inner layer circuit board and the prepreg of the present embodiment one by one, and further disposing a copper foil on the outermost layer, followed by lamination molding under the conditions described above, preferably under vacuum. The metal foil-clad laminate of the present embodiment can be suitably used as a printed wiring board.

As described above, the resin composition for electronic materials prepared using the resin composition of the present embodiment (resin composition containing a combination of specific components) has excellent moldability. The cured product of the resin composition can be provided with excellent low dielectric properties (Dk and/or Df, especially low dielectric loss tangent), low relative dielectric constant, crack resistance, appearance, low thermal expansion, and moisture absorption thermal resistance.

Printed Wiring Board

The printed wiring board of the present embodiment is a printed wiring board including an insulating layer and a conductor layer disposed on the surface of the insulating layer, and the insulating layer includes at least one of a layer formed from the resin composition of the present embodiment or a layer formed from the prepreg of the present embodiment. Such a printed wiring board can be produced by a common method, and the production method is not particularly limited. An example of the method of producing the printed wiring board is described below. Firstly, the above-described metal foil-clad laminate, such as a copper foil-clad laminate, is prepared. Next, the surface of the metal foil-clad laminate is subjected to an etching treatment to form an inner layer circuit, and an inner layer substrate is produced. The inner layer circuit surface of the inner layer substrate is subjected to surface treatment to increase the adhesive strength as necessary, then a required number of the prepregs described above are layered on the inner layer circuit surface, a metal foil for an outer layer circuit is further laminated on the outer side, and the laminate is heated, pressurized, and integrally molded. This process produces a multilayer laminate including an insulating layer composed of a substrate and a cured product of the resin composition formed between the inner layer circuit and the metal foil for the outer layer circuit. Subsequently, the multilayer laminate is subjected to hole formation for a through hole or a via hole, then a plated metal film for conduction between the inner layer circuit and the metal foil for the outer layer circuit is formed on the wall surface of the hole, and the metal foil for the outer layer circuit is subjected to an etching treatment to form the outer layer circuit, to thereby produce the printed wiring board.

The printed wiring board produced in the above-described production example is configured to have an insulating layer and a conductor layer formed on the surface of the insulating layer, and the insulating layer is configured to contain the resin composition of the present embodiment described above and/or its cured product. That is, the prepreg of the present embodiment described above (e.g., a prepreg formed from a substrate and the resin composition of the present embodiment impregnated into or applied onto the substrate) and the layer formed from the resin composition on the metal foil-clad laminate of the present embodiment described above serve as the insulating layer of the present embodiment.

The present embodiment also relates to a semiconductor device including the printed wiring board. As for details of the semiconductor device, reference can be made to paragraphs [0200] to [0202] of JP 2021-021027 A, the content of which is incorporated herein by reference.

In the insulating layer formed of the cured product of the resin composition of the present embodiment, it is preferable to reduce surface roughness of the insulating layer after roughening treatment. Specifically, the arithmetic average roughness Ra of the surface of the insulating layer after the roughening treatment is preferably 200 nm or less, more preferably 150 nm or less, and particularly preferably 100 nm or less. The lower limit of the arithmetic average roughness Ra is not particularly limited, and may be, for example, 10 nm or more. The arithmetic average roughness Ra of the surface of the insulating layer is measured using a non-contact type surface roughness meter, a VSI mode, and a lens with a magnification of 50.

WYKONT 3300 available from Veeco Instruments Inc is used as a non-contact type surface roughness meter.

Resin Composite Sheet

The resin composite sheet of the present embodiment includes a support and a layer formed from the resin composition of the present embodiment and disposed on a surface of the support. The resin composite sheet can be used as a build-up film or a dry film solder resist. The method of producing the resin composite sheet is not particularly limited, and examples include a method of producing the resin composite sheet by coating (painting) the support with a solution prepared by dissolving the resin composition of the present embodiment described above in a solvent, and then drying.

Examples of the support used herein include, but are not particularly limited to, organic-based film substrates, such as polyethylene films, polypropylene films, polycarbonate films, poly(ethylene terephthalate) films, ethylene-tetrafluoroethylene copolymer films, as well as release films formed by coating a surface of such a film with a release agent, and polyimide films; conductive foils, such as copper foils and aluminum foils; and plate-like supports, such as glass plates, steel use stainless (SUS) plates, and fiber-reinforced plastics (FRPs).

For example, the application method (coating method) involves application of a solution prepared by dissolving the resin composition of the present embodiment in a solvent onto a support by using a bar coater, a die coater, a doctor blade, or a Baker applicator. A single-layer sheet can also be formed by peeling or etching the support after drying from the resin composite sheet in which the support and the resin composition are laminated. A single-layer sheet can also be produced without using a support by, for example, feeding a solution prepared by dissolving the resin composition of the present embodiment described above in a solvent into a mold having a sheet-shaped cavity and drying the solution to mold into a sheet shape.

In the production of the single-layer sheet or the resin composite sheet of the present embodiment, the drying conditions for removing the solvent are not particularly limited. However, drying at a low temperature is likely to cause the solvent to remain in the resin composition, and drying at a high temperature allows the curing of the resin composition to proceed. Thus, the drying is preferably performed at a temperature of from 20 °C to 200 °C for 1 to 90 minutes. The single-layer sheet or resin composite sheet can be used in an uncured state where the solvent is only dried or can be used as necessary in a semi-cured (B-staged) state. Further, the thickness of the resin layer in the single-layer sheet or resin composite sheet of the present embodiment can be adjusted by controlling the concentration of the solution of the resin composition of the present embodiment used for coating (application) and the coating thickness, and is not particularly limited. However, in general, the solvent is likely to remain during drying in accordance with an increase in coating thickness. Thus, the thickness is preferably from 0.1 to 500 μm.

EXAMPLES

The present invention will next be described in more detail with reference to Examples. Materials, amounts used, proportions, processing details, and processing procedures described in the following Examples can be appropriately changed without departing from the spirit of the present invention. Thus, the scope of the present invention is not limited to the specific examples described below.

When a measuring device used in the Examples is not readily available due to, for example, discontinuation, another device with equivalent performance can be used for measurement.

Measurement of Weight Average Molecular Weight and Number Average Molecular Weight The weight average molecular weight (Mw) and the number average molecular weight (Mn) of the resin (A) having a terminal group represented by Formula (T1) and having an indane skeleton, the polyphenylene ether compound (B) having an unsaturated carbon-carbon double bond at a terminal, and the polymer having a structural unit represented by Formula (V) were measured by the gel permeation chromatography (GPC) method. The measurement was conducted using a liquid feed pump (LC-20AD available from Shimadzu Corporation), a differential refractive index detector (RID-20A available from Shimadzu Corporation), and GPC columns (GPC KF-801, 802, 803, 804, available from Showa Denko Corporation), and also using tetrahydrofuran as a solvent, a flow rate of 1.0 mL/min, a column temperature of 40 °C, and a calibration curve based on monodispersed polystyrene.

Measurement of Parameters α and β

The parameters α and β in the resin (A) were calculated by $^1$H-NMR measurement. The synthesized resin was dissolved in a mixed solvent of heptane and methanol and repeatedly dried to remove a residual solvent contained in a recovered solid. Thereafter, the recovered solid was dissolved in $CDCl_3$ and subjected to $^1$H-NMR measurement. The parameters α and β of each resin were calculated using the following formula in the measured $^1$H-NMR.

$$\text{Parameter } \alpha = \frac{(2.55\text{ ppm} \sim 2.31\text{ ppm})}{(6.24\text{ ppm} \sim 5.91\text{ ppm}) + (2.98\text{ ppm} \sim 2.55\text{ ppm})/2 + (2.55\text{ ppm} \sim 2.31\text{ ppm})} \quad (\alpha)$$

$$\text{Parameter } \beta = \frac{\{(5.49\text{ ppm} \sim 4.89\text{ ppm}) - (4.89\text{ ppm} \sim 4.45\text{ ppm})\} \times 1.5}{(2.31\text{ ppm} \sim 1.96\text{ ppm}) - (2.55\text{ ppm} \sim 2.31\text{ ppm})} \quad (\beta)$$

(The value in each of the parentheses in Formulae (α) and (β) indicates an integral value between the corresponding chemical shift values in $^1$H-NMR.)

Synthesis Example 1: Synthesis of Resin (A) Having Terminal Group Represented by Formula (T1) and Having Indane Skeleton A three-necked flask equipped with a thermometer and a cooling tube was charged with 520 g of toluene, 3 g of activated clay, and a stirring bar, and the mixture was heated to an internal temperature of 70 °C while being stirred. Thereafter, 150 g of 1,3-diisopropenylbenzene (available from Tokyo Chemical Industry) was added dropwise with a dropping rate controlled so that the internal temperature did not exceed 80 °C. After the dropwise addition, the mixture was stirred until the internal temperature dropped to 70 °C. Thereafter, 150 g of 1,3-diisopropenylbenzene (available from Tokyo Chemical Industry) was added dropwise in the same manner as described above, and the reaction was further allowed to proceed for 2 hours after completion of the dropwise addition. At the end of the reaction, 433 g of toluene was added, and the activated clay was removed by filtration. The solvent was distilled off from the filtrate under heating and reduced pressure to produce 231 g of a solid resin.

The produced resin (A) had an Mw of 2674, an Mn of 1153, and an Mw/Mn of 2.3. In Formula (Tx), the parameter α was 0.71, the parameter 1 was 0.50, and n+o+p was 6.3. The structures in parentheses represented by (a), (b), and (c) all had the same molecular weight, and n+o+p was calculated assuming that the Mn of the synthesized resin was the average molecular weight. It was confirmed that the amount of a residual monomer was 1 mass % or less by GPC analysis.

An NMR chart of the produced resin is illustrated in FIG. 1.

Synthesis Example 2: Polyphenylene Ether Compound (B) Having Unsaturated Carbon-Carbon Double Bond at Terminal Synthesis of Bifunctional Phenylene Ether Oligomer In a 12-L vertically long reactor equipped with a stirrer, a thermometer, an air inlet tube, and a baffle plate, 9.64 g (43.2 mmol) of $CuBr_2$, 1.86 g (10.8 mmol) of N,N'-di-t-butylethylenediamine, 69.83 g (690.1 mmol) of n-butyldimethylamine, and 2600 g of toluene were placed, the mixture was stirred at a reaction temperature of 40 °C, and a mixed solution of 129.3 g (0.48 mol) of 2,2',3,3',5,5'-hexamethyl-(1,1'-biphenol)-4,4'-diol, 878.4 g (7.2 mol) of 2,6-dimethylphenol, 1.26 g (7.3 mmol) of N,N'-di-t-butylethylenediamine, and 27.19 g (268.7 mmol) of n-butyldimethylamine dissolved in 2300 g of methanol in advance was added dropwise over 230 minutes while a mixed gas of nitrogen and air with the oxygen concentration adjusted to 8 vol. % was bubbled at a flow rate of 5.2 L/min, with the mixture being stirred. After completion of the dropwise addition, 1500 g of an aqueous solution containing 48.06 g (126.4 mmol) of tetrasodium ethylenediaminetetraacetate dissolved was added to terminate the reaction. The aqueous layer and the organic layer were separated from each other, and the organic layer was washed with 1N aqueous hydrochloric acid solution and then with pure water. The resulting solution was concentrated to 50 mass % with an evaporator, to thereby yield 1980 g of a toluene solution of a bifunctional phenylene ether oligomer (resin "B0"). The resin "B0" had a number average molecular weight of 2100 in terms of polystyrene by the GPC method, a weight average molecular weight of 3740 in terms of polystyrene by the GPC method, and a hydroxyl equivalent of 1070.

Synthesis of Modified Polyphenylene Ether Compound

After 792 g of a 50 mass % toluene solution of the bifunctional phenylene ether oligomer (B0) was dried by an evaporator, 2772 g of N,N-dimethylacetamide was added thereto, and concentration was performed until the solid content reached 20 mass % to yield 1980 g of a bifunctional phenylene ether oligomer solution (B0) of 79.80 mass % N,N-dimethylacetamide and 0.20 mass % toluene. Next, a reactor equipped with a stirrer, a thermometer, and a reflux tube was charged with 1980 g (0.37 mol in terms of OH equivalent) of the bifunctional phenylene ether oligomer solution (B0) and 67.78 g (0.44 mol) of chloromethylstyrene (CMS-P), and the mixture was heated to 50 °C and stirred. While the reaction temperature was maintained at 50 °C, 84.48 g (0.44 mol) of a methanol solution (concentration: 28.4 mass %) of sodium methoxide was added dropwise, and the mixture was stirred for 1 hour. In addition, 9.75 g (0.05 mol) of a methanol solution (concentration: 28.4 mass %) of sodium methoxide was added dropwise, and the mixture was stirred for 2 hours. Thereafter, 5.91 g (0.05 mol) of 85 mass % aqueous phosphoric acid solution was added, the generated inorganic salt was removed, the reaction solution was then added dropwise to 1975 g of water to be solidified, solid-liquid separation was performed using a centrifuge, and the product was washed with pure water and methanol, and then dried under reduced pressure to produce 381.87 g of the target polyphenylene ether compound (B). The modified polyphenylene ether compound had a number average molecular weight of 2350 in terms of polystyrene by the GPC method, a weight average molecular weight of 3880, and a vinyl group equivalent of 1220 g/vinyl group.

Synthesis Example 3: Synthesis of Polymer (va) Having Structural Unit Represented by Formula (V)

A reactor was charged with 2.25 mol (292.9 g) of divinylbenzene, 1.32 mol (172.0 g) of ethylvinylbenzene, 11.43 mol (1190.3 g) of styrene, and 15.0 mol (1532.0 g) of n-propyl acetate, 600 mmol of a diethyl ether complex of boron trifluoride was added at 70 °C, and the mixture was reacted for 4 hours. After the polymerization reaction was stopped with an aqueous sodium hydrogen carbonate solution, the oil layer was washed three times with pure water, volatilized under reduced pressure at 60 °C, and a polymer (va) having a structural unit represented by Formula (V) was recovered. The resulting polymer (va) having the structural unit represented by Formula (V) was weighed to confirm that 860.8 g of the polymer (va) having the structural unit represented by Formula (V) was produced.

The resulting polymer (va) having the structural unit represented by Formula (V) had a number average molecular weight Mn of 2060, a weight average molecular weight Mw of 30700, and a monodispersity Mw/Mn of 14.9. $^{13}C$-NMR and $^{1}H$-NMR analyses were performed, and a resonance line originating from each monomer unit used as the raw material was observed in the polymer (va) having the structural unit represented by Formula (V). Based on the NMR measurement results and GC analytical results, the proportions of the structural units of the polymer (va) (structural units derived from respective raw materials) having the structural unit represented by Formula (V) were calculated as follows.

Structural unit derived from divinylbenzene: 20.9 mol % (24.3 mass %)

Structural unit derived from ethylvinylbenzene: 9.1 mol % (10.7 mass %)

Structural unit derived from styrene: 70.0 mol % (65.0 mass %)

The proportion of a structural unit having a residual vinyl group derived from divinylbenzene was 16.7 mol % (18.5 mass %).

Example 1

20 Parts by mass of the resin (A) produced in Synthesis Example 1, 40 parts by mass of the polyphenylene ether compound (B) having an unsaturated carbon-carbon double bond at a terminal produced in Synthesis Example 2, and 40 parts by mass of the polymer (va) having a structural unit represented by Formula (V) produced in Synthesis Example 3 were dissolved in methyl ethyl ketone and toluene and mixed to prepare a varnish. The blended amount of each component described above indicates a value in terms of solid content.

Production of Test Piece of Cured Plate Having Thickness of 1.0 mm

The solvent was distilled off from the resulting varnish by evaporation, to yield a resin composition powder. A cured plate was produced by using the resulting resin composition powder as follows. A stainless steel mold frame of 100 mm×30 mm×1.0 mm in height was charged with 4.5 g of the resin composition powder, set in a vacuum press machine (available from KITAGAWA SEIKI CO., LTD.), held at 200 °C for 1.5 hours, and pressed at a surface pressure of 1.9 MPa.

The minimum melt viscosity, the viscosity at (minimum melt temperature+10 °C) the minimum melt viscosity, the moldability, the minimum melt temperature, the glass transition temperature, the relative dielectric constant (Dk), and the dielectric loss tangent (Df) were evaluated by using the produced resin composition powder or cured plate. The evaluation results are shown in Table 1.

Methods of Measurement and Evaluation (1) Minimum Melt Viscosity and Viscosity at (Minimum Melt Temperature+10 °C.)÷Minimum Melt Viscosity After the produced resin composition powder was confirmed to have a residual solvent content of 1 mass % or less by GC measurement (GC-2025, available from Shimadzu Corporation), 1 g of the powder was taken and molded into a tablet having a diameter of 25 mm to prepare a measurement sample. The minimum melt viscosity (Pa·s) and the viscosity at (minimum melt temperature+10 °C) of the sample were determined using a viscoelasticity measuring device (ARES-G2, available from TA Instruments) under conditions of a temperature rise rate of 2 °C/min and a frequency of 10 rad/s.

The minimum melt viscosity was evaluated as follows.

A: 20000 Pa·s or less

B: more than 20000 Pa·s and 100000 Pa·s or less.

C: more than 100000 Pa·s

The value of the viscosity at (minimum melt temperature+10 °C.)_the minimum melt viscosity was calculated. Evaluation was made as follows.

A: 20 times or less

B: more than 20 times and 80 times or less

C: more than 80 times (2) Moldability

The moldability was evaluated as follows.

A: Both of the evaluation results of the minimum melt viscosity and the value of the viscosity at (minimum melt viscosity+10 °C.)÷the minimum melt viscosity are A.

B: The evaluation results of the minimum melt viscosity and the value of the viscosity at (minimum melt viscosity+10 °C.)÷the minimum melt viscosity are A or B, and at least one is B.

C: The evaluation results of the minimum melt viscosity and the value of the viscosity at (minimum melt viscosity+10 °C.)÷the minimum melt viscosity include C.

The minimum melt temperature was expressed in units of °C.

(4) Glass Transition Temperature

A sample prepared by downsizing the cured plate to 12.7 mm×30 mm was subjected to measurement by a DMA (dynamic mechanical analysis) bending method in accordance with JIS C6481 5.17.2 using a dynamic viscoelasticity measuring device, and the peak temperature of the obtained loss modulus was defined as the glass transition temperature. The glass transition temperature was expressed in units of °C.

The dynamic viscoelasticity analyzer used was DMA Q800 available from TA Instruments.

(5) Relative Dielectric Constant (Dk) and Dielectric Loss Tangent (Df)

The cured plate was downsized to have a width of 1.0 mm and then dried at 120 °C for 60 minutes, and the relative dielectric constant (Dk) and the dielectric loss tangent (Df) at a frequency of 10 GHz after drying were measured using a cavity resonator for perturbation. The measurement temperature was 23 °C.

The cavity resonator for perturbation was Agilent 8722ES available from Agilent Technologies.

Example 2

The same procedure was carried out as in Example 1, except that the content of the resin (A) was changed to 25 parts by mass, the content of the polyphenylene ether compound (B) was changed to 50 parts by mass, and the content of the polymer (va) having a structural unit represented by Formula (V) was changed to 25 parts by mass.

Comparative Example 1

The same procedure was carried out as in Example 1, except that the content of the polyphenylene ether compound (B) was changed to 100 parts by mass without using the resin (A) and the polymer (va) having a structural unit represented by Formula (V).

Comparative Example 2

The same procedure was carried out as in Example 1, except that the resin (A) and the polyphenylene ether compound (B) were not used, and the content of the polymer (va) having a structural unit represented by Formula (V) was changed to 100 parts by mass.

TABLE 1

| | Unit | Example 1 | Example 2 | Comparative Example 1 | Comparative Example 2 |
|---|---|---|---|---|---|
| Minimum melt viscosity | Pa · s | 1280 | 2030 | 22800 | 17 |
| | — | A | A | B | A |
| Value of viscosity at (minimum melt temperature + 10° C.) ÷ minimum melt viscosity | — | A | A | A | C |
| Moldability | — | A | A | B | C |
| Minimum melt temperature | ° C. | 160 | 163 | 169 | 148 |
| Tg (DMA) | ° C. | 182 | 167 | 210 | 128 |
| Dk @10 GHz | — | 2.36 | 2.35 | 2.42 | 2.38 |
| Df @10 GHz | — | 0.0010 | 0.0012 | 0.0022 | 0.0009 |

(3) Minimum Melt Temperature

The temperature at which the minimum melt viscosity was achieved was defined as the minimum melt temperature.

The invention claimed is:

1. A resin composition comprising 10 to 300 parts by mass of a polyphenylene ether compound (B) having an unsaturated carbon-carbon double bond at a terminal, and 10 to 300 parts by mass of a polymer having a structural unit represented by Formula (V), relative to 100 parts by mass of a resin (A) having a terminal group represented by Formula (T1) and having an indane skeleton;

(T1)

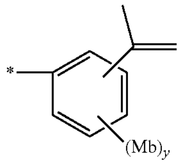

in Formula (T1), Mb each independently represents a hydrocarbon group having from 1 to 12 carbons which may be substituted with a halogen atom; y represents an integer of 0 to 4; and * represents a bonding position with another moiety; and (V)

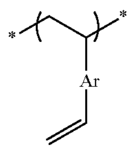

in Formula (V), Ar represents an aromatic hydrocarbon linking group; and * represents a bonding position, wherein the resin (A) contains a resin represented by Formula (T1-1);

(T1-1)

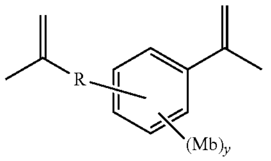

in Formula (T1-1), R is a group containing structural units represented by Formula (Tx); Mb each independently represents a hydrocarbon group having from 1 to 12 carbons which may be substituted with a halogen atom; and y is an integer of 0 to 4; and (Tx)

(a)

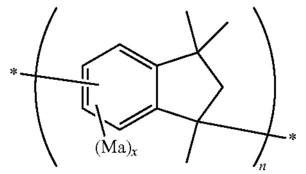

-continued (b)

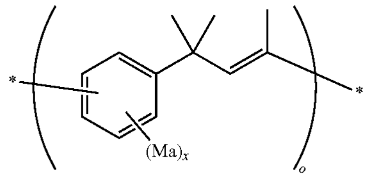

(c)

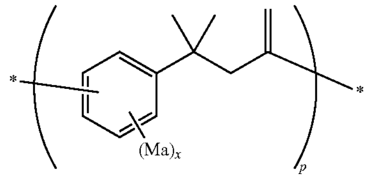

in Formula (Tx), n, o, and peach represent an average number of repeating units; n represents a number of more than 0 and 20 or less; o and p each independently represent a number of 0 to 20; $1.0 \leq n+o+p \leq 20.0$; Ma each independently represents a hydrocarbon group having from 1 to 12 carbons which may be substituted with a halogen atom; x represents an integer of 0 to 4; structural units (a), (b), and (c) are each bonded to the structural unit (a), (b), or (c), or an additional group by *; and the structural units may be randomly bonded.

2. The resin composition according to claim 1, wherein the polyphenylene ether compound (B) having an unsaturated carbon-carbon double bond at a terminal contains a polyphenylene ether compound represented by Formula (OP);

(OP)

$$X-\left[O-(Y-O)_{n1}-Rx\right]_{n2}$$

in Formula (OP), X represents an aromatic group; $-(Y-O)_{n1}-$ represents a polyphenylene ether structure; n1 represents an integer of 1 to 100; n2 represents an integer of 1 to 4; and Rx is a group represented by Formula (Rx-1) or Formula (Rx-2); and (Rx-1)

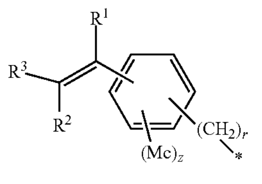

(Rx-2)

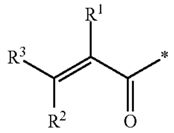

in Formula (Rx-1) and Formula (Rx-2), $R^1$, $R^2$, and $R^3$ each independently represent a hydrogen atom, an alkyl group, an alkenyl group, or an alkynyl group; * is a bonding site to an oxygen atom; Mc each independently represents a hydrocarbon group having from 1 to 12 carbons; z represents an integer of 0 to 4; and r represents an integer of 1 to 6.

3. The resin composition according to claim 1, wherein the polyphenylene ether compound (B) having an unsaturated carbon-carbon double bond at a terminal contains a polyphenylene ether compound represented by Formula (OP-1);

(OP-1)

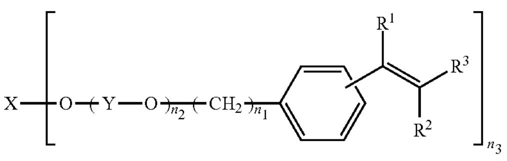

in Formula (OP-1), X represents an aromatic group; —(Y—O)$n_2$- represents a polyphenylene ether structure; $R^1$, $R^2$, and $R^3$ each independently represent a hydrogen atom, an alkyl group, an alkenyl group, or an alkynyl group; n1 represents an integer of from 1 to 6; n2 represents an integer of from 1 to 100; and n3 represents an integer of from 1 to 4.

4. The resin composition according to claim 1, wherein the polyphenylene ether compound (B) having an unsaturated carbon-carbon double bond at a terminal has a number average molecular weight (Mn) of 500 to 3000 and a weight average molecular weight (Mw) of 800 to 6000.

5. The resin composition according to claim 1, wherein the resin (A) has a number average molecular weight (Mn) of 400 to 3000.

6. The resin composition according to claim 1, wherein a mass proportion of the resin (A) is 10 to 50 parts by mass relative to 100 parts by mass of a total of the resin (A) and the polyphenylene ether compound (B) having an unsaturated carbon-carbon double bond at a terminal.

7. The resin composition according to claim 1, which comprises substantially no polymerization inhibitor.

8. The resin composition according to claim 1, which further comprises an additional compound (C) other than the resin (A), the polyphenylene ether compound (B) having an unsaturated carbon-carbon double bond at a terminal, and the polymer having a structural unit represented by Formula (V).

9. The resin composition according to claim 8, wherein the additional compound (C) contains one or more selected from the group consisting of a maleimide compound, a cyanate ester compound, an epoxy compound, a phenol compound, a compound containing a (meth)allyl group, an oxetane resin, a benzoxazine compound, an arylcyclobutene resin, a polyamide resin, a polyimide resin, a perfluorovinyl ether resin, a compound having a styrene group other than the polyphenylene ether compound (B) having an unsaturated carbon-carbon double bond at a terminal, a compound having an isopropenyl group other than the resin (A) having an indane skeleton, a polyfunctional (meth)acrylate compound other than the polyphenylene ether compound (B) having an unsaturated carbon-carbon double bond a terminal, an elastomer, and a petroleum resin.

10. The resin composition according to claim 1, wherein a total content of the resin (A) and the polyphenylene ether compound (B) having an unsaturated carbon-carbon double bond at a terminal is 40 parts by mass or more relative to 100 parts by mass of a resin solid content in the resin composition.

11. The resin composition according to claim 1, which further comprises a filler (D).

12. The resin composition according to claim 11, wherein a content of the filler (D) is from 10 to 1000 parts by mass relative to 100 parts by mass of a resin solid content in the resin composition.

13. The resin composition according to claim 1, wherein the resin (A) contains a resin represented by Formula (T1-1); the polyphenylene ether compound (B) having an unsaturated carbon-carbon double bond at a terminal contains a polyphenylene ether compound represented by Formula (OP-1); the polyphenylene ether compound (B) having an unsaturated carbon-carbon double bond at a terminal has a number average molecular weight (Mn) of 500 to 3000 and a weight average molecular weight (Mw) of 800 to 6000; the resin (A) has a number average molecular weight (Mn) of 400 to 3000; the mass proportion of the resin (A) is 10 to 50 parts by mass relative to 100 parts by mass of the total of the resin (A) and the polyphenylene ether compound (B) having an unsaturated carbon-carbon double bond at a terminal; a polymerization inhibitor is substantially not contained; and the total content of the resin (A) and the polyphenylene ether compound (B) having an unsaturated carbon-carbon double bond at a terminal is 40 parts by mass or more relative to 100 parts by mass of the resin solid content in the resin composition;

(T1-1)

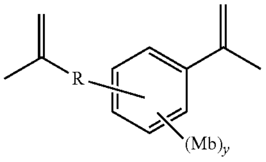

in Formula (T1-1), R is a group containing structural units represented by Formula (Tx); Mb each independently represents a hydrocarbon group having from 1 to 12 carbons which may be substituted with a halogen atom; and y is an integer of 0 to 4; and (Tx)

(a)

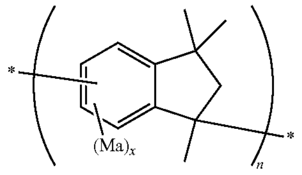

(b)

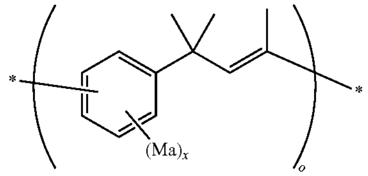

(c)

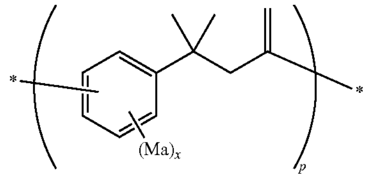

in Formula (Tx), n, o, and p each represent an average number of repeating units; n represents a number of more than 0 and 20 or less; o and p each independently represent a number of 0 to 20; $1.0 \leq n+o+p \leq 20.0$; Ma each independently represents a hydrocarbon group having from 1 to 12 carbons which may be substituted with a halogen atom; x represents an integer of 0 to 4; structural units (a), (b) and (c) are each bonded to the structural unit (a), (b), or (c), or an additional group at *; and the structural units may be randomly bonded; and (OP-1)

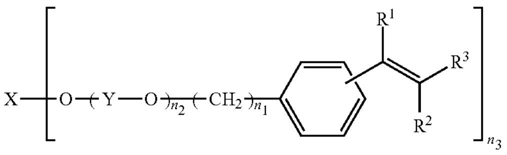

in Formula (OP-1), X represents an aromatic group; $-(Y-O)n_2$- represents a polyphenylene ether structure; $R^1$, $R^2$, and $R^3$ each independently represent a hydrogen atom, an alkyl group, an alkenyl group, or an alkynyl group; n1 represents an integer of from 1 to 6; n2 represents an integer of from 1 to 100; and n3 represents an integer of from 1 to 4.

14. The resin composition according to claim 1, which comprises at least one or more selected from the group consisting of ultraviolet absorbers, antioxidants, photopolymerization initiators, fluorescent whitening agents, photosensitizers, dyes, pigments, thickeners, flow control agents, lubricants, antifoaming agents, leveling agents, brighteners, and polymerization inhibitors.

15. A cured product of the resin composition described in claim 1.

16. A prepreg formed from a substrate and the resin composition described in claim 1.

17. A metal foil-clad laminate comprising at least one layer formed from the prepreg described in claim 16; and a metal foil disposed on one surface or both surfaces of the layer formed from the prepreg.

18. A resin composite sheet comprising a support and a layer disposed on a surface of the support, the layer being formed from the resin composition described in claim 1.

19. A printed wiring board comprising an insulating layer and a conductor layer disposed on a surface of the insulating layer, wherein the insulating layer includes a layer formed from the resin composition described in claim 1.

20. A semiconductor device comprising the printed wiring board described in claim 19.

* * * * *